(12) United States Patent
Murata et al.

(10) Patent No.: US 8,492,847 B2
(45) Date of Patent: Jul. 23, 2013

(54) SEMICONDUCTOR DEVICE HAVING INSULATING FILM WITH INCREASED TENSILE STRESS AND MANUFACTURING METHOD THEREOF

(75) Inventors: Tatsunori Murata, Kawasaki (JP); Yuki Koide, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 36 days.

(21) Appl. No.: 13/341,421

(22) Filed: Dec. 30, 2011

(65) Prior Publication Data

US 2012/0199913 A1   Aug. 9, 2012

(30) Foreign Application Priority Data

Feb. 8, 2011  (JP) ................... 2011-024941

(51) Int. Cl.
*H01L 21/70* (2006.01)
*H01L 21/4763* (2006.01)

(52) U.S. Cl.
USPC  257/369; 257/368; 257/E27.06; 257/E21.19; 257/E27.062; 438/586; 438/595

(58) Field of Classification Search
CPC ...... H01L 21/823807; H01L 21/823842; H01L 21/76897; H01L 29/6656; H01L 29/6659
USPC ................... 257/369, 368, E27.06, E27.063, 257/E21.19; 438/585, 586, 595
See application file for complete search history.

(56) References Cited

U.S. PATENT DOCUMENTS

| | | | |
|---|---|---|---|
| 2007/0018327 A1* | 1/2007 | Fujiwara et al. | 257/758 |
| 2010/0012991 A1 | 1/2010 | Owada et al. | |
| 2010/0330790 A1* | 12/2010 | Hempel et al. | 438/585 |
| 2011/0018044 A1* | 1/2011 | Lim et al. | 257/296 |

FOREIGN PATENT DOCUMENTS

JP   2009-147199   7/2009

* cited by examiner

*Primary Examiner* — Nikolay Yushin
(74) *Attorney, Agent, or Firm* — Womble Carlyle

(57) ABSTRACT

Over a semiconductor substrate, a silicon nitride film is formed so as to cover n-channel MISFETs. The silicon nitride film is a laminate film which may be made of first, second, and third silicon nitride films. The total film thickness of the first and second silicon nitride films is smaller than half a spacing between a first sidewall spacer and a second sidewall spacer. After being deposited, the first and second silicon nitride films are subjected to treatments to have increased tensile stresses. The total film thickness of the first, second, and third silicon nitride films is not less than half the spacing between the first and second sidewall spacers. The third silicon nitride film is not subjected to any tensile-stress-increasing treatment, or may be subjected to a lesser amount of such treatment.

26 Claims, 31 Drawing Sheets

SEMICONDUCTOR DEVICE HAVING INSULATING FILM WITH INCREASED TENSILE STRESS AND MANUFACTURING METHOD THEREOF

CROSS-REFERENCE TO RELATED APPLICATIONS

The disclosure of Japanese Patent Application No. 2011-24941 filed on Feb. 8, 2011 including the specification, drawings and abstract is incorporated herein by reference in its entirety.

BACKGROUND

The present invention relates to a semiconductor device and a manufacturing method thereof, and particularly to a technology which is effective when applied to a semiconductor device having a MISFET and using a stress film and a manufacturing method thereof.

At present, it is widely performed to miniaturize transistors and achieve improvements in the performance thereof. However, an approach to improve the performance of transistors only through the miniaturization thereof has a problem such as a cost increase in terms of the cost/performance ratio.

In view of such a problem, a method has emerged which not only improves the performance of transistors only through the miniaturization thereof, but also improves the performance of transistors using stress films represented by a nitride film.

In Japanese Unexamined Patent Publication No. 2009-147199 (Patent Document 1), a technique concerning a SiN liner film is described which allows a strain to be applied to the channel region of a MOS transistor. In International Publication WO 2008/117431 Pamphlet (Patent Document 2), a technique concerning a stress film which gives a tensile stress to the channel region is described.

SUMMARY

As a result of conducting study, the present inventors have made the following findings.

When a tensile stress film is formed so as to cover an n-channel MISFET, there occurs an increase in the mobility of electrons in the channel region of the n-channel MISFET or the like to allow an increase in an ON current flowing in the channel of the n-channel MISFET and an improvement in the performance of the semiconductor device including the n-channel MISFET. For the tensile stress film, a silicon nitride film is suitable.

To increase the mobility of electrons using tensile stress, it is effective to increase the tensile stress of the tensile stress film. As a method for increasing the tensile stress, there is one which deposits a silicon nitride film by a plasma CVD method, and then performs a treatment for irradiating the silicon nitride film with ultraviolet light. By performing the ultraviolet irradiation treatment, the tensile stress of the silicon nitride film can be increased.

However, when the silicon nitride film as the tensile stress film is subjected to ultraviolet irradiation, a crack or cleft may develop in the silicon nitride film. When a crack or cleft has developed in the silicon nitride film as the tensile stress film, the function of the tensile stress film may be impaired or the reliability of the semiconductor device may be degraded. Therefore, it is desired to prevent the development of a crack or cleft in the tensile stress film while achieving an increase in the tensile stress of the tensile stress film.

The following is a brief description of the outline of a representative aspect of the invention disclosed in the present application.

A semiconductor device according to a representative embodiment includes: a semiconductor substrate; a first gate electrode and a second gate electrode each formed over a main surface of the semiconductor substrate and adjacent to each other; a first sidewall spacer formed over a first side wall of the first gate electrode opposing the second gate electrode; and a second sidewall spacer formed over a second side wall of the second gate electrode opposing the first gate electrode. The semiconductor device further includes: a first insulating film formed over the main surface of the semiconductor substrate so as to cover the first and second gate electrodes and the first and second sidewall spacers; a second insulating film formed over the first insulating film so as to cover the first and second gate electrodes and the first and second sidewall spacers; and a third insulating film formed over the second insulating film so as to cover the first and second gate electrodes and the first and second sidewall spacers. Each of the first insulating film and the second insulating film is formed of a silicon nitride and functions as a tensile stress film. The third insulating film is formed of a silicon-oxide-based insulating film. When a spacing between the first sidewall spacer and the second sidewall spacer is $L_0$, a film thickness of the first insulating film is $T_1$, a spacing between the first insulating film over a side surface of the first sidewall spacer and the first insulating film over a side surface of the second sidewall spacer is $L_1$, and a film thickness of the second insulating film is $T_2$, $L_0/2 > T_1$ and $L_1/2 \leq T_2$ are satisfied. A hydrogen content rate (hydrogen content) of the first insulating film is lower than a hydrogen content rate (hydrogen content) of the second insulating film.

A method of manufacturing a semiconductor device according to the representative embodiment includes the steps of: (a) forming a first gate electrode and a second gate electrode adjacent to each other over a main surface of a semiconductor substrate; and (b) forming a first sidewall spacer over a first side wall of the first gate electrode opposing the second gate electrode and forming a second sidewall spacer over a second side wall of the second gate electrode opposing the first gate electrode. The method further includes the steps of: (c) forming a first insulating film formed of a silicon nitride and functioning as a tensile stress film over the main surface of the semiconductor substrate so as to cover the first and second gate electrodes and the first and second sidewall spacers; and (d) forming a second insulating film over the first insulating film so as to cover the first and second gate electrodes and the first and second sidewall spacers. The method further includes the step of: (e) forming a third insulating film over the second insulating film so as to cover the first and second gate electrodes and the first and second sidewall spacers. Each of the first insulating film and the second insulating film is formed of a silicon nitride and functions as a tensile stress film, while the third insulating film is formed of a silicon-oxide-based insulating film. When a spacing between the first sidewall spacer and the second sidewall spacer each formed in the step (b) is $L_0$, a deposited film thickness of the first insulating film in the step (c) is $T_1$, a spacing between the first insulating film over a side surface of the first sidewall spacer and the first insulating film over a side surface of the second sidewall spacer at a stage previous to the formation of the second insulating film in the step (d) is $L_1$, and a deposited film thickness of the second insulating film in the step (d) is $T_2$, $L_0/2 > T_1$ and $L_1/2 \leq T_2$ are satisfied. The first insulating film formed in the step (c) is subjected to a treatment for increasing a tensile stress thereof. However, the second insulating film formed in the step (d) is not subjected to a treatment for increasing a tensile stress of the second insulating film after deposition of the second insulating film.

The following is a brief description of effects achievable by the representative aspect of the invention disclosed in the present application.

According to a representative embodiment, the performance of the semiconductor device can be improved.

In addition, the reliability of the semiconductor device can be improved.

DETAILED DESCRIPTION

Figure 1:
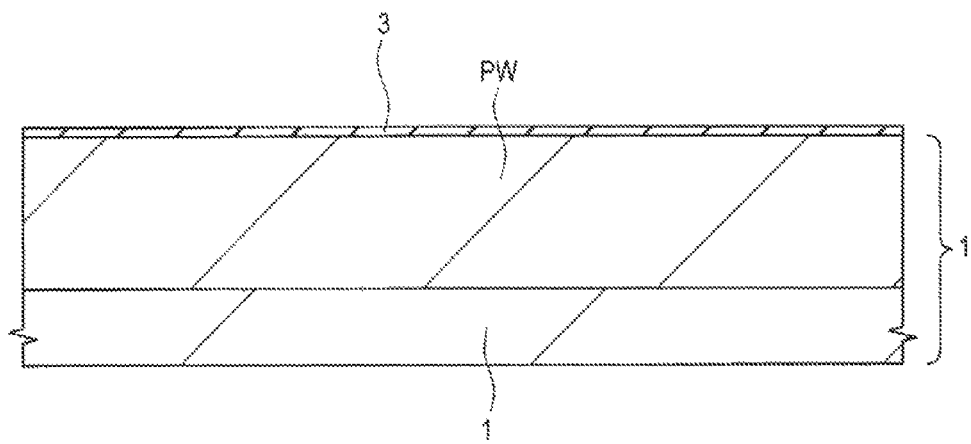
FIG. 1 is a main-portion cross-sectional view of a semiconductor device as an embodiment of the present invention in a manufacturing step thereof.

In each of the following embodiments, the embodiment will be described by being divided into a plurality of sections or embodiments. However, they are by no means irrelevant to each other unless particularly explicitly described otherwise, and one of the sections or embodiments is variations, details, supplementary explanation, and so forth of part or the whole of the others. When the number and the like (including the number, numerical value, amount, range, and the like) of elements are mentioned in the following embodiments, they are not limited to specific numbers unless particularly explicitly described otherwise or unless they are obviously limited to specific numbers in principle. It will be appreciated that, in the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto unless particularly explicitly described otherwise or unless it can be considered that they obviously do not in principle. The same shall apply in regard to the foregoing numerical value and range.

Hereinbelow, the embodiments of the present invention will be described in detail with reference to the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross-sectional view for clarity of illustration, while even a plan view may be hatched for clarity of illustration.

First Embodiment

Manufacturing Process of Semiconductor Device

A manufacturing process of a semiconductor device of the present embodiment will be described with reference to the drawings. FIGS. 1 to 10 are main-portion cross-sectional views of the semiconductor device as an embodiment of the present invention, which is a semiconductor device having n-channel MISFETs (Metal Insulator Semiconductor Field Effect Transistors: MIS field effect transistors) herein, in manufacturing steps thereof.

The semiconductor device of the present embodiment has the plural n-channel MISFETs formed in a semiconductor substrate 1. FIGS. 1 to 10 show the cross-sectional views of a region where two n-channel MISFETs (corresponding to n-channel MISFETs Qn1 and Qn2 described later) as representatives thereof are formed.

First, as shown in FIG. 1, a semiconductor substrate (semiconductor wafer) 1 made of p-type monocrystalline silicon having a specific resistance of, e.g., about 1 to 10 Ωcm or the like is prepared. Then, in a main surface of the semiconductor substrate 1, isolation regions are formed. The isolation regions are not shown in FIGS. 1 to 10, but isolation regions 2 shown in FIGS. 32 to 39, which will be described later, correspond thereto. The isolation regions are made of an insulator such as silicon oxide and formed by, e.g., a STI (Shallow Trench Isolation) method. For example, isolation trenches (trenches for isolation) are formed in the semiconductor substrate 1, and then an insulating film is buried in each of the isolation trenches to thereby allow the formation of the isolation regions each formed of the insulating film buried in each of the isolation trenches.

Next, a p-type well PW is formed over a predetermined depth from the main surface of the semiconductor substrate 1. The p-type well PW is formed in the region of the semiconductor substrate 1 where n-channel MISFETs are to be formed. In the semiconductor substrate 1, the p-type well PW is formed in an active region defined by the isolation region 2. The p-type well PW can be formed by ion-implanting a p-type impurity such as, e.g., boron (B). Before or after the formation of the p-type well PW, ion implantation (so-called channel doping ion implantation) for adjusting the thresholds of the MISFETs formed later can also be performed as necessary to the upper-layer portion of the semiconductor substrate 1.

Next, by wet etching using, e.g., an aqueous hydrofluoric acid (HF) solution or the like, the surface of the semiconductor substrate 1 is purified (cleaned), and then a gate insulating film 3 is formed over the surface (i.e., surface of the p-type well PW) of the semiconductor substrate 1. The gate insulating film 3 is formed of, e.g., a thin silicon oxide film or the like and can be formed by, e.g., a thermal oxidation method.

Figure 2:
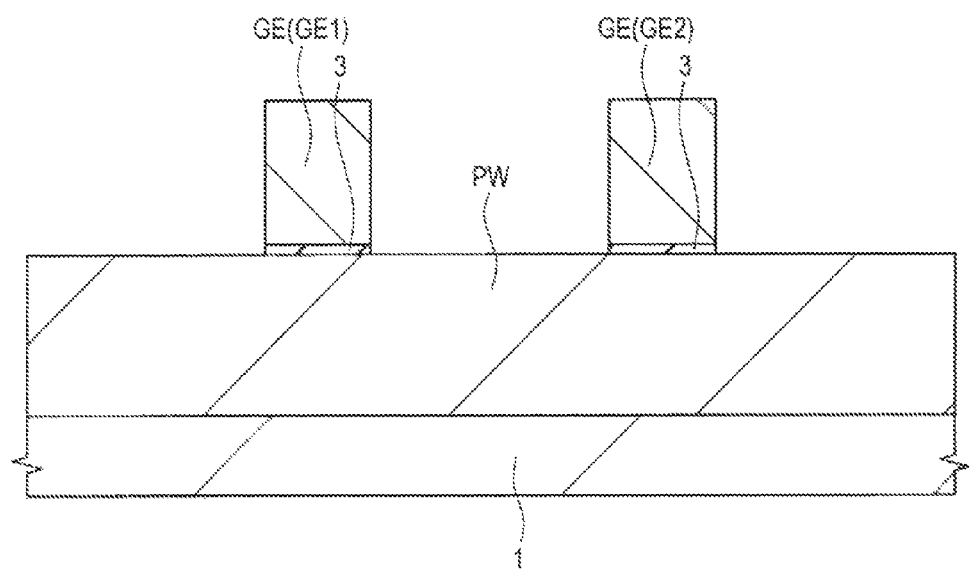
FIG. 2 is a main-portion cross-sectional view of the semiconductor device in a manufacturing step thereof, which is subsequent to FIG. 1.

Next, as shown in FIG. 2, gate electrodes GE are formed over the gate insulating films 3. To form the gate electrodes GE, it may be appropriate to, e.g., form a conductor film such as a polycrystalline silicon film (doped polysilicon film) over the main surface of the semiconductor substrate 1 (i.e., over the gate insulating films 3) and then pattern the conductor film using a photolithographic technique and a dry etching technique. As a result, the gate electrodes GE each formed of the patterned conductor film are formed over the surface of the p-type well PW via the gate insulating films 3. In FIG. 2, of the plural gate electrodes GE formed over the main surface of the semiconductor substrate 1, gate electrodes GE1 and GE2 adjacent to each other in a gate length direction (gate length direction of each of the gate electrodes GE1 and GE2) are shown.

Figure 3:
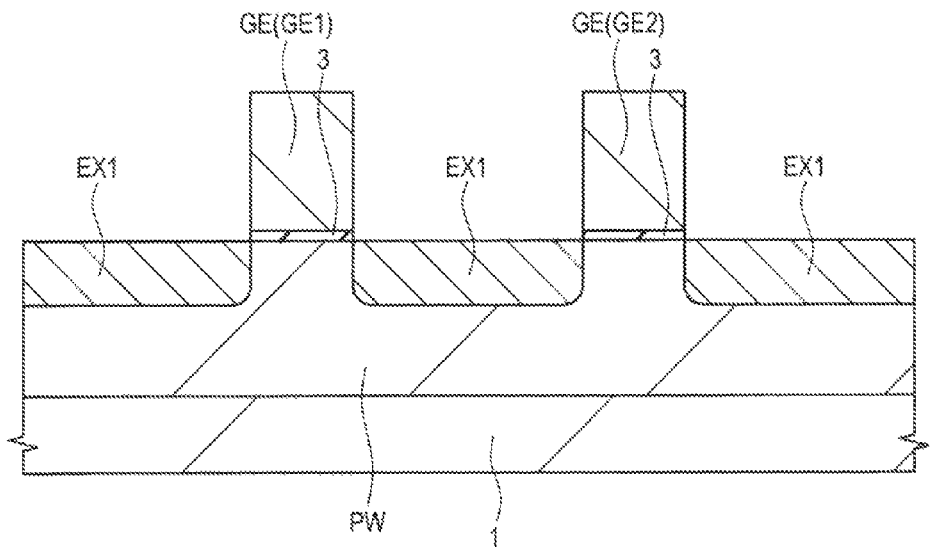
FIG. 3 is a main-portion cross-sectional view of the semiconductor device in a manufacturing step thereof, which is subsequent to FIG. 2.

Next, as shown in FIG. 3, an n-type impurity such as phosphorus (P) or arsenic (As) is ion-implanted into the regions of the p-type well PW located on both sides of the gate electrodes GE to thereby form n$^-$-type semiconductor regions (impurity diffusion layers) EX1. During the ion implantation for forming the n$^-$-type semiconductor regions EX1, ion implantation is performed to the semiconductor substrate 1 (p-type well PW) using the gate electrodes GE as a mask. In the ion implantation for forming the n$^-$-type semiconductor regions EX1, the regions of the p-type well PW located immediately under the gate electrodes GE are shielded by the gate electrodes GE and are therefore not subjected to the ion implantation.

Figure 4:
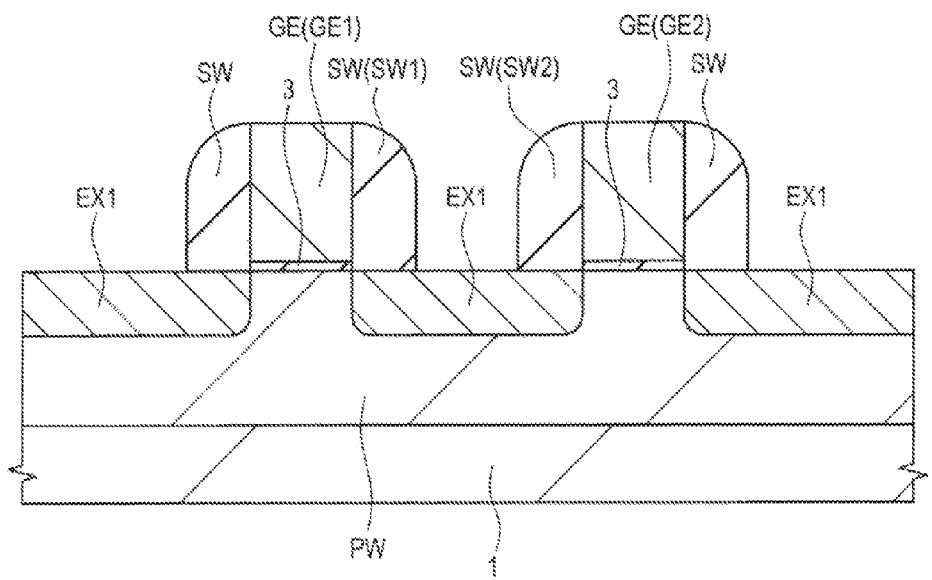
FIG. 4 is a main-portion cross-sectional view of the semiconductor device in a manufacturing step thereof, which is subsequent to FIG. 3.

Next, as shown in FIG. 4, over the side walls of each of the gate electrodes GE, as side wall insulating films (insulating films), sidewall spacers SW (sidewalls, side wall spacers, or side wall insulating films) SW each made of, e.g., silicon oxide, silicon nitride, a laminate film of insulating films thereof, or the like are formed.

For example, over the semiconductor substrate 1, a silicon oxide film, a silicon nitride film, or a laminate film thereof is deposited so as to cover the gate electrodes GE. By anisotropically etching the silicon oxide film, the silicon nitride film, or the laminate film thereof by a RIE (Reactive Ion Etching) method or the like, the sidewall spacers SW can be formed. In this case, each of the sidewall spacers SW is formed of the silicon oxide film, the silicon nitride film, or the laminate film thereof remaining over each of the side walls of the gate electrodes GE.

Figure 5:
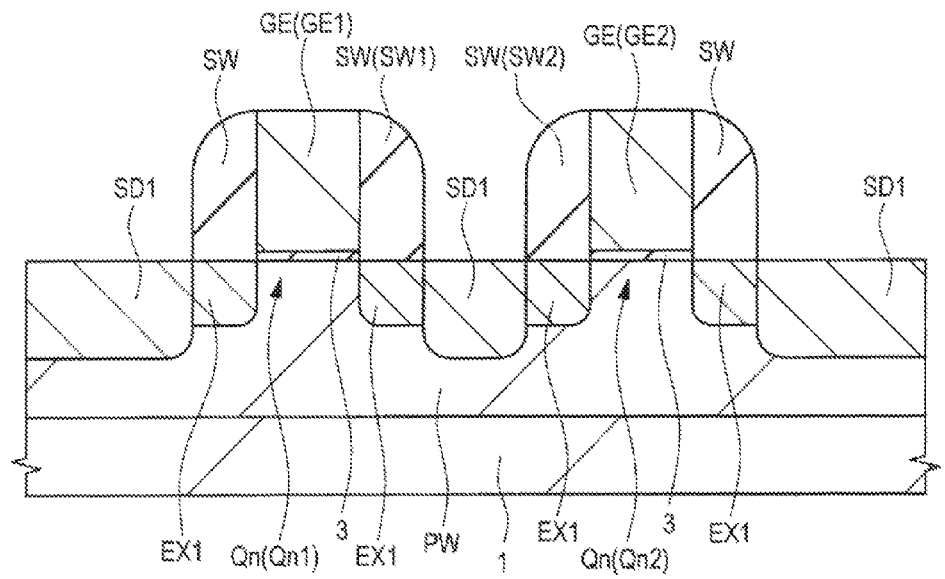
FIG. 5 is a main-portion cross-sectional view of the semiconductor device in a manufacturing step thereof, which is subsequent to FIG. 4.

Next, as shown in FIG. 5, an n-type impurity such as phosphorus (P) or arsenic (As) is ion implanted into the regions of the p-type well PW located on both sides of the gate electrodes GE and the sidewall spacers SW to thereby form n$^+$-type semiconductor regions SD1 (source/drain regions). During the ion implantation for forming the n$^+$-type semiconductor regions SD1, the ion implantation is performed to the semiconductor substrate 1 (p-type well PW) using the gate electrodes GE and the sidewall spacers SW over the side walls thereof as a mask. Consequently, the n$^-$-type semiconductor regions EX1 are formed in alignment (self-alignment) with the gate electrodes GE, while the n$^+$-type semiconductor regions SD1 are formed in alignment (self-alignment) with the sidewall spacers SW. In the ion implantation for forming the n$^+$-type semiconductor regions SD1, the regions of the p-type well PW located immediately under the gate electrodes GE and the sidewall spacers SW are shielded by the gate electrodes GE and the sidewall spacers SW and are therefore not subjected to the ion implantation.

After the ion implantation, an annealing treatment (activation annealing or heat treatment) for activating the introduced impurities is performed. This allows the impurities introduced into the n$^-$-type semiconductor regions EX1 and the n$^+$-type semiconductor regions SD1 to be activated.

In this manner, a structure as shown in FIG. 5 is obtained and n-channel MISFETs Qn are formed as field effect transistors in the p-type well PW.

The n$^+$-type semiconductor regions SD1 have impurity concentrations higher than those of the n$^-$-type semiconductor regions EX1 and junction depths deeper than those thereof. As a result, n-type semiconductor regions (impurity diffusion layers) functioning as the sources or drains of the n-channel MISFETs Qn are formed of the n$^+$-type semiconductor regions SD1 and the n$^-$-type semiconductor regions EX1. Therefore, the source/drain regions of the n-channel MISFETs Qn have LDD (Lightly doped Drain) structures. The n$^+$-type semiconductor regions SD1 can be regarded as semiconductor regions (source/drain regions) for the sources or drains of the n-channel MISFETs Qn. The gate electrodes GE function as the gate electrodes of the n-channel MISFETs Qn.

Note that, in FIG. 5, the two n-channel MISFETs Qn1 and Qn2 are shown as the re-channel MISFETs Qn, but the gate electrode GE1 as the gate electrode of the n-channel MISFET Qn1 and the gate electrode GE2 as the gate electrode of the n-channel MISFET Qn2 are adjacent to each other in a gate length direction (gate length direction of each of the gate electrodes GE1 and GE2). In addition, the n-channel MISFET Qn1 and the n-channel MISFET Qn2 share the n$^+$-type semiconductor regions SD1 for the sources or drains located between the gate electrode GE1 and the gate electrode GE2.

Figure 6:
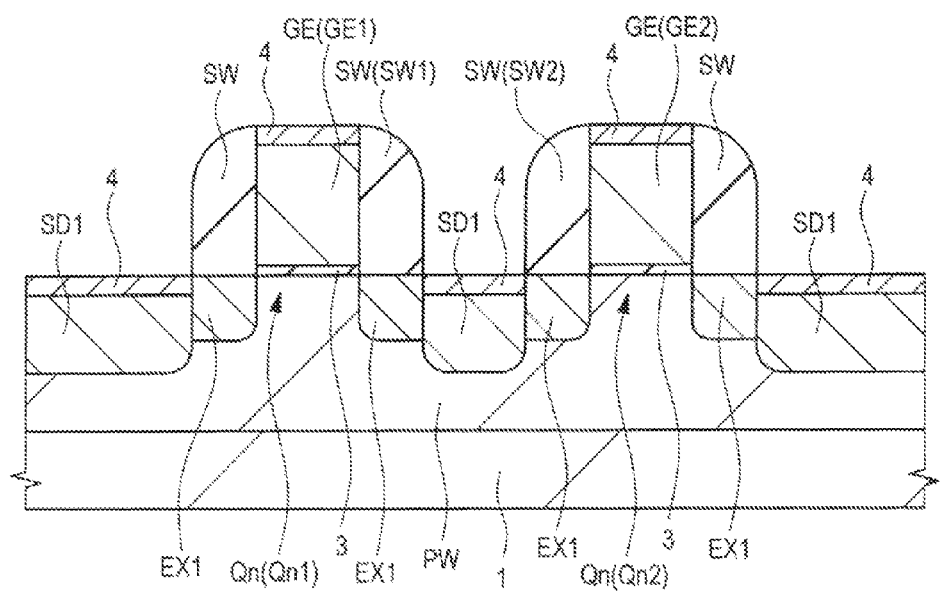
FIG. 6 is a main-portion cross-sectional view of the semiconductor device in a manufacturing step thereof, which is subsequent to FIG. 5.

Next, as shown in FIG. 6, using a salicide technique, low-resistance metal silicide layers 4 are formed in the respective surfaces (in the upper-layer portions) of the gate electrodes GE of the n-channel MISFETs Qn and the source/drain regions (n$^+$-type semiconductor regions SD1).

For example, after the surfaces (upper surfaces) of the gate electrodes GE and the n$^+$-type semiconductor regions SD1 are exposed, a metal film such as a cobalt (Co) film or a nickel (Ni) film is formed (deposited) using a sputtering method or the like over the main surface (entire surface) of the semiconductor substrate 1 including the respective upper surfaces of the gate electrodes GE and the n$^+$-type semiconductor regions SD1 and, by a heat treatment, the metal film is caused to react with the gate electrodes GE and the n$^+$-type semiconductor regions SD1 (individual silicon regions forming the gate electrodes GE and the n$^+$-type semiconductor regions SD1). In this manner, the metal silicide layers 4 are formed over the respective surfaces of the gate electrodes GE and the n$^+$-type semiconductor regions SD1. When the metal film is a cobalt film, the metal silicide layer 4 is a cobalt silicide layer and, when the metal film is a nickel film, the meal silicide layer 4 is a nickel silicide layer. If a nickel-platinum alloy film is used as the metal film, the metal silicide layer 4 is a nickel-platinum silicide layer. Thereafter, the unreacted metal film is removed. By forming the metal silicide layers 4, resistances such as the diffusion resistances and contact resistances of the gate electrodes GE and the n$^+$-type semiconductor regions SD1 can be reduced. Note that, when the metal silicide layers 4 are formed over the gate electrodes GE, the metal silicide layers 4 over the gate electrodes GE can also be regarded as parts of the gate electrodes GE.

Figure 7:
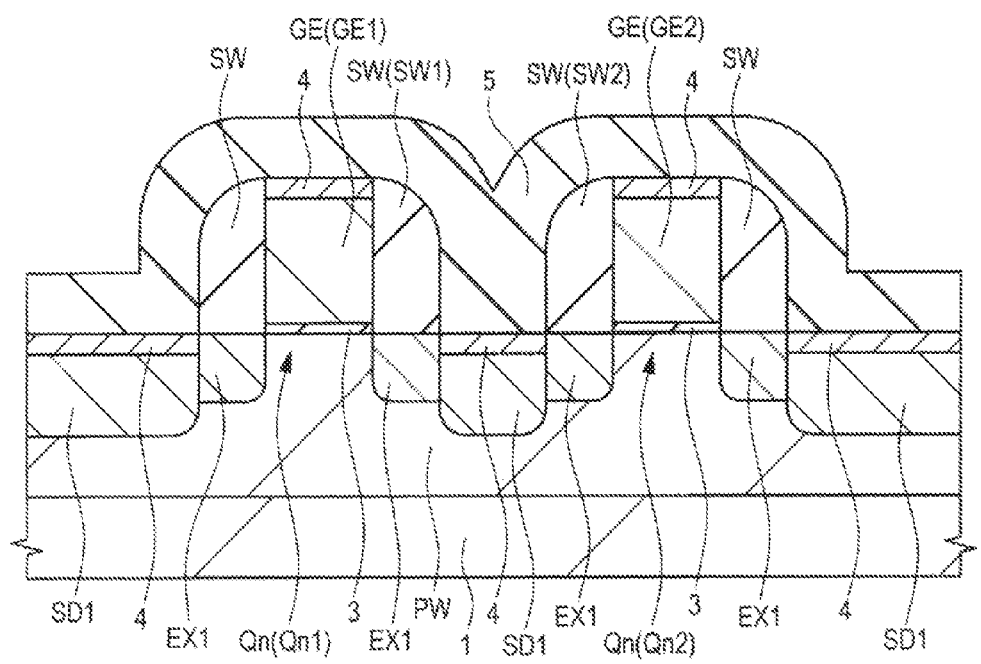
FIG. 7 is a main-portion cross-sectional view of the semiconductor device in a manufacturing step thereof, which is subsequent to FIG. 6.

Next, as shown in FIG. 7, over the entire main surface of the semiconductor substrate 1, a silicon nitride film 5 is formed as an insulating film for tensile stress. The silicon nitride film 5 is formed over the main surface of the semiconductor substrate 1 including the upper surfaces of the metal silicide layers 4 so as to cover the gate electrodes GE, the sidewall spacers SW, and the n$^+$-type semiconductor regions SD1. The silicon nitride film 5 is a tensile stress film.

In the present embodiment, the silicon nitride film 5 is formed as a laminate film of a plurality of silicon nitride films. A structure and a forming method of the silicon nitride film 5 will be described later in greater detail. For clarity of illustration, in FIGS. 7 to 10, the silicon nitride film 5 is shown as a single layer, but the silicon nitride film 5 is actually a laminate film of, e.g., a silicon nitride film 5a, a silicon nitride film 5b, and a silicon nitride film 5c, as will be described later.

The silicon nitride film 5 formed in the present embodiment is the tensile stress film. Also, each of the silicon nitride films 5a, 5b, and 5c forming the silicon nitride film 5 is a tensile stress film. Note that, in the present embodiment and the following second embodiment, a tensile stress film is a film (insulating film) which gives a tensile stress to a semiconductor substrate formed with the tensile stress film. In a region where the tensile stress film is formed over the semiconductor substrate, a tensile stress is exerted on (given to or developed in) the semiconductor substrate by the tensile stress film. If the tensile stress is exerted by the tensile stress film over the semiconductor substrate (channel region thereof) formed with an n-channel MISFET, through an increase in the mobility of electrons or the like, an ON current flowing in the channel of the n-channel MISFET can be increased. The tensile stress film may also be referred to as a tension stress film. On the other hand, a compression stress film is a film (insulating film) which gives a compression stress to a semiconductor substrate formed with the compression stress film. In a region where the compression stress film is formed over the semiconductor substrate, a compression stress is exerted on (given to or developed in) the semiconductor substrate by the compression stress film. If the compression stress is exerted by the compression stress film over the semiconductor substrate (channel region thereof) formed with a p-channel MISFET, through an increase in the mobility of holes or the like, an ON current flowing in the channel of the p-channel MISFET can be increased. The compression stress film may also be referred to as a compressive stress film.

In the present embodiment, the silicon nitride film 5 as the tensile stress film is formed so as to cover the n-channel MISFETs Qn (including the n-channel MISFETs Qn1 and Qn2). Therefore, through an increase in the mobility of electrons in the channel region of each of the n-channel MISFETs Qn, an ON current (drive current) flowing in the channel of the n-channel MISFET Qn can be increased. This allows an improvement in the performance of the semiconductor device including the n-channel MISFETs Qn.

Examples of the tensile stress film include not only the silicon nitride film but also other films containing silicon and nitrogen, such as a SiON film (silicon oxynitride film) and a SiCN film (silicon carbonitride film). However, obtaining a high tensile stress from the SiON film or the SiCN film is more difficult than obtaining a high tensile stress from the silicon nitride films so that the present embodiment preferably uses the silicon nitride film 5 as the tensile stress film. In the present embodiment, by using the tensile stress film (which is the silicon nitride film 5 herein) formed of silicon nitride, it is possible to increase the tensile stress exerted on the semiconductor substrate and enhance the effect of improving the ON current (drive current) in each of the n-channel MISFETs Qn. The tensile stress of the silicon nitride film 5 is preferably set not less than 1.5 GPa.

Figure 8:
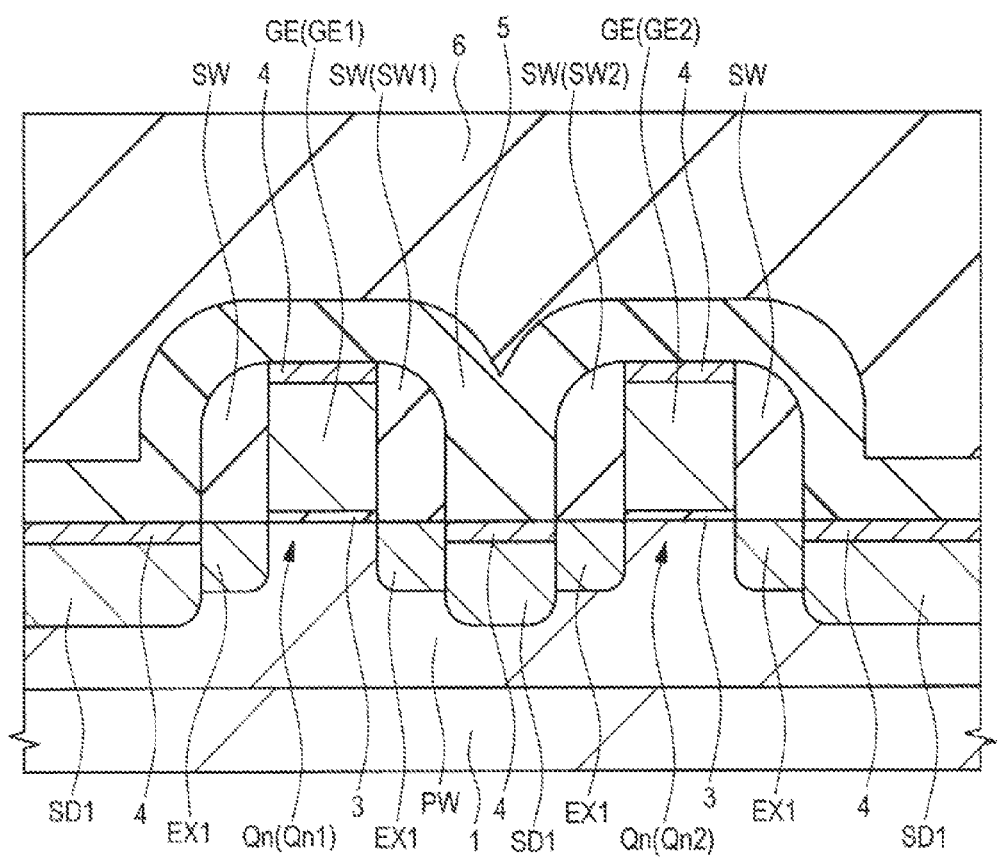
FIG. 8 is a main-portion cross-sectional view of the semiconductor device in a manufacturing step thereof, which is subsequent to FIG. 7.

Next, as shown in FIG. 8, over the entire main surface of the semiconductor substrate 1, i.e., over the silicon nitride film 5, an interlayer insulating film 6 is formed as a silicon-oxide-based insulating film. The film thickness of the interlayer insulating film 6 is larger than the film thickness of the silicon nitride film 5. As the interlayer insulating film 6, a silicon-oxide-based insulating film (i.e., an oxide-film-type insulating film) is used. Here, the silicon-oxide-based insulating film (oxide-film-type insulating film) is an insulating film containing silicon oxide as a main component. However, the silicon-oxide-based insulating film may also contain one or more of carbon (C), fluorine (F), nitrogen (N), boron (B), and phosphorus (P).

After the formation of the interlayer insulating film 6, the upper surface of the interlayer insulating film 6 is polished by a CMP (Chemical Mechanical Polishing) method or the like to be planarized.

Figure 9:
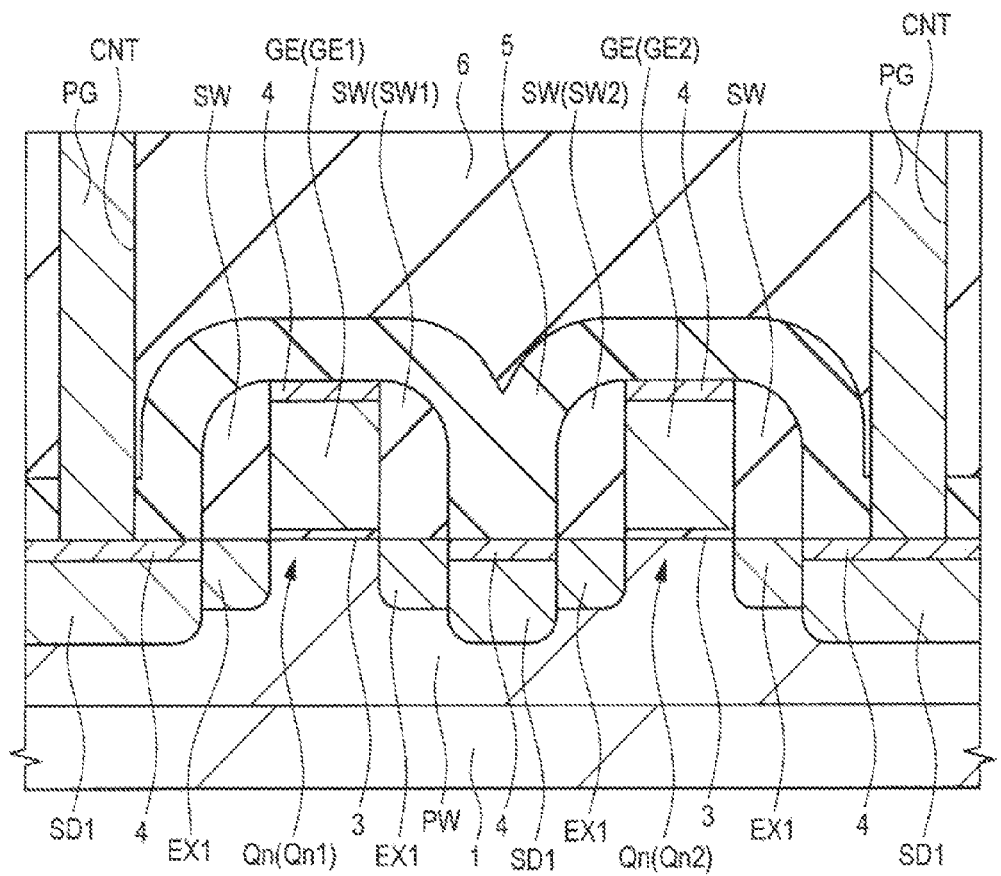
FIG. 9 is a main-portion cross-sectional view of the semiconductor device in a manufacturing step thereof, which is subsequent to FIG. 8.

Next, as shown in FIG. 9, using a photoresist pattern (not shown) formed over the interlayer insulating film 6 as an etching mask, the interlayer insulating film 6 and the silicon nitride film 5 are dry-etched to form contact holes (through holes or apertures) CNT in the interlayer insulating film 6 and the silicon nitride film 5. The contact holes CNT are formed so as to extend through the laminate film (laminate insulating film) including the interlayer insulating film 6 and the silicon nitride film 5.

To form the contact holes CNT, the dry etching of the interlayer insulating film 6 is performed first under conditions under which the interlayer insulating film 6 is more likely to be etched than the silicon nitride film 5 to cause the silicon nitride film 5 to function as an etching stopper film. In this manner, the contact holes CNT are formed in the interlayer insulating film 6. Then, the silicon nitride film 5 at the bottom portion of each of the contact holes CNT is removed by dry etching under conditions under which the silicon nitride film 5 is more likely to be etched than the interlayer insulating film 6 to form the contact holes CNT as through holes. At the bottom portions of the contact holes CNT formed above the n$^+$-type semiconductor regions SD1, the metal silicide layers 4 over the n$^+$-type semiconductor regions SD1 are exposed.

Next, in the contact holes CNT, conductive plugs (coupling conductor portions) PG formed of tungsten (W) or the like are formed (buried). To form the plugs PG, for example, a barrier conductor film (e.g., a titanium film, a titanium nitride film, or a laminate film thereof) is formed over the interlayer insulating film 6 including the insides (bottom portions and side walls) of the contact holes CNT. Then, over the barrier conductor film, a main conductor film formed of a tungsten film or the like is formed so as to fill the contact holes CNT and, by removing the unneeded main conductor film and barrier conductor film over the interlayer insulating film 6 by a CMP method, an etch-back method, or the like, the plugs PG can be formed. Note that, for clarity of illustration, in FIG. 9, the barrier conductor film and the main conductor film (tungsten film) each forming the plugs PG are integrally shown. The plugs PG formed above the n$^+$-type semiconductor regions SD 1 have the bottom portions thereof in contact with the metal silicide layers 4 over the surfaces of the n$^+$-type semiconductor regions SD1, and are electrically coupled thereto.

Figure 10:
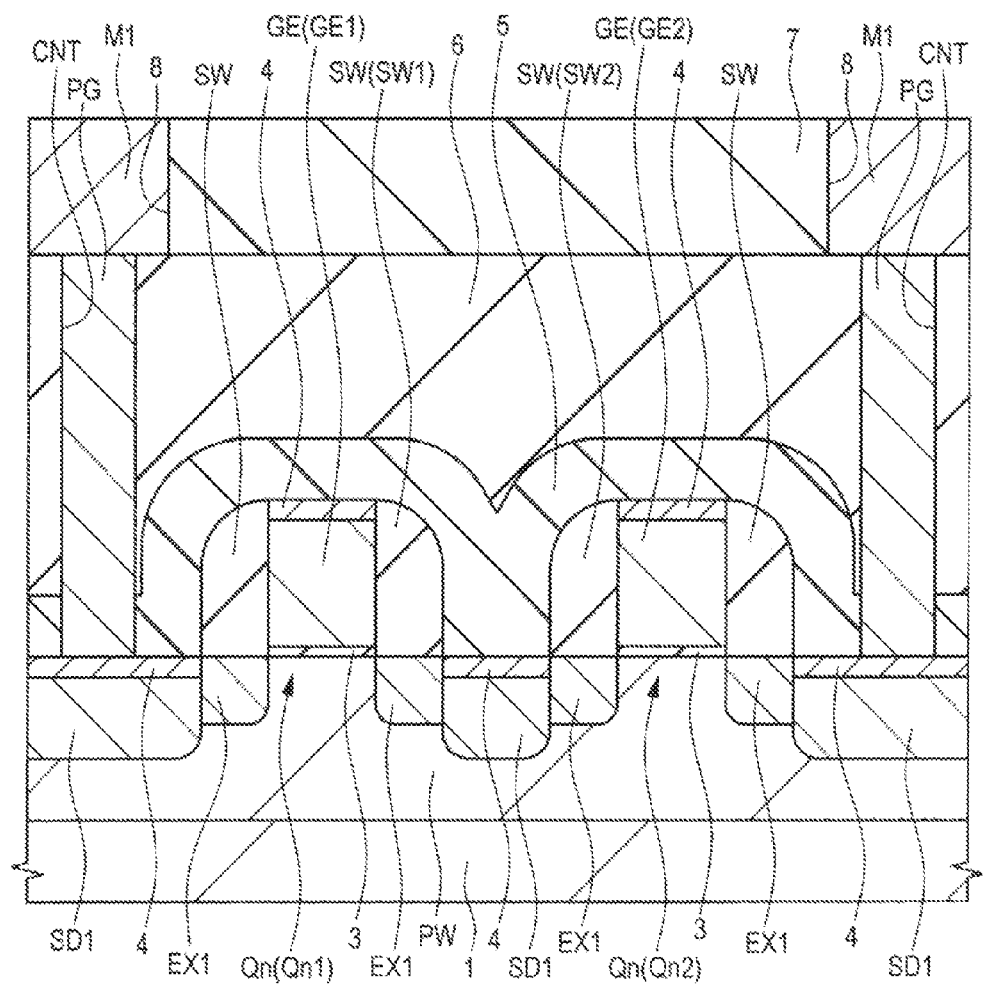
FIG. 10 is a main-portion cross-sectional view of the semiconductor device in a manufacturing step thereof, which is subsequent to FIG. 9.

Next, as shown in FIG. 10, over the interlayer insulating film 6 in which the plugs PG are buried, another insulating film (second interlayer insulating film) 7 for forming wiring lines is formed. The insulating film 7 can be formed as a single-layer film or a laminate film.

Next, by a single damascene method, first-layer wiring lines are formed. First, by dry etching using a resist pattern (not shown) as a mask, wiring trenches 8 are formed in the predetermined regions of the insulating film 7, and then a barrier conductor film (barrier metal film) is formed over the main surface (over the insulating film including the bottom portions and side walls of the wiring trenches 8) of the semiconductor substrate 1. Examples of the barrier conductor film that can be used include a titanium nitride film, a tantalum film, or a tantalum nitride film. Subsequently, by a CVD method, a sputtering method, or the like, a seed layer (not shown) of copper is formed over the barrier conductor film and, using an electrolytic plating method or the like, a copper plating film (main conductor film) is further formed over the seed layer. With the copper plating film, the insides of the wiring trenches 8 are filled. Then, the copper plating film, the seed layer, and the barrier metal film in the regions other than the wiring trenches 8 are removed by a CMP method to form first-layer wiring lines M1 formed of copper as a main conductive material. Note that, for clear illustration, in FIG. 10, the copper plating film, the seed layer, and the barrier metal film each forming the wiring lines M1 are integrally shown. The wiring lines M1 are electrically coupled to the n$^+$-type semiconductor regions SD1 for the sources or drains of the n-channel MISFETs Qn, the gate electrodes GE, and the like via the plugs PG.

Thereafter, by a dual damascene method, second- and subsequent-layer wiring lines are formed, but the depiction and description thereof is omitted here. The wiring lines M1 are not limited to damascene wiring lines, but may also be formed by patterning the conductive film for wiring lines. For example, the wiring lines M1 can also be formed as tungsten wiring lines, aluminum wiring lines, or the like.

Forming Silicon Nitride Film as Tensile Stress Film

Figure 11:
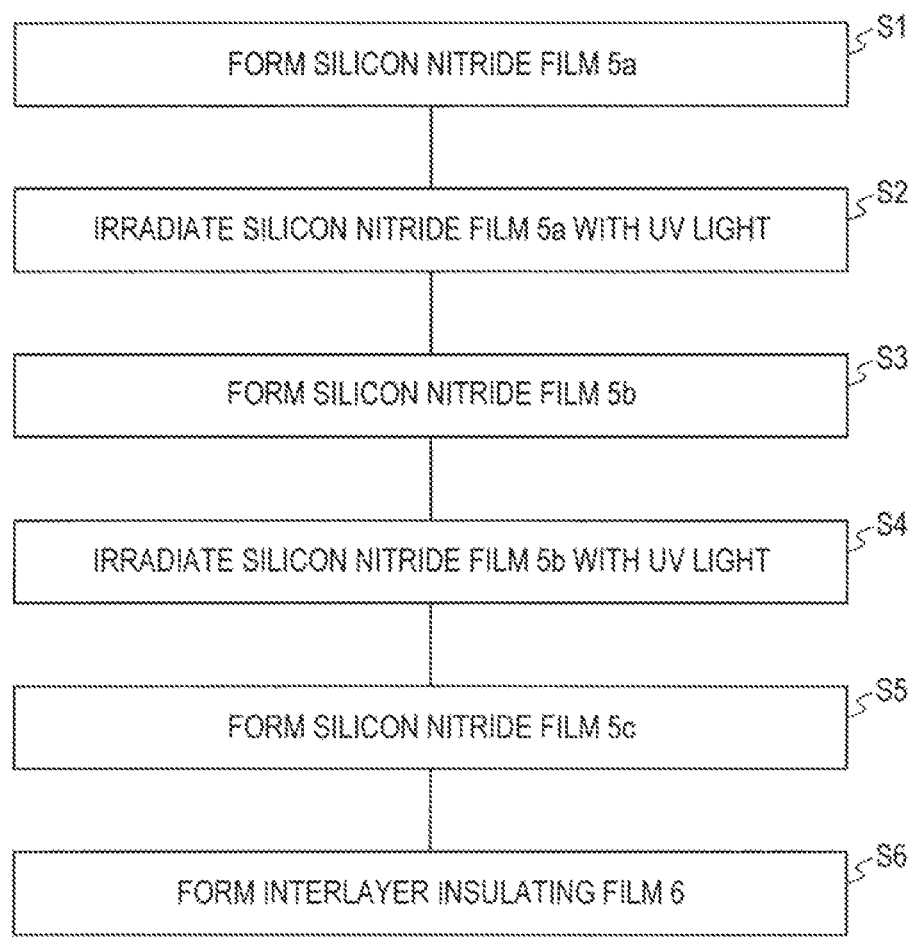
FIG. 11 is a process flow chart showing the detail of the step of forming a silicon nitride film as a tensile stress film.

Next, a more detailed description will be given to the step of forming the silicon nitride film 5. FIG. 11 is a process flow chart showing the detail of the step of forming the silicon nitride film 5 as the tensile stress film. FIGS. 12 to 16 are main-portion cross-sectional views of the semiconductor device of the present embodiment in the manufacturing steps thereof, which show the same cross-sectional regions as in FIGS. 1 to 10 described above.

As described above, in the present embodiment, the silicon nitride film 5 is formed as the laminate film of the plural silicon nitride films, and the step of forming the silicon nitride film 5 will be specifically described below.

By performing the steps of FIGS. 1 to 6 described above, the structure of FIG. 12 corresponding to FIG. 6 described above is obtained.

Figure 12:
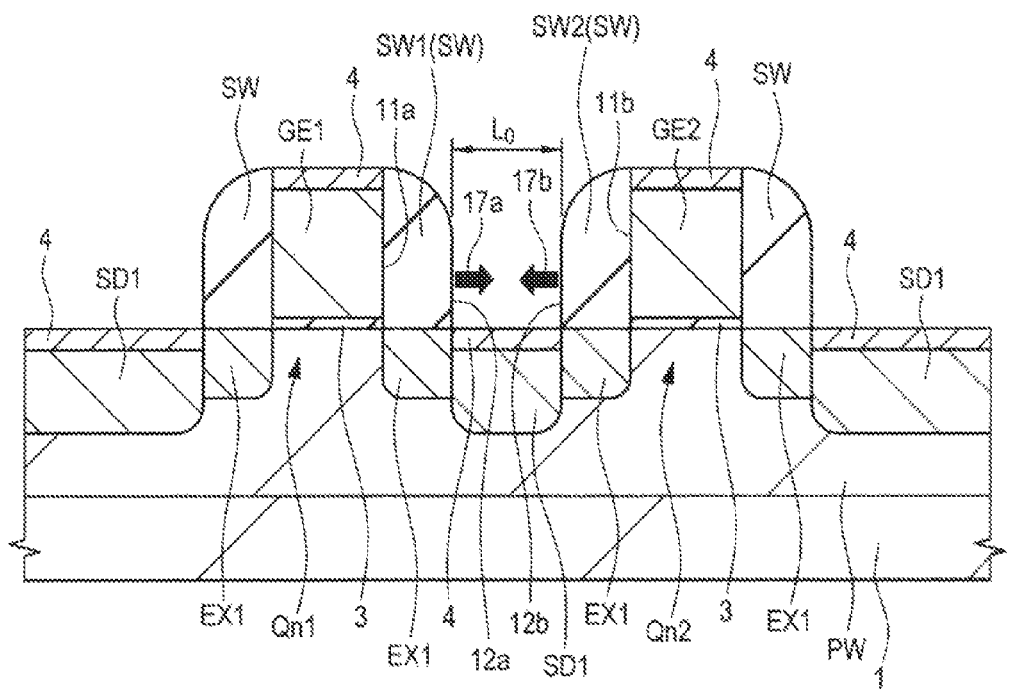
FIG. 12 is a main-portion cross-sectional view of the semiconductor device as the embodiment of the present invention in a manufacturing step thereof.

As shown in FIG. 12, the gate electrode GE1 and the gate electrode GE2 are adjacent to each other in the direction of the gate length (gate length of each of the gate electrodes GE1 and GE2) and, over the side walls of the gate electrodes GE1 and GE2, the sidewall spacers SW are formed. It is assumed that, of the sidewall spacers SW, the sidewall spacer SW formed over the side wall (side wall opposing the gate electrode GE2) 11a of the gate electrode GE1 is referred to as a sidewall spacer (first sidewall spacer) SW1 and the sidewall spacer SW formed over the sidewall (side wall opposing the gate electrode GE1) 11b of the gate electrode GE2 is referred to as a sidewall spacer (second sidewall spacer) SW2. Note that the side wall 11a of the gate electrode GE1 is the one of the side walls of the gate electrode GE1 which opposes the gate electrode GE2 and the side wall 11b of the gate electrode GE2 is the one of the side walls of the gate electrode GE2 which opposes the gate electrode GE1. Accordingly, the side wall 11a of the gate electrode GE1 and the side wall 11b of the gate electrode GE2 oppose each other (face or adjoin each other), and the sidewall spacer SW1 formed over the side wall 11a of the gate electrode GE1 and the sidewall spacer SW2 formed over the side wall 11b of the gate electrode GE2 oppose each other (face or adjoin each other).

Figure 13:
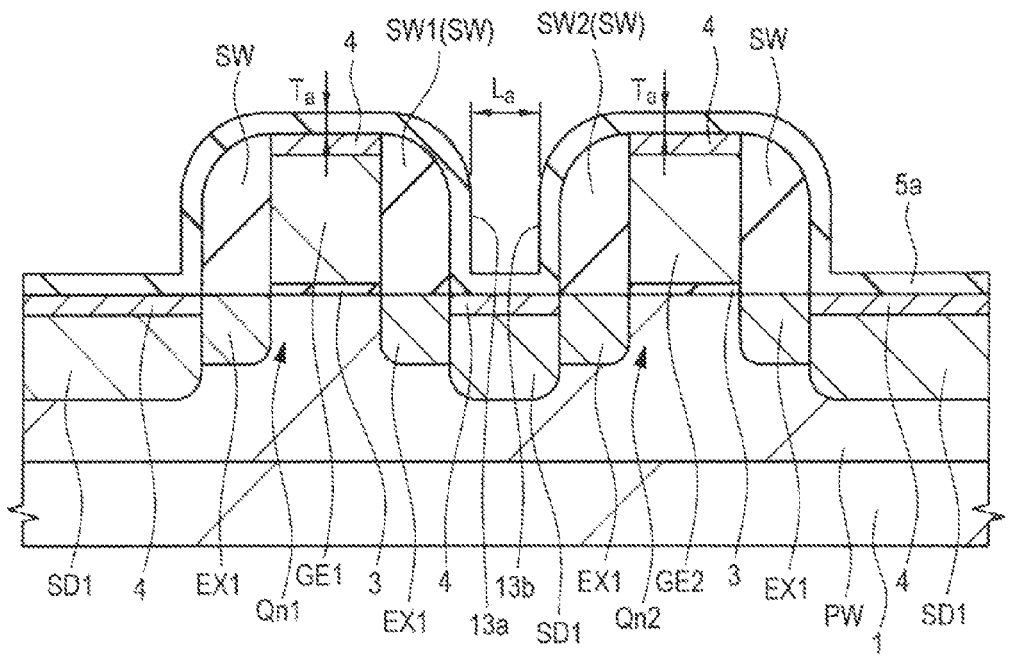
FIG. 13 is a main-portion cross-sectional view of the semiconductor device in a manufacturing step thereof, which is subsequent to FIG. 12.

After the structure of FIG. 12 is obtained, as shown in FIG. 13, a silicon nitride film 5a is formed over the entire main surface of the semiconductor substrate 1 (Step S1 of FIG. 11). The silicon nitride film 5a is an insulating film formed of silicon nitride. The silicon nitride film 5a is formed over the main surface of the semiconductor substrate 1 including the upper surfaces of the metal silicide layers 4 so as to cover the gate electrodes GE (including the gate electrodes GE1 and GE2), the sidewall spacers SW (including the sidewall spacers SW1 and SW2), and the n$^+$-type semiconductor regions SD1.

The silicon nitride film 5a can be formed using a plasma CVD (Chemical Vapor Deposition) method. The following is a specific example of film deposition conditions for the silicon nitride film 5a. For example, using a parallel-plate plasma CVD apparatus, a silane (SiH$_4$) gas, an ammonia (NH$_3$) gas, and a nitrogen (N$_2$) gas are introduced in such proportions as to achieve a SiH$_4$:NH$_3$:N$_2$ gas flow ratio of about 1:5-10:5-20 into a film deposition chamber (corresponding to a film deposition chamber 23 described later) and an RF power (radio-frequency power) of about 0.01 to 1 W/cm$^2$ is applied thereto to allow the silicon nitride film 5a to be deposited over the semiconductor substrate 1. The film deposition temperature (the temperature of the semiconductor substrate 1 during the film deposition) can be set to, e.g., about 250 to 450° C. The thickness (film thickness) of the formed silicon nitride film 5a is preferably set within the range of 1 to 25 nm.

It is assumed here that the spacing (distance) between the sidewall spacer SW and the sidewall spacer SW2 is denoted by L$_0$. The spacing (distance) L$_0$ is shown in FIG. 12. The spacing (distance) L$_0$ corresponds to a spacing (distance) between the sidewall spacer SW1 and the sidewall spacer SW2 that has been measured in a direction parallel with the gate length direction of the gate electrode GE1 or the gate electrode GE2. It is also assumed that the film thickness of the silicon nitride film 5a is denoted by T$_a$. The film thickness T$_a$ of the silicon nitride film 5a is shown in FIG. 13. The film thickness T$_a$ of the silicon nitride film 5a is the deposited film thickness (deposition thickness, formed film thickness, or formation thickness) of the silicon nitride film 5a in Step S1 and corresponds to the thickness of the silicon nitride film 5a over each of the gate electrodes GE1 and GE2.

If a comparison is made between the film thickness T$_a$ of the silicon nitride film 5a and the spacing L$_0$ between the sidewall spacers SW1 and SW2, the film thickness T$_a$ of the silicon nitride film 5a is smaller than half the spacing L$_0$ between the sidewall spacers SW1 and SW2. That is, the relationship given by the following expression (1) is established:

$$L_0/2 > T_a \qquad (1).$$

In Step S1, the silicon nitride film 5a is formed as a tensile stress film. The tensile stress film can be formed by forming a silicon nitride film (which is the silicon nitride film 5a herein) by a plasma CVD method and controlling conditions for the film deposition (such as a film deposition temperature, the type of a film deposition gas, the pressure of the gas, and an RF power) at that time. This allows the silicon nitride film 5a formed in Step S1 to serve as the tensile stress film.

Each of the silicon nitride films 5a, 5b, and 5c is formed as a tensile stress film but, in terms of being deposited as a film of a high tensile stress, each of the silicon nitride films 5a, 5b, and 5c is preferably formed by a plasma CVD method in which the film deposition temperature is set not lower than 400° C.

As a treatment for further increasing the tensile stress of a silicon nitride film deposited as a tensile stress film, a treatment may be applied, such as an ultraviolet irradiation treatment. By subjecting the silicon nitride film deposited as the tensile stress film using a plasma CVD method to the ultraviolet irradiation treatment (treatment for irradiating the silicon nitride film with irradiation light), the silicon nitride film can have a tensile stress larger than that before being subjected to the ultraviolet irradiation. A conceivable reason for the increased tensile stress of the silicon nitride film resulting from the ultraviolet irradiation treatment may be that hydrogen in the silicon nitride film desorbs under ultraviolet irradiation to shrink the silicon nitride film and change the bond angle between Si (silicon) and N (nitrogen) in the silicon nitride film, thereby increasing the tensile stress of the silicon nitride film.

In the present embodiment, after the silicon nitride film 5a is deposited by the plasma CVD method in Step S1, the silicon nitride film 5a is irradiated with ultraviolet light (Step S2 of FIG. 11). The ultraviolet irradiation treatment of Step S2 is preferably performed while the semiconductor substrate 1 is heated, and the heating temperature (temperature of the semiconductor substrate 1) can be set within a range of, e.g., 350 to 600° C. The ultraviolet irradiation treatment of Step S2 is preferably performed in an inert gas atmosphere, e.g., a helium (He), argon (Ar), or nitrogen (N$_2$) atmosphere. The treatment for irradiation with ultraviolet light (i.e., ultraviolet irradiation treatment) is hereinafter referred to also as UV (ultraviolet) irradiation treatment. Since the UV irradiation treatment of Step S2 functions to increase the tensile stress of the silicon nitride film 5a, it can be regarded as a treatment for increasing the tensile stress of the silicon nitride film 5a. That is, the silicon nitride film 5a formed in Step S1 is a tensile stress film and, by the UV irradiation treatment of Step S2, the tensile stress of the silicon nitride film 5a as the tensile stress film can further be increased.

Figure 14:
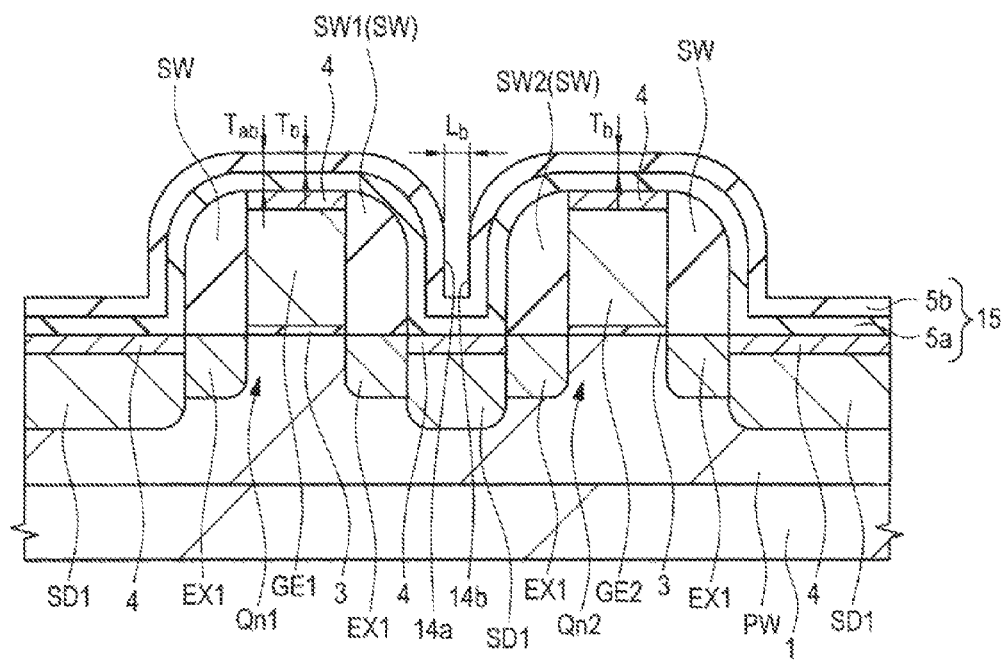
FIG. 14 is a main-portion cross-sectional view of the semiconductor device in a manufacturing step thereof, which is subsequent to FIG. 13.

After the UV irradiation treatment of Step S2, as shown in FIG. 14, a silicon nitride film 5b is formed over the entire main surface of the semiconductor substrate 1, i.e., over the silicon nitride 5a (Step S3 of FIG. 11).

In Step S1, over the main surface of the semiconductor substrate 1, the silicon nitride film 5a is formed so as to cover the gate electrodes GE (including the gate electrodes GE1 and GE2) and the sidewall spacers SW (including the sidewall spacers SW1 and SW2). As a result, in Step S3, the silicon nitride film 5b is formed over the silicon nitride film 5a so as to cover the gate electrodes GE (including the gate electrodes GE1 and GE2) and the sidewall spacers SW (including the sidewall spacers SW1 and SW2).

The step of forming the silicon nitride film 5b of Step S3 can be performed by basically the same method as in the step of forming the silicon nitride film 5a of Step 1 described above. That is, the silicon nitride film 5b is also formed using a plasma CVD method and conditions for film deposition such as a film deposition temperature and a gas to be used can be set the same as in Step S1 (the step of depositing the silicon nitride film 5a) described above. In the same manner as the silicon nitride film 5a is formed as the tensile stress film in Step S1, the silicon nitride film 5b is formed as a tensile stress film in Step S3.

Here, the film thickness of the silicon nitride film 5b is denoted by $T_b$. The film thickness $T_b$ of the silicon nitride film 5b is shown in FIG. 14. The film thickness $T_b$ of the silicon nitride film 5b is a deposited film thickness (deposition thickness, formed film thickness, or formation thickness) of the silicon nitride film 5b in Step S3 and corresponds to the thickness of the silicon nitride film 5b over each of the gate electrodes GE1 and GE2. If a laminate film of the silicon nitride film 5a and the silicon nitride film 5b is provided with a reference numeral 15 and represented as the silicon nitride film 15, a film thickness $T_{ab}$ of the silicon nitride film 15 can be given by $T_{ab}=T_a+T_b$. Since the silicon nitride films 5a and 5b are the tensile stress films, the silicon nitride film 15 is also a tensile stress film. The film thickness $T_{ab}$ of the silicon nitride film 15 is shown in FIG. 14 and corresponds to the thickness of the silicon nitride film 15 over each of the gate electrodes GE1 and GE2.

When the film thickness $T_a$ of the silicon nitride film 5a and the film thickness $T_b$ of the silicon nitride film 5b are compared with the spacing $L_0$ between the sidewall spacers SW1 and SW2, the sum (i.e., the film thickness $T_{ab}$ of the silicon nitride film 15) of the film thickness $T_a$ of the silicon nitride film 5a and the film thickness $T_b$ of the silicon nitride film 5b is smaller than half the spacing $L_0$ between the sidewall spacers SW1 and SW2. That is, the relationship given by the following expression (2) is established:

$$L_0/2>T_a+T_b \text{ (i.e., } L_0/2>T_{ab}) \quad (2).$$

Here, the spacing (distance) between the silicon nitride film 5a over the side surface of the sidewall spacer SW1 and the silicon nitride film 5a over the side surface of the sidewall spacer SW2 at the stage prior to the formation of the silicon nitride film 5b in Step S3 (i.e., the stage after the UV irradiation treatment of Step S2 has been performed and before the step of forming the silicon nitride film 5b of Step S3 is performed) is denoted by $L_a$. The spacing $L_a$ is shown in FIG. 13. The spacing (distance) $L_a$ corresponds to a spacing (distance) between the silicon nitride film 5a over the side surface of the sidewall spacer SW1 and the silicon nitride film 5a over the side surface of the sidewall spacer SW2 that has been measured in a direction parallel with the gate length direction of the gate electrode GE1 or the gate electrode GE2.

The spacing $L_a$ has a value obtained by subtracting double the film thickness $T_a$ of the silicon nitride film 5a from the spacing $L_0$ so that the relationship given by the following expression (3) is established:

$$L_a=L_0-2T_a \quad (3).$$

Therefore, the foregoing expression (2) is equivalent to the following expression (4):

$$L_a/2>T_b \quad (4).$$

That is, if the foregoing expression (2) is satisfied, it follows that the foregoing expression (4) is also satisfied. Therefore, when the film thickness $T_b$ of the silicon nitride film 5b is compared with the spacing $L_a$ between the silicon nitride film 5a over the side surface of the sidewall spacer SW1 and the silicon nitride film 5a over the side surface of the sidewall spacer SW2, the relationship given by the foregoing expression (4) is established.

In the present embodiment, after the silicon nitride film 5b is deposited by the plasma CVD method in Step S3, the silicon nitride film 5b is irradiated with ultraviolet light (Step S4 of FIG. 11). The ultraviolet irradiation treatment (UV irradiation treatment) for the silicon nitride film 5b in Step S4 can be performed by basically the same method as in the ultraviolet irradiation treatment (UV irradiation treatment) for the silicon nitride film 5a in Step S2 described above. Since the UV irradiation treatment of Step S4 functions to increase the tensile stress of the silicon nitride film 5b, it can be regarded as a treatment for increasing the tensile stress of the silicon nitride film 5b. That is, the silicon nitride film 5b formed in Step S3 is the tensile stress film and, by the UV irradiation treatment of Step S4, the tensile stress of the silicon nitride film 5b as the tensile stress film can further be increased.

Figure 15:
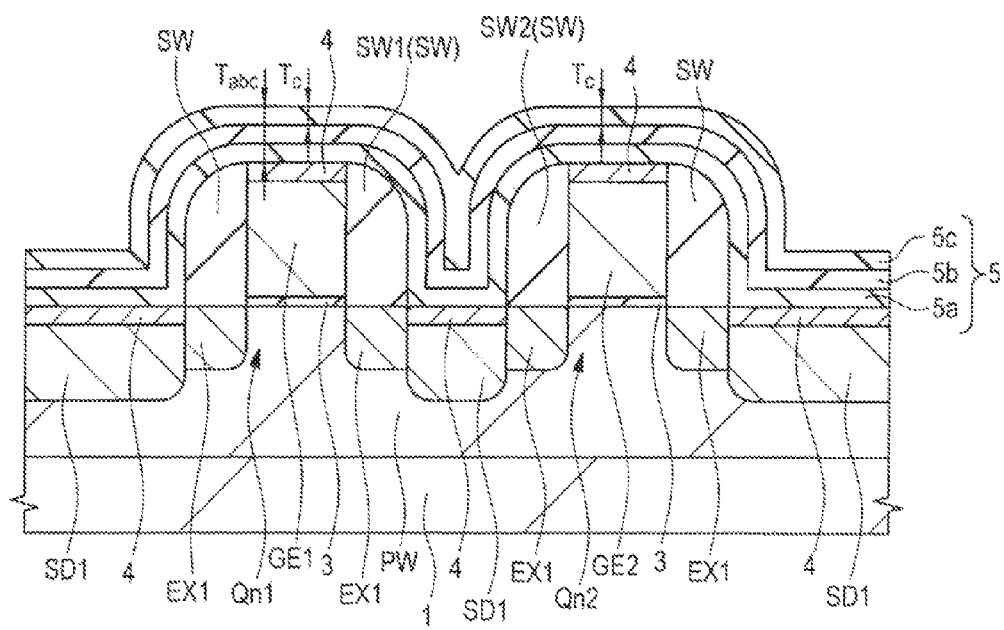
FIG. 15 is a main-portion cross-sectional view of the semiconductor device in a manufacturing step thereof, which is subsequent to FIG. 14.

After the UV irradiation treatment of Step S4, as shown in FIG. 15, the silicon nitride film 5c is formed over the entire main surface of the semiconductor substrate 1, i.e., over the silicon nitride 5b (Step S5 of FIG. 11).

In Steps S1 and S3, the silicon nitride films 5a and 5b are formed so as to cover the gate electrodes GE (including the gate electrodes GE1 and GE2) and the sidewall spacers SW (including the sidewall spacers SW1 and SW2). Accordingly, in Step S5, the silicon nitride film 5c is formed over the silicon nitride film 5b so as to cover the gate electrodes (including the gate electrodes GE1 and GE2) and the sidewall spacers (including the sidewall spacers SW1 and SW2).

The step of forming the silicon nitride film 5c of Step S5 can be performed by basically the same method as in each of the step of forming the silicon nitride film 5a of Step S1 described above and the step of forming the silicon nitride film 5b of Step S3 described above. That is, the silicon nitride film 5c is also formed using a plasma CVD method and conditions for film deposition such as a film deposition temperature and a gas to be used can be set the same as in each of Step S1 (the step of depositing the silicon nitride film 5a) described above and Step S3 (the step of depositing the silicon nitride film 5b) described above. In the same manner as the silicon nitride films 5a and 5b are formed as the tensile stress films in Steps S1 and S3, the silicon nitride film 5c is formed as a tensile stress film in Step S5.

Here, the film thickness of the silicon nitride film 5c is denoted by $T_c$. The film thickness $T_c$ of the silicon nitride film 5c is shown in FIG. 15. The film thickness $T_c$ of the silicon nitride film 5c is a deposited film thickness (deposition thickness, formed film thickness, or formation thickness) of the silicon nitride film 5c in Step S5 and corresponds to the thickness of the silicon nitride film 5c over each of the gate electrodes GE1 and GE2. A film thickness $T_{abc}$ of the silicon nitride film 5, which is a laminate film of the silicon nitride film 5a, the silicon nitride film 5b, and the silicon nitride film 5c, can be given by $T_{abc}=T_a+T_b+T_c$. The film thickness $T_{abc}$ of the silicon nitride film 5 is shown in FIG. 15 and corresponds to the thickness of the silicon nitride film 5 over each of the gate electrodes GE1 and GE2.

When the film thickness $T_a$ of the silicon nitride film 5a, the film thickness $T_b$ of the silicon nitride film 5b, and the film thickness $T_c$ of the silicon nitride film 5c are compared with the spacing $L_0$ between the sidewall spacers SW1 and SW2, the sum (i.e., the film thickness $T_{abc}$ of the silicon nitride film 5) of the film thickness $T_a$ of the silicon nitride film 5a, the film thickness $T_b$ of the silicon nitride film 5b, and the film thickness $T_c$ of the silicon nitride film 5c is not less than half the spacing $L_0$ between the sidewall spacers SW1 and SW2. That is, the relationship given by the following expression (5) is established:

$$L_0/2 \leq T_a + T_b + T_c = T_{abc} \quad (5).$$

Here, the spacing (distance) between the silicon nitride film 5b over the side surface of the sidewall spacer SW1 and the silicon nitride film 5b over the side surface of the sidewall spacer SW2 at the stage prior to the formation of the silicon nitride film 5c in Step S5 (i.e., the stage after the UV irradiation treatment of Step S4 has been performed and before the step of forming the silicon nitride film 5c of Step S5 is performed) is denoted by $L_b$. The spacing $L_b$ is shown in FIG. 14. The spacing (distance) $L_b$ corresponds to a spacing (distance) between the silicon nitride film 5b over the side surface of the sidewall spacer SW1 and the silicon nitride film 5b over the side surface of the sidewall spacer SW2 that has been measured in a direction parallel with the gate length direction of the gate electrode GE1 or the gate electrode GE2. The spacing $L_b$ can also be regarded as the spacing (distance) between the silicon nitride film 15 over the side surface of the sidewall spacer SW1 and the silicon nitride film 15 over the side surface of the sidewall spacer SW2.

The spacing $L_b$ has a value obtained by subtracting double the sum of the film thickness $T_a$ of the silicon nitride film 5a and the film thickness $T_b$ of the silicon nitride film 5b from the spacing $L_0$ so that the relationship given by the following expression (6) is established:

$$L_b = L_0 - 2(T_a + T_b) = L_0 - 2T_{ab} \quad (6).$$

Therefore, the foregoing expression (5) is equivalent to the following expression (7):

$$L_b/2 \leq T_c \quad (7).$$

Accordingly, if the foregoing expression (5) is satisfied, it follows that the foregoing expression (7) is also satisfied. Therefore, when the film thickness $T_c$ of the silicon nitride film 5c is compared with the spacing $L_b$ between the silicon nitride film 5b over the side surface of the sidewall spacer SW1 and the silicon nitride film 5b over the side surface of the sidewall spacer SW2, the relationship given by the foregoing expression (7) is established.

Note that the foregoing spacing $L_0$ shown in FIG. 12 corresponds to a spacing (distance) from a side surface 12a (which is the side surface opposite to that in contact with the side wall 11a of the gate electrode GE1 and serves as a surface generally perpendicular to the main surface of the semiconductor substrate 1) of the sidewall spacer SW1 to a side surface 12b (which is the side surface opposite to that in contact with the side wall 11b of the gate electrode GE2 and serves as a surface generally perpendicular to the main surface of the semiconductor substrate 1) of the sidewall spacer SW2.

Also, the foregoing spacing $L_a$ shown in FIG. 13 corresponds to a spacing (distance) from a surface (side surface) 13a (which serves as a surface generally perpendicular to the main surface of the semiconductor substrate 1) of the silicon nitride film 5a over the side surface of the sidewall spacer SW1 to a surface (side surface) 13b (which serves as a surface generally perpendicular to the main surface of the semiconductor substrate 1) of the silicon nitride film 5a over the side surface of the sidewall spacer SW2. Also, the foregoing spacing $L_b$ shown in FIG. 14 corresponds to a spacing (distance) from a surface (side surface) 14a (which serves as a surface generally perpendicular to the main surface of the semiconductor substrate 1) of the silicon nitride film 5b over the side surface of the sidewall spacer SW1 to a surface (side surface) 14b (which serves as a surface generally perpendicular to the main surface of the semiconductor substrate 1) of the silicon nitride film 5b over the side surface of the sidewall spacer SW2.

The spacings $L_0$, $L_a$, and $L_b$ are spacings (distances) measured in directions along (parallel with) the directions (which are the gate length directions herein) in which the gate electrodes GE1 and GE2 adjoin each other. The side surfaces 12a and 12b oppose each other with the foregoing spacing $L_0$ being provided therebetween in the gate length direction (the gate length direction of each of the gate electrodes GE1 and GE2). The surfaces 13a and 13b oppose each other with the foregoing spacing $L_a$ being provided therebetween in the gate length direction (the gate length direction of each of the gate electrodes GE1 and GE2). The surfaces 14a and 14b oppose each other with the foregoing spacing $L_b$ being provided therebetween in the gate length direction (the gate length direction of each of the gate electrodes GE1 and GE2). Note that the surfaces 14a and 14b of the silicon nitride film 5b may also be regarded as the surfaces 14a and 14b of the silicon nitride film 15.

In the present embodiment, after the silicon nitride film 5c is deposited by the plasma CVD method in Step S5, the silicon nitride film 5c is not irradiated with ultraviolet light. That is, the silicon nitride films 5a and 5b are subjected to the ultraviolet irradiation treatments (corresponding to S2 and S4) after being deposited, but the silicon nitride film 5c is not subjected to any ultraviolet irradiation treatment after being deposited. Thus, in the present embodiment, the silicon nitride films 5a and 5b which are subjected to the ultraviolet irradiation treatments may be considered together as a first insulating film, while the silicon nitride film 5c which is not subjected to the ultraviolet irradiation treatment may be considered as a second insulating layer.

Since a UV irradiation treatment is a treatment for increasing a tensile stress, the tensile stress of the silicon nitride film 15 including the silicon nitride films 5a and 5b that have been subjected to the UV irradiation treatments is larger than the tensile stress of the silicon nitride film 5c that has not been subjected to any UV irradiation treatment. The tensile stress of the entire silicon nitride film 5 is preferably not less than 1.5 GPa.

Figure 16:
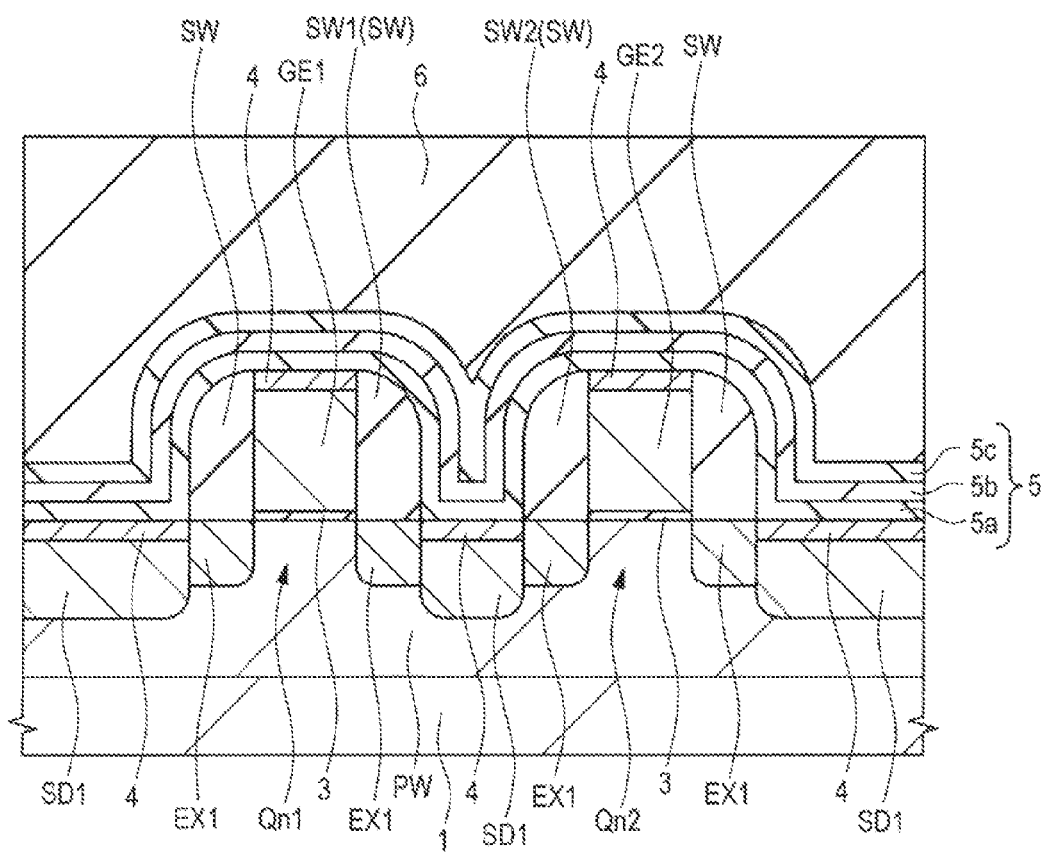
FIG. 16 is a main-portion cross-sectional view of the semiconductor device in a manufacturing step thereof, which is subsequent to FIG. 15.

In this manner, the silicon nitride film 5 formed of the laminate film of the silicon nitride films 5a, 5b, and 5c is completed. Then, as shown in FIG. 16, over the entire main surface of the semiconductor substrate 1, i.e., over the silicon nitride film 5, an interlayer insulating film 6 is formed (Step S6 of FIG. 11). Since the silicon nitride film 5 formed of the laminate film of the silicon nitride films 5a, 5b, and 5c has the silicon nitride film 5c in the uppermost layer thereof, it follows that the interlayer insulating film 6 is formed over the silicon nitride film 5c. Moreover, while the silicon nitride films 5a, 5b are subject to a treatment for increasing tensile stress, the silicon nitride film 5c is not subject to a treatment for increasing tensile stress. Therefore, the interlayer insulating film 6 ("third insulating film") is formed over the silicon nitride film 5c ("second insulating film") without first subjecting the silicon nitride film 5c to a treatment (e.g., UV irradiation treatment) for increasing tensile stress.

In Steps S1, S3, and S5, the silicon nitride films 5a, 5b, and 5c are formed so as to cover the gate electrodes GE (including the gate electrodes GE1 and GE2) and the sidewall spacers SW (including the sidewall spacers SW1 and SW2). Therefore, in Step S6, the interlayer insulating film 6 is formed over the silicon nitride film (i.e., over the silicon nitride film 5c) so as to cover the gate electrodes GE (including the gate electrodes GE1 and GE2) and the sidewall spacers SW (including the sidewall spacers SW1 and SW2).

Figure 17:
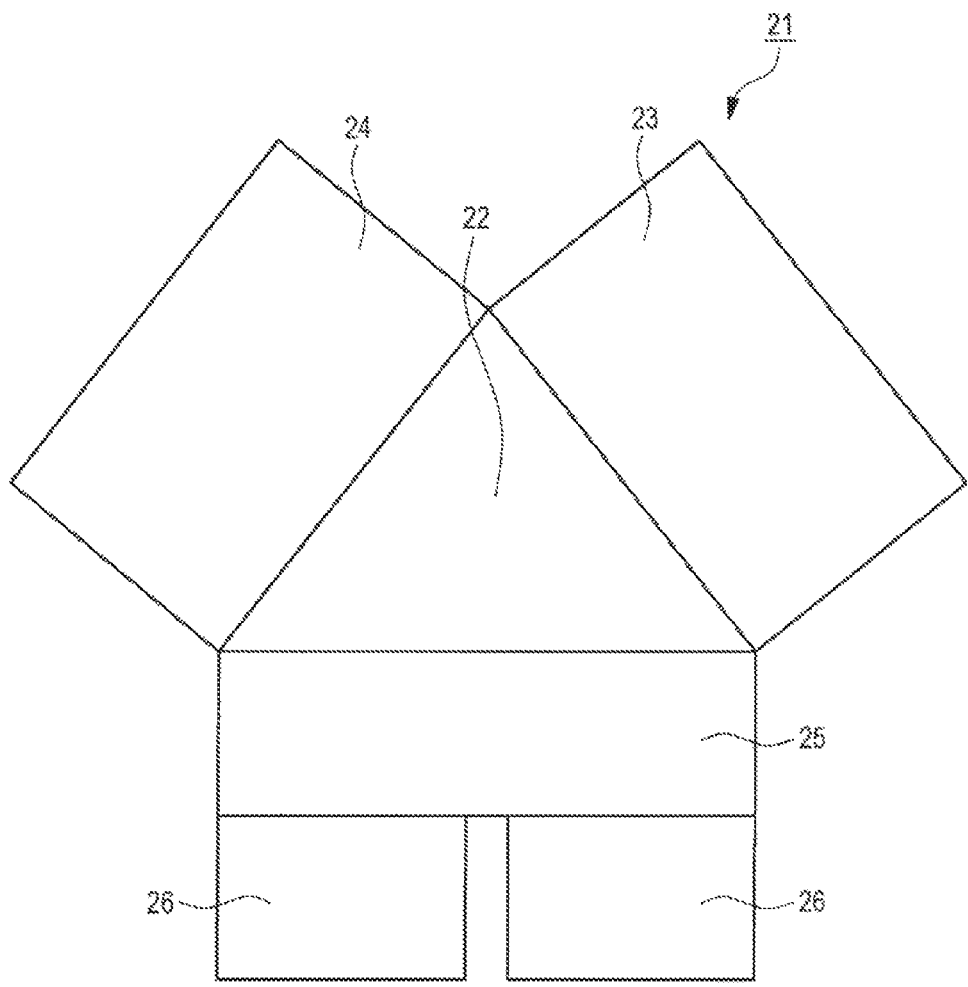
FIG. 17 is an illustrative view of a semiconductor manufacturing apparatus used to form the silicon nitride film as the tensile stress film.

Semiconductor Manufacturing Apparatus for Forming Silicon Nitride Film as Tensile Stress Film FIG. 17 is an illustrative view of a semiconductor manufacturing apparatus 21 used to form the silicon nitride film 5 as the tensile stress film. A description will be given to a method for forming the silicon nitride film 5 using the semiconductor manufacturing apparatus 21 of FIG. 17.

As shown in FIG. 17, the semiconductor manufacturing apparatus 21 is a so-called multi-chamber-type semiconductor manufacturing apparatus including a transportation chamber (buffer chamber) 22, a film deposition chamber 23, an ultraviolet irradiation chamber 24, and a load-lock chamber 25 which are arranged around the transportation chamber 22. The transportation chamber 22 and each of the film deposition chamber 23, the ultraviolet irradiation chamber 24, and the load-lock chamber 25 are coupled to each other via a gate valve (not shown) as an opening/closing means or the like. Between the film deposition chamber 23 and the ultraviolet irradiation chamber 24, a semiconductor wafer can be transported in vacuum via the transportation chamber 22.

First, a single semiconductor wafer (corresponding to the semiconductor substrate 1) is taken out of hoops 26 and transported into the load-lock chamber 25. The hoops 26 are airtight containers or vessels for batch transportation of semiconductor wafers, and typically contain the semiconductor wafers in batch units of 25 wafers, 12 wafer, 6 wafers, and the like. The vessel outer walls of the hoops 26 have airtight structures except for minute air-flow filter portions, and girt and dust are substantially completely blocked therefrom. Accordingly, even when transportation is performed in a class-1000 atmosphere, a class-1 cleanliness can be maintained in the insides thereof.

Subsequently, after the load-lock chamber 25 is evacuated, the semiconductor wafer is transported in vacuum from the load-lock chamber 25 into the film deposition chamber 23 through the transportation chamber 22 by means of a transportation robot (not shown) or the like. Then, in the film deposition chamber 23, the film deposition treatment (treatment for depositing the foregoing silicon nitride film 5a over the main surface of the semiconductor wafer by the plasma CVD method) of Step S1 described above is performed.

Next, the semiconductor wafer is transported in vacuum from the film deposition chamber 23 into the ultraviolet irradiation chamber 24 through the transportation chamber 22 by means of the transportation robot (not shown) or the like. Then, in the ultraviolet irradiation chamber 24, the ultraviolet irradiation treatment (treatment for irradiating the foregoing silicon nitride film 5a formed over the main surface of the semiconductor wafer with ultraviolet light) of Step S2 described above is performed.

Next, the semiconductor wafer is transported in vacuum from the ultraviolet irradiation chamber 24 back into the film deposition chamber 23 through the transportation chamber 22 by means of the transportation robot (not shown) or the like. Then, in the film deposition chamber 23, the film deposition treatment (treatment for depositing the foregoing silicon nitride film 5b over the main surface of the semiconductor wafer by the plasma CVD method) of Step S3 described above is performed.

Next, the semiconductor wafer is transported in vacuum from the film deposition chamber 23 again into the ultraviolet irradiation chamber 24 through the transportation chamber 22 by means of the transportation robot (not shown) or the like. Then, in the ultraviolet irradiation chamber 24, the ultraviolet irradiation treatment (treatment for irradiating the foregoing silicon nitride film 5b formed over the main surface of the semiconductor wafer with ultraviolet light) of Step S4 described above is performed.

Next, the semiconductor wafer is transported in vacuum from the ultraviolet irradiation chamber 24 once again into the film deposition chamber 23 through the transportation chamber 22 by means of the transportation robot (not shown) or the like. Then, in the film deposition chamber 23, the film deposition treatment (treatment for depositing the foregoing silicon nitride film 5c over the main surface of the semiconductor wafer by the plasma CVD method) of Step S5 described above is performed.

Thus, the semiconductor wafer (semiconductor substrate 1) is kept from being exposed to atmospheric air from the start time of the deposition of the silicon nitride film 5a by the plasma CVD method in Step S1 as the beginning of the step of forming the silicon nitride film 5 to the end time of the deposition of the silicon nitride film 5c by the plasma CVD method in Step S5 as the end of the step of forming the silicon nitride film 5. That is, the silicon nitride film 5a is deposited in Step S1 and then subjected to the ultraviolet irradiation treatment in Step S2 without being exposed to atmospheric air, the silicon nitride film 5b is deposited in Step S3 without being exposed to atmospheric air and then subjected to the ultraviolet irradiation treatment in Step S4 without being exposed to atmospheric air, and then the silicon nitride film 5c is deposited in Step S5 without being exposed to atmospheric air.

Next, the semiconductor wafer is transported in vacuum from the film deposition chamber 23 to the load-lock chamber 25 via the transportation chamber 22 by means of the transportation robot (not shown) or the like. Then, the semiconductor wafer is returned from the load-lock chamber 25 into the hoops 26. After the film deposition treatment (treatment for depositing the foregoing silicon nitride film 5c over the main surface of the semiconductor wafer by the plasma CVD method) of Step S5 described above is performed in the film deposition chamber 23, the semiconductor wafer is no longer subjected to any ultraviolet irradiation treatment so that the semiconductor wafer is not transmitted into the ultraviolet irradiation chamber 24, but is returned into the hoops 26. Thereafter, using the film deposition apparatus for the foregoing interlayer insulating film 6, the film deposition treatment (treatment for depositing the foregoing interlayer insulating film 6 over the main surface of the semiconductor wafer) of Step S6 described above is performed.

In the present embodiment, the silicon nitride film 5 as the tensile stress film is formed of the plural silicon nitride films 5a, 5b, and 5c, and the silicon nitride films 5a and 5b that have been subjected to the UV irradiation treatments and the silicon nitride film 5c that has not been subjected to any UV irradiation treatment are selectively used. The reason for this and the effect achieved thereby will be described below with reference to comparative examples.

Comparative Examples

First Comparative Example—Crack Formation in Single, Thick Film. In the present embodiment, the silicon nitride film 5 as the tensile stress film is formed of the plural (multi-layer) silicon nitride films 5a, 5b, and 5c. However, unlike in the present embodiment, there may be considered a case where the silicon nitride film 5 as the tensile stress film is formed of only a single thick silicon nitride film. The single thick silicon nitride film may be as thick as the combined thicknesses of the plural silicon nitride films 5a, 5b, and 5c of the present embodiment. Such a case where the silicon nitride film 5 as the tensile stress film is formed only of a single thick silicon nitride film will be referred to as a first comparative example.

In the case of the first comparative example, after a silicon nitride film as a tensile stress film is deposited by a plasma CVD method, if the deposited silicon nitride film is subjected to a UV irradiation treatment to have an increased tensile stress, a crack is likely to develop in the silicon nitride film. This is because, when the silicon nitride film is subjected to the UV irradiation treatment, as the thickness of the silicon nitride film increases, the amount of shrinkage of the silicon nitride film during UV irradiation increases, thereby increasing the likelihood of a crack to develop in a stress concentrated portion of the silicon nitride film. When the crack has developed in the silicon nitride film, the silicon nitride film becomes non-continuous and can no longer exert the tensile stress on the semiconductor substrate (particularly in the channel regions of n-channel MISFETs). As a result, it may be impossible to sufficiently obtain the effect of improving the characteristics of the n-channel MISFETs resulting from the formation of the silicon nitride film.

In view of this, it may be considered best to form the silicon nitride film as the tensile stress film as a laminate film of a plurality of silicon nitride films. This is because, if the silicon nitride film as the tensile stress film is formed as a laminate film of a plurality of silicon nitride films, the film thickness of each of the silicon nitride films can be reduced, and therefore the development of a crack which presents a problem in the first comparative example can be suppressed.

Figure 18A:
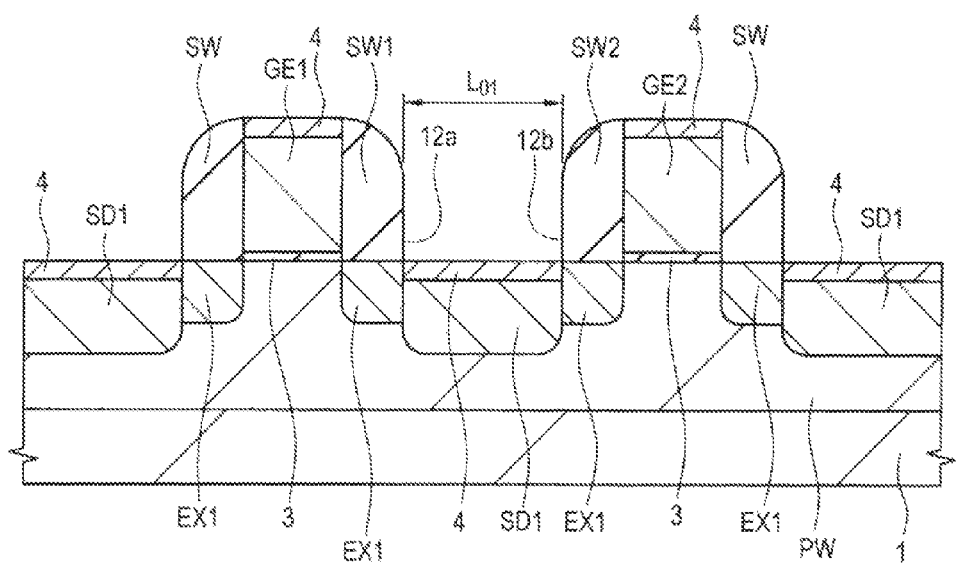
FIGS. 18(a) and 18(b) are main-portion cross-sectional views of a semiconductor device of a comparative example (second comparative example) in a manufacturing step thereof.
Figure 18B:
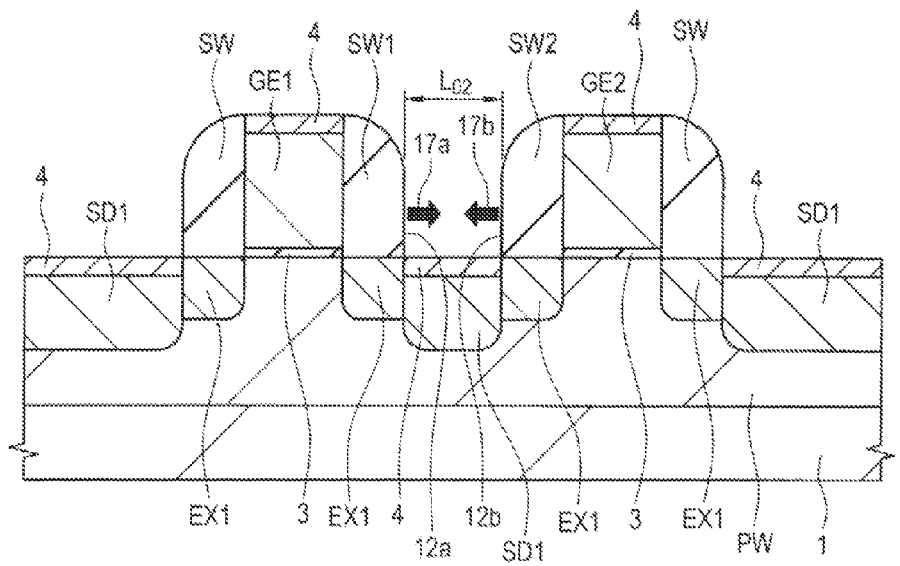
Figure 19A:
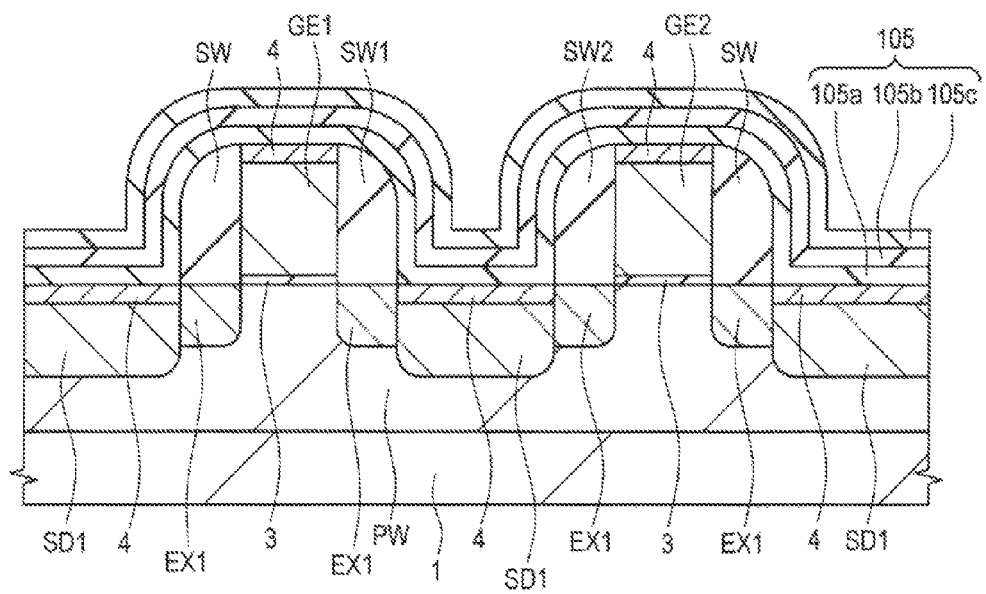
FIGS. 19(a) and 19(b) are main-portion cross-sectional views of the semiconductor device of the comparative example (second comparative example) in a manufacturing step thereof.
Figure 19B:
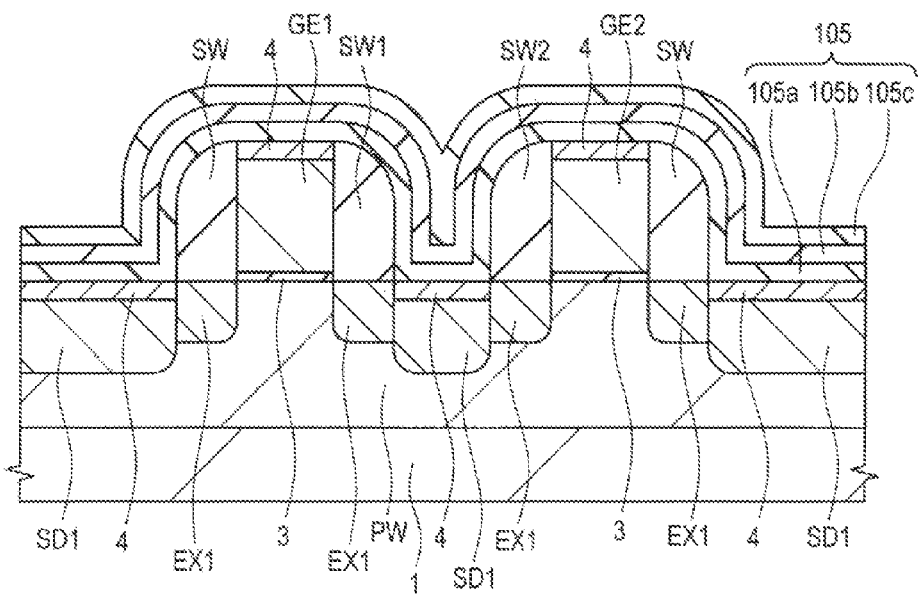

Second Comparative Example—Crack Formation in Irradiated Third Film When Gates are Close to One Another. FIGS. 18($a$), 18($b$), 19($a$), and 19($b$) are main-portion cross-sectional views of a semiconductor device of a second comparative example in the manufacturing steps thereof. FIGS. 18($a$) and 18($b$) show the stage where a structure corresponding to FIG. 6 described above (i.e., FIG. 12 described above) is obtained by performing the steps of FIGS. 1 to 6 described above. FIGS. 19($a$) and 19($b$) show the state (stage) where, after the structure of FIGS. 18($a$) and 18($b$) is obtained, a silicon nitride film 105 is formed instead of the silicon nitride film 5 of the present embodiment.

Note that, in FIGS. 18($a$), 18($b$), 19($a$), and 19($b$), a spacing $L_{01}$ (corresponding to the foregoing spacing $L_0$) between the sidewall spacer SW1 and the sidewall spacer SW2 is different in FIGS. 18($a$) and 19($a$) and in FIGS. 18($b$) and 19($b$). A spacing $L_{02}$ (corresponding to the foregoing spacing $L_0$) between the sidewall spacer SW1 and the sidewall spacer SW2 in FIGS. 18($b$) and 19($b$) is smaller than spacing $L_{01}$ (corresponding to the foregoing spacing $L_0$) between the sidewall spacer SW1 and the sidewall spacer SW2 in FIGS. 18($a$) and 19($a$) (i.e., $L_{02}<L_{01}$ is satisfied). In essence, the gates GE1, GE2 are closer to one another in FIGS. 18($a$) and (18$b$) than in FIGS. 19($a$) and 19($b$).

The silicon nitride film 105 of the second comparative example shown in FIGS. 19($a$) and 19($b$) has the same thickness as that of the silicon nitride film 5 of the present embodiment and is formed of a laminate film of silicon nitride films 105$a$, 105$b$, and 105$c$. The respective thicknesses of the silicon nitride films 105$a$, 105$b$, and 105$c$ are set the same as the respective thicknesses of the silicon nitride films 5$a$, 5$b$, and 5$c$ of the present embodiment.

To form the silicon nitride film 105 in the second comparative example, the silicon nitride film 105$a$ is deposited first by a plasma CVD method and then subjected to a UV irradiation treatment for increasing the tensile stress of the silicon nitride film 105$a$. Then, over the silicon nitride film 105$a$, the silicon nitride film 105$b$ is deposited by a plasma CVD method and subsequently subjected to a UV irradiation treatment for increasing the tensile stress of the silicon nitride film 105$b$. Thereafter, over the silicon nitride film 105$b$, the silicon nitride film 105$c$ is deposited by a plasma CVD method and then subjected to a UV irradiation treatment for increasing the tensile stress of the silicon nitride film 105$c$. In this manner, the silicon nitride film 105 formed of the laminate film of the silicon nitride films 105$a$, 105$b$, and 105$c$ can be formed.

In the case of the second comparative example of FIGS. 18($a$), 18($b$), 19($a$), and 19($b$), the silicon nitride film 105 as the tensile stress film is formed of the plural layers (which are the silicon nitride films 105$a$, 105$b$, and 105$c$ herein). This allows each of the silicon nitride films 105$a$, 105$b$, and 105$c$ to have a thickness smaller than that of the single, thick silicon nitride film as the tensile stress film in the first comparative example described above. Therefore, in the case of the second comparative example, the amount of shrinkage of each of the silicon nitride films 105$a$, 105$b$, and 105$c$ during UV irradiation can be reduced to be smaller than that when the single, thick silicon nitride film is subjected to UV irradiation in the first comparative example described above.

However, with the scaling down of semiconductor elements formed in the main surface of the semiconductor substrate 1, the spacing between the adjacent gate electrodes GE1 and GE2 has decreased and, consequently, the spacing (corresponding to the spacing $L_0$, $L_{01}$, or $L_{02}$) between the sidewall spacers SW1 and SW2 has also decreased. That is, in the case of FIGS. 18($a$) and 19($a$), the spacing $L_{01}$ between the sidewall spacers SW1 and SW2 is relatively large while, in the case of FIGS. 18($b$) and 19($b$), the spacing $L_{02}$ between the sidewall spacers SW1 and SW2 is small (i.e., $L_{02}<L_{01}$ is satisfied) with the scaling down of the semiconductor elements.

Figure 20A:
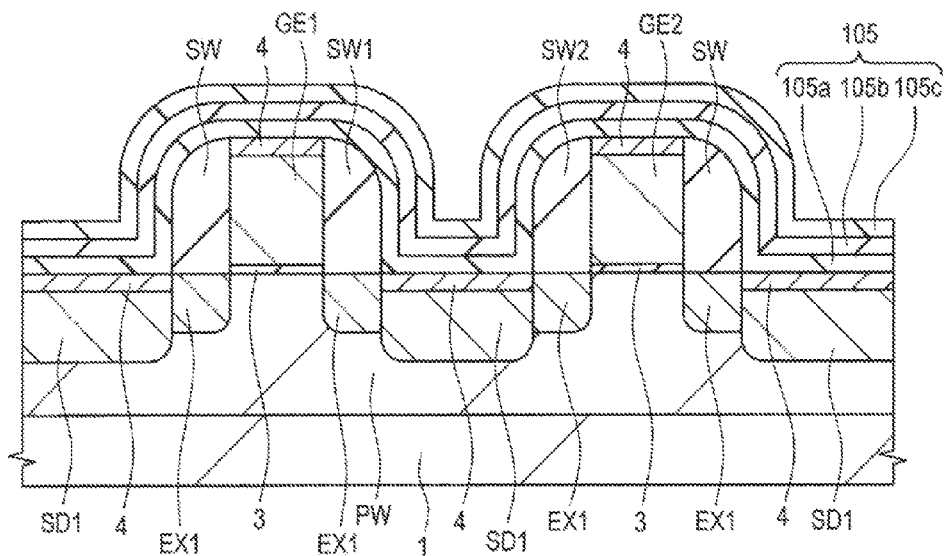
FIGS. 20(a) and 20(b) are main-portion cross-sectional views of the semiconductor device of the comparative example (second comparative example) in a manufacturing step thereof.
Figure 20B:
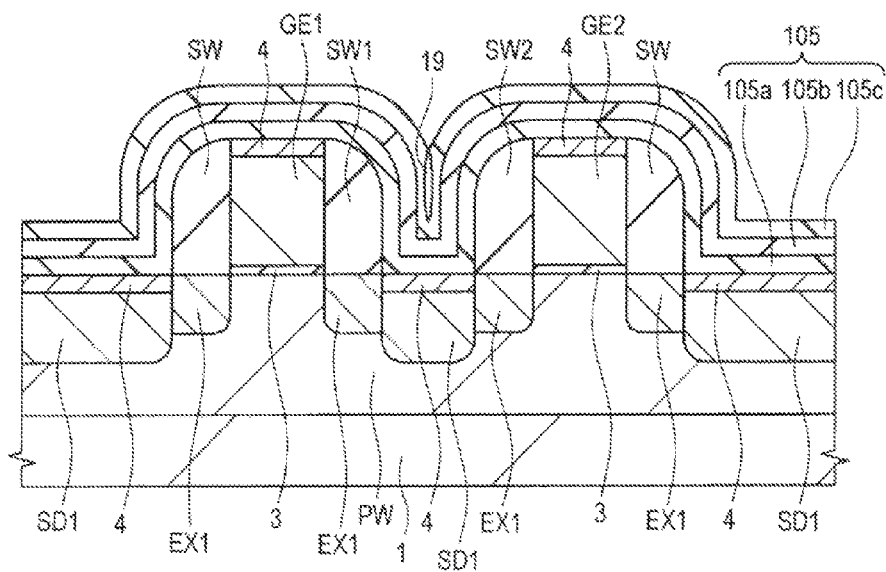

As in FIGS. 18($b$) and 19($b$), as the spacing between the adjacent gate electrodes GE1 and GE has decreased (i.e., the spacing between the sidewall spacers SW1 and SW2 has decreased), a crack 19 may develop in the silicon nitride film 105$c$ of the silicon nitride films 105$a$, 105$b$, and 105$c$ forming the silicon nitride film 105. FIGS. 20($a$) and 20($b$) show cross-sectional views at the same stage as that of FIGS. 19($a$) and 19($b$) in the second comparative example, of which FIG. 20($b$) schematically shows the state where the crack (cleft) 19 has developed in the silicon nitride film 105$c$.

The crack that has developed in the silicon nitride film in the first comparative example results from the large thickness of the silicon nitride film subjected to the UV irradiation. However, the crack 19 that has developed in the silicon nitride film 105$c$ in the second comparative example may develop even when the silicon nitride film 105$c$ is thin, and the cause of the development thereof is as follows.

That is, in the case of the cross sections of FIGS. 18($b$), 19($b$), and 20($b$), during the deposition of the silicon nitride film 105$c$, a portion that has grown from over the side surface 12$a$ of the sidewall spacer SW1 in a direction 17$a$ (the side surface 12$a$ and the direction 17$a$ are shown in FIG. 18($b$)) and a portion that has grown from over the side surface 12$b$ of the sidewall spacer SW2 in a direction 17$b$ are attached to each other so that an interface (corresponding to an interface 18 described later) is formed therebetween. The position where the interface is formed corresponds to the position where the crack 19 has developed in FIG. 20($b$). If the deposited silicon nitride film 105$c$ is subjected to the UV irradiation treatment, the crack (cleft) 19 develops along the interface.

When the crack 19 has developed in the silicon nitride film 105$c$, the crack 19 is also internally filled with a conductive material for forming the plugs PG and the plugs PG may be short-circuited via the conductive material filling the crack 19. In addition, when the crack 19 has developed in the silicon nitride film 105c, the silicon nitride film 105c becomes non-continuous and the tensile stress due to the silicon nitride film 105c may not be able to be obtained.

Figure 21:
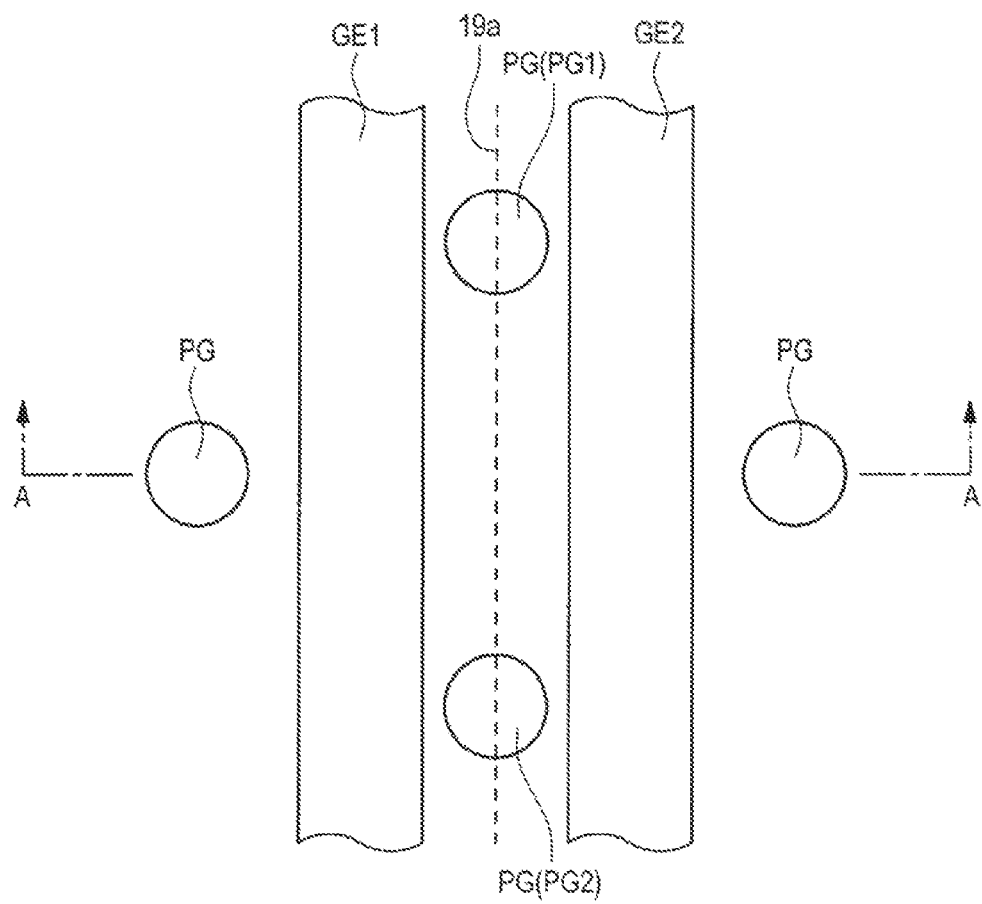
FIG. 21 is a plan view showing an example of a planar layout of a gate electrode.

Here, FIG. 21 is a plan view showing an example of a planar layout of the gate electrodes GE1 and GE2. FIG. 21 also shows an example of positions where the plugs PG are formed. Each of FIGS. 1 to 10, 12 to 16, and 18 to 20 described above corresponds to the cross-sectional view along the line A-A of FIG. 21. The crack 19 shown in FIG. 20(b) may develop at the position indicated by a dotted line 19a of FIG. 21. If the crack 19 is internally filled with the conductive material for forming the plugs PG, plugs PG1 and PG2 shown in FIG. 21 may be electrically short-circuited.

Selective Execution/Non-Execution of UV Irradiation Treatment on Silicon Nitride Film On the other hand, in the present embodiment, the silicon nitride film 5 is formed of the plural layers (which are the silicon nitride films 5a, 5b, and 5c herein). From this viewpoint, the present embodiment is the same as the second comparative example described above. However, in the present embodiment, not all of the plural layers (which are the silicon nitride films 5a, 5b, and 5c herein) forming the silicon nitride film 5 are subjected to the UV irradiation treatments; some of the plural layers are selectively subjected to the UV irradiation treatments while the others are not. Note that a UV irradiation treatment is a treatment for increasing the tensile stress of a silicon nitride film subjected to UV irradiation.

That is, in the present embodiment, the UV irradiation treatments are selectively executed or not executed by subjecting, to UV irradiation, those of the plural silicon nitride films forming the silicon nitride film 5 which are less likely to develop the foregoing crack 19 even under the UV irradiation to increase the tensile stresses thereof while not subjecting, to UV irradiation, those of the plural silicon nitride films forming the silicon nitride film 5 which are more likely to develop the foregoing crack 19 under the UV irradiation to prevent the development of the foregoing crack 19 therein. Specifically, of the plural silicon nitride films 5a, 5b, and 5c forming the silicon nitride film 5, the silicon nitride films 5a and 5b are less likely to develop the foregoing crack 19 even when subjected to the UV irradiation. Therefore, the silicon nitride films 5a and 5b are subjected to the UV irradiation after being deposited to have increased tensile stresses. On the other hand, of the plural silicon nitride films 5a, 5b, and 5c forming the silicon nitride film 5, the silicon nitride film 5c is more likely to develop the foregoing crack 19. Therefore, the silicon nitride film 5c is not subjected to UV irradiation so that the development of the foregoing crack 19 therein is prevented.

Figure 22:
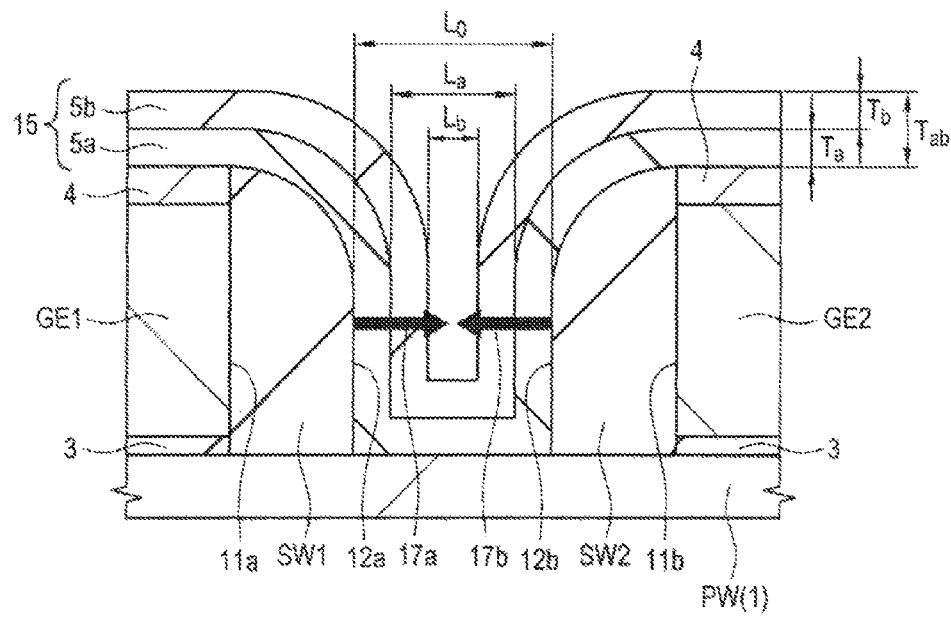
FIG. 22 is a main-portion cross-sectional view of the semiconductor device in a silicon nitride film forming step of Step S5.
Figure 23:
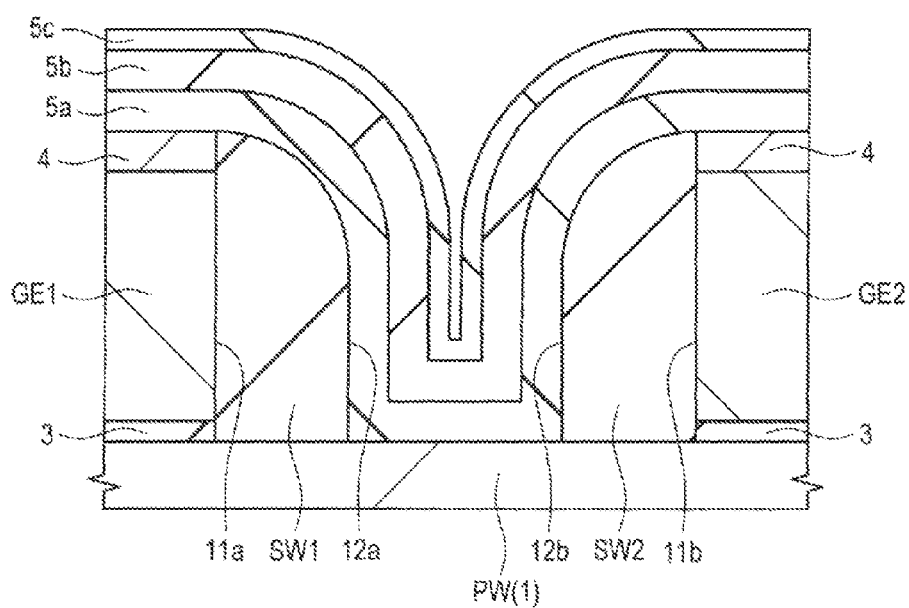
FIG. 23 is a main-portion cross-sectional view of the semiconductor device in the silicon nitride film forming step of Step S5, which is subsequent to FIG. 22.
Figure 24:
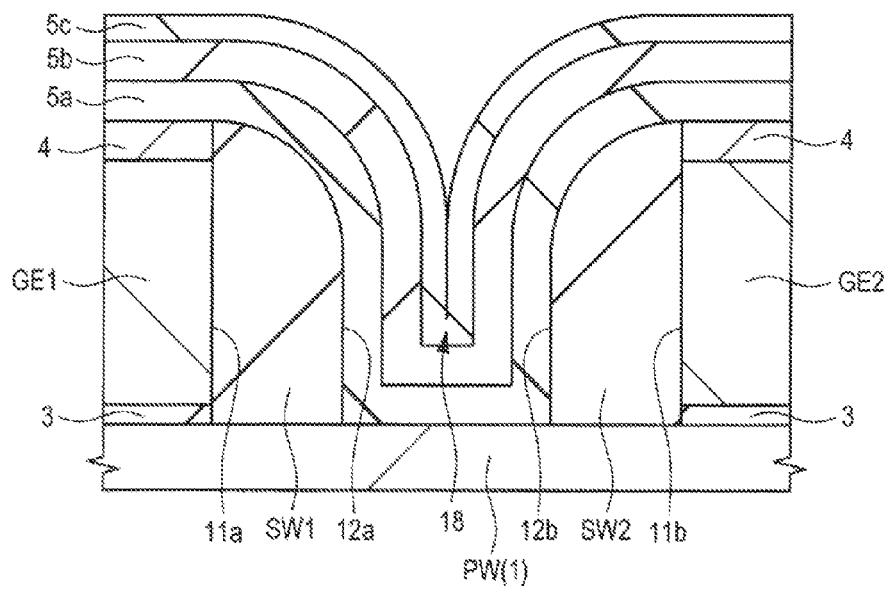
FIG. 24 is a main-portion cross-sectional view of the semiconductor device in the silicon nitride film forming step of Step S5, which is subsequent to FIG. 23.
Figure 25:
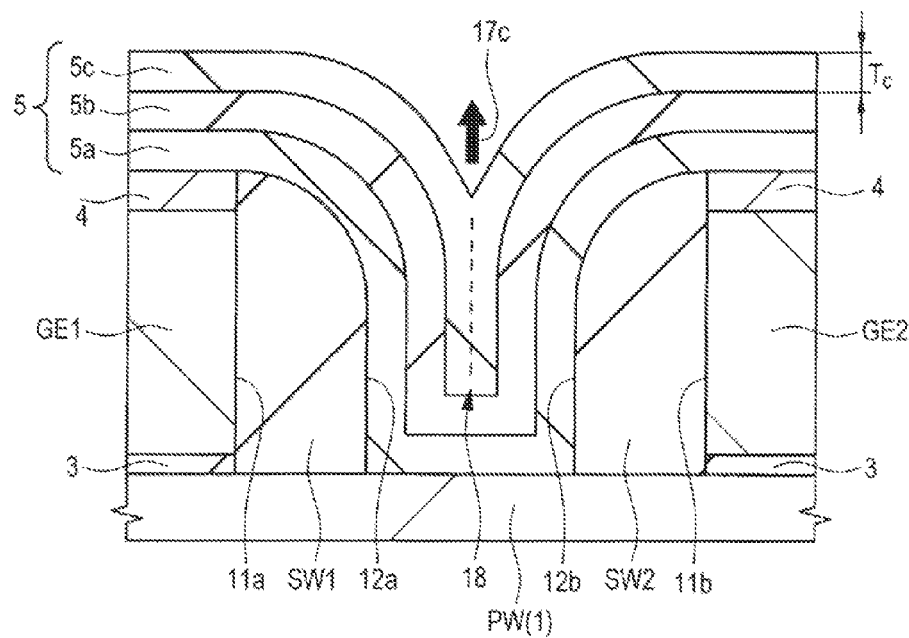
FIG. 25 is a main-portion cross-sectional view of the semiconductor device in the silicon nitride film forming step of Step S5, which is subsequent to FIG. 24.

The reason that, of the silicon nitride films 5a, 5b, and 5c, the silicon nitride film 5c is more likely to develop the foregoing crack 19 when subjected to the UV irradiation will be described with reference to FIGS. 22 to 25. FIGS. 22 to 25 are main-portion cross-sectional views of the semiconductor device in the step of forming the silicon nitride film 5c of Step S5 described above. FIG. 22 shows the same stage as that shown in FIG. 14 described above and corresponds to the partially enlarged view of FIG. 14 described above. FIG. 25 shows the same stage as that shown in FIG. 15 described above and corresponds to the partially enlarged view of FIG. 15 described above. That is, FIG. 22 shows the stage immediately before the start of the deposition of the silicon nitride film 5c, the deposition of the silicon nitride film 5c advances in the order illustrated in FIGS. 23 and 24, and FIG. 25 shows the stage at which the deposition of the silicon nitride film 5c is ended.

After performing Steps S1, S2, S3, and S4 described above to obtain the structure of FIG. 22 corresponding to FIG. 14 described above, the deposition of the silicon nitride film 5c by the plasma CVD method is started in Step S5 described above. As shown in FIG. 23, the deposition of the silicon nitride film 5c advances from the surface of the silicon nitride film 5b in a direction perpendicular to the surface.

At the stage of FIG. 23, the portion of the silicon nitride film 5c that has grown from over the side surface 12a of the sidewall spacer SW1 to the direction 17a (direction 17a is indicated by the arrow in FIG. 22) and the portion of the silicon nitride film 5c that has grown from over the side surface 12b of the sidewall spacer SW2 to the direction 17b (direction 17b is indicated by the arrow in FIG. 22) are still separate from (are not attached to) each other. However, as the deposition of the silicon nitride film 5c by the plasma CVD method further advances, as shown in FIG. 24, the portion of the silicon nitride film 5c that has grown from over the side surface 12a of the sidewall spacer SW1 to the foregoing direction 17a and the portion of the silicon nitride film 5c that has grown from over the side surface 12b of the sidewall spacer SW2 to the foregoing direction 17b are just attached to (come in contact with) each other so that the interface 18 is formed between the contact surfaces thereof. As the deposition of the silicon nitride film 5c by the plasma CVD method further advances, as shown in FIG. 25, the growth of the silicon nitride film 5c from over the side surface 12a of the sidewall spacer SW1 to the foregoing direction 17a and the growth of the silicon nitride film 5c from over the side surface 12b of the sidewall spacer SW2 to the foregoing direction 17b are no longer performed and the upward growth of the silicon nitride film 5c in a direction 17c advances, but the interface 18 is maintained in the silicon nitride film 5c. In FIG. 25, the interface 18 is shown by the dotted line.

Note that each of the directions 17a and 17b is a direction generally parallel with the main surface of the semiconductor substrate 1, but the direction 17a is a direction generally perpendicular to the side wall 11a of the gate electrode GE1 (or the side surface 12a of the sidewall spacer SW1) and extending from the side wall 11a of the gate electrode GE1 (or the side surface 12a of the sidewall spacer SW1) toward the gate electrode GE2. On the other hand, the direction 17b is a direction perpendicular to the side wall 11b of the gate electrode GE2 (or the side surface 12b of the sidewall spacer SW2) and extending from the side wall 11b of the gate electrode GE2 (or the side surface 12b of the sidewall spacer SW2) toward the gate electrode GE1. The side wall 11a of the gate electrode GE1 and the side wall 11b of the gate electrode GE2 are generally parallel with each other (the extending direction of the gate electrode GE1 and the extending direction of the gate electrode GE2 are generally parallel with each other so that the directions 17a and 17b are directions opposite to each other (180° opposite directions).

After the state of FIG. 25 is obtained, the deposition of the silicon nitride film 5c by the plasma CVD method is ended. Since the formed silicon nitride film 5c has the foregoing interface 18, if the deposited silicon nitride film 5c is subjected to a UV irradiation treatment, the foregoing crack 19 is likely to develop along the interface 18. That is, if the deposition of the silicon nitride film 5c is ended at the stage of FIG. 23, the foregoing interface 18 is not formed in the silicon nitride film 5c so that, even when the silicon nitride film 5c is subjected to a UV irradiation treatment, the foregoing crack 19 is less likely to develop. Instead, if the deposition of the silicon nitride film 5c is ended at the stage of FIG. 24 or FIG. 25, the foregoing interface 18 is formed in the silicon nitride film 5c so that, when the silicon nitride film 5c is subjected to a UV irradiation treatment, the foregoing crack 19 is more likely to develop. However, in the present embodiment, the silicon nitride film 5c is not subjected to any UV irradiation treatment after being deposited. Therefore, even when the silicon nitride film 5c has the interface 18, it is possible to suppress or prevent the development of the foregoing crack (cleft) 19 due to the interface 18. This allows the prevention of the development of the crack (cleft) in the silicon nitride film 5c.

When the deposition of the silicon nitride film 5c is ended at the stage of FIG. 23, $L_0/2 > T_{abc}$ is satisfied (accordingly, $L_b/2 > T_c$ is satisfied). By contrast, when the deposition of the silicon nitride film 5c is ended at the stage of FIG. 24, $L_0/2 = T_{abc}$ is satisfied (accordingly, $L_b/2 = T_c$ is satisfied) and, when the deposition of the silicon nitride film 5c is ended at the stage of FIG. 25, $L_0/2 < T_{abc}$ is satisfied (accordingly, $L_b/2 < T_c$ is satisfied). The foregoing expressions (5) and (7) are satisfied when the deposition of the silicon nitride film 5c has advanced to the stage of FIG. 24 or FIG. 25.

On the other hand, in the silicon nitride films 5a and 5b, no equivalents to the foregoing interface 18 are formed. That is, during the deposition of each of the silicon nitride films 5a and 5b, the portion thereof that has grown over from the side surface 12a of the sidewall spacer SW1 to the direction 17a and the portion thereof that has grown from over the side surface 12b of the sidewall spacer SW2 to the direction 17b are not attached to (do not come in contact with) each other, but are in a separate state when the deposition thereof is ended. Therefore, in the silicon nitride films 5a and 5b, no equivalents to the foregoing interface 18 are formed. Thus, in the silicon nitride films 5a and 5b, equivalents to the foregoing interface 18 serving as the start point of the foregoing crack 19 which is likely to develop during UV irradiation are not formed. Therefore, even when UV irradiation treatments are performed after the deposition of the silicon nitride films 5a and 5b, it is possible to prevent the development of the foregoing crack 19 in each of the silicon nitride films 5a and 5b. In addition, it is possible to increase the tensile stresses of the silicon nitride films 5a and 5b through the UV irradiation treatments, while preventing the development of the foregoing crack 19.

Thus, in the present embodiment, the silicon nitride films 5a and 5b in each of which the foregoing interface 18 is not formed and therefore a crack (cleft) is less likely to develop are subjected to post-deposition UV irradiation to have increased tensile stresses. On the other hand, the silicon nitride film 5c in which the foregoing interface 18 is formed and therefore a crack (cleft) is more likely to develop is not subjected to post-deposition UV irradiation so that a crack (cleft) therein is prevented. This can allow the tensile stress of the entire silicon nitride film 5 to be efficiently increased and prevent a crack (cleft) in the silicon nitride film 5. Accordingly, the tensile stress that can be exerted by the silicon nitride film 5 on the semiconductor substrate 1 (particularly the channel regions of the n-channel MISFETs) can properly and efficiently be improved. Therefore, it is possible to properly and efficiently improve the effect of improving the characteristics of the n-channel MISFETs achieved by forming the silicon nitride film 5 as the tensile stress film. In addition, the problem resulting from the development of a crack (cleft) in the silicon nitride film 5 can be prevented and a short circuit between the plugs PG resulting from, e.g., the filling of a crack (cleft) developed in the silicon nitride film 5 with the conductive material for the plugs PG can be prevented. As a result, it is possible to improve the reliability of the semiconductor device.

Variations

First Variation. In the present embodiment, the silicon nitride film for tensile stress which is subjected to the UV irradiation treatment after being deposited is formed in the two layers of the silicon nitride film 5a and the silicon nitride film 5b. However, in another form, the silicon nitride film for tensile stress which is subjected to the UV irradiation treatment after being deposited can also be formed in other numbers of layers, such as one layer or in three or more layers. A description will be given first to the case where the silicon nitride film for tensile stress which is subjected to the UV irradiation treatment after being deposited is formed in one layer (which will be referred to as a first variation).

Figure 26:
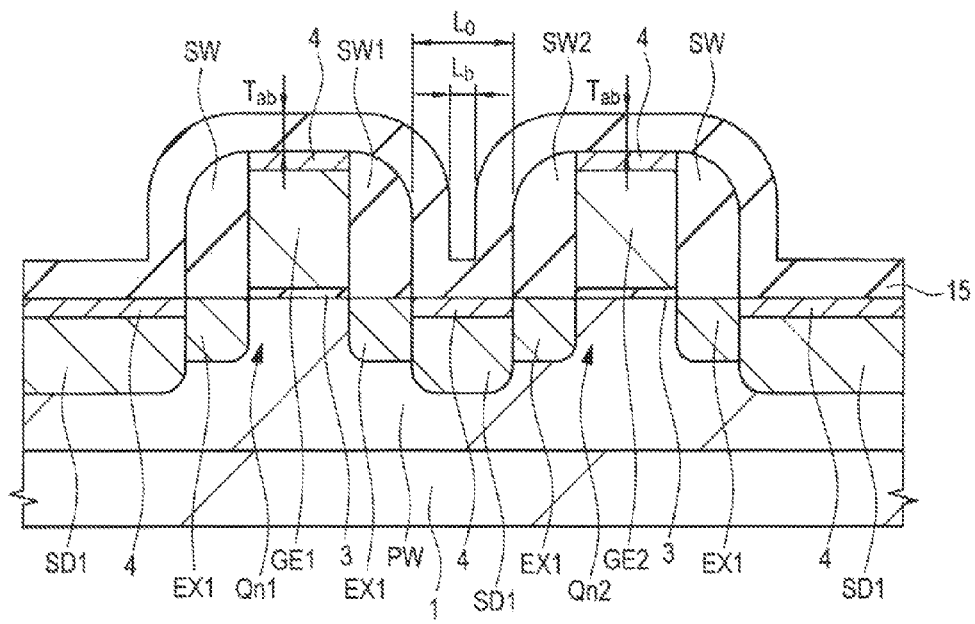
FIG. 26 is a main-portion cross-sectional view of a semiconductor device of a first variation in a manufacturing step thereof.
Figure 27:
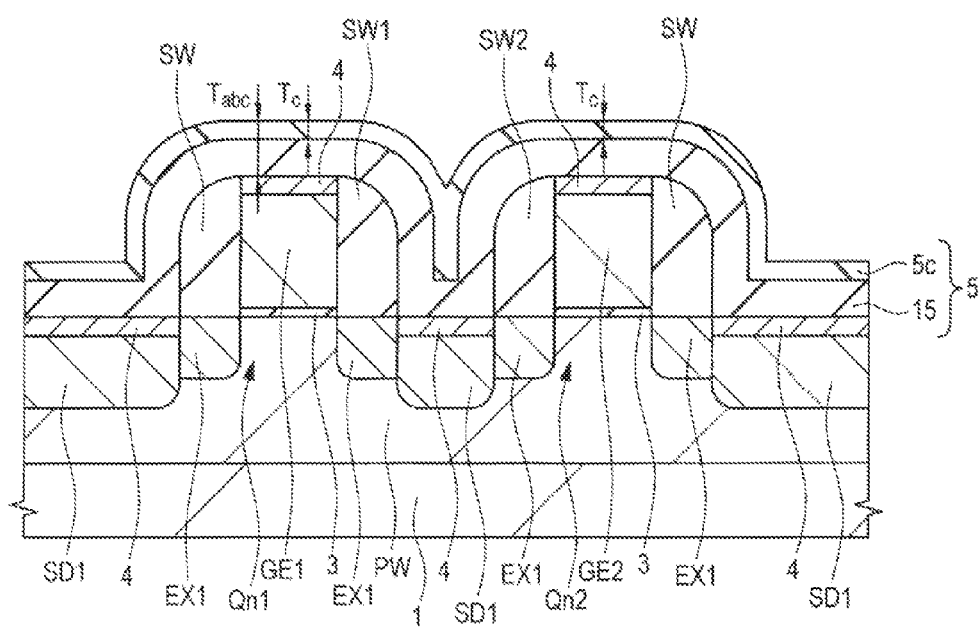
FIG. 27 is a main-portion cross-sectional view of the semiconductor device of the first variation in a manufacturing step thereof, which is subsequent to FIG. 26.

FIGS. 26 and 27 are main-portion cross-sectional views of a semiconductor device of the first variation in the manufacturing steps thereof. FIG. 26 shows the process stage corresponding to FIG. 14 described above. FIG. 27 shows the process stage corresponding to FIG. 15 described above. In FIGS. 26 and 27, a single silicon nitride film (first film) is deposited and then irradiated, and this is followed by the deposition of another silicon nitride film (second film). Another insulating film (third film) is deposited on top of the second film without first irradiating the second film.

The silicon nitride film 15, which is the laminate film of the foregoing silicon nitride film 5a and the foregoing silicon nitride film 5b in the case of FIG. 14 described above, is formed as a one-layer silicon nitride film in the case of the first variation of FIGS. 26 and 27. In this case, instead of Steps S1, S2, S3, and S4 described above, the process of forming the silicon nitride film 15 (silicon nitride film 15 as the tensile stress film) by a plasma CVD method and the step of subsequently subjecting the silicon nitride film 15 to a UV irradiation treatment (increasing the tensile stress of the silicon nitride film 15 through UV irradiation) are performed. The step of depositing the silicon nitride film 15 and the UV irradiation step which are performed in this case are basically the same as Steps S1 and S2 described above except that the thickness of the silicon nitride film is different so that a description thereof is omitted here. Thus, as shown in FIG. 26, the silicon nitride film 15 formed of the one-layer silicon nitride film is formed.

The film thickness of the silicon nitride film 15 is $T_{ab}$, and the relationship given by the foregoing expression (2) of $L_0/2 > T_{ab}$ is also established in the case of the first variation. The subsequent steps are the same as those of FIGS. 15 and 16 described above, and Step S5 (step of forming the silicon nitride film 5c) described above and Step S6 (step of forming the interlayer insulating film 6) described above are successively performed, while the silicon nitride film 5c is not subjected to any UV irradiation treatment. Note that, in FIG. 27, the stage (stage before the interlayer insulating film 6 is formed) where the silicon nitride film 5c is formed in Step S5 described above is shown. When the silicon nitride film 5c is formed, the relationship given by the foregoing expression (5) of $L_0/2 \leq T_{abc}$ (i.e., the relationship given by $L_0/2 \leq T_{abc} \leq T_{ab} + T_c$) is also established in the case of the first variation, and therefore the relationship given by the foregoing expression (7) of $L_b/2 \leq T_c$ is also established in the case of the first variation. However, in the case of FIGS. 12 to 16 described above, the spacing $L_b$ is the spacing (distance) between the silicon nitride film 5b over the side surface of the sidewall spacer SW1 and the silicon nitride film 5b over the side surface of the sidewall spacer SW2. By contrast, in the case of the first variation, the spacing $L_b$ is the spacing (distance) between the silicon nitride film 15 over the side surface of the sidewall spacer SW1 and the silicon nitride film 15 over the side surface of the sidewall spacer SW2.

Even when the silicon nitride film 15 for tensile stress which is subjected to the UV irradiation treatment is formed as the one-layer silicon nitride film, the silicon nitride film 15 in which a crack (cleft) is less likely to develop is subjected to post-deposition UV irradiation to have an increased tensile stress, while the silicon nitride film 5c in which the foregoing interface 18 is formed and therefore a crack (cleft) is more likely to develop is not subjected to the post-deposition UV irradiation so that a crack (cleft) in the silicon nitride film 5c is prevented. This can allow the tensile stress of the entire silicon nitride film 5 to be efficiently increased and prevent a crack (cleft) in the silicon nitride film 5. Accordingly, the tensile stress that can be exerted by the silicon nitride film 5 on the semiconductor substrate 1 (particularly the channel regions of the n-channel MISFETs) can properly and efficiently be improved. Therefore, it is possible to properly and efficiently improve the effect of improving the characteristics of the n-channel MISFETs achieved by forming the silicon nitride film 5 as the tensile stress film. In addition, the problem resulting from the development of a crack (cleft) in the silicon nitride film 5 can be prevented and, e.g., a short circuit between the plugs PG can be prevented. As a result, it is possible to improve the reliability of the semiconductor device.

However, the silicon nitride film 15 for tensile stress which is subjected to the UV irradiation treatment after being deposited is formed more preferably as a laminate film of silicon nitride films in two or more layers than as the one-layer silicon nitride film. This is because, if the silicon nitride film 15 for tensile stress which is subjected to the UV irradiation treatment after being deposited is formed as the laminate film of silicon nitride films in two or more layers, the thickness of each of the silicon nitride films can be reduced and therefore an amount of shrinkage when each of the silicon nitride films is subjected to the UV irradiation treatment performed after the deposition thereof can be reduced to allow more reliable prevention of the development of a crack in each of the silicon nitride films.

Figure 28:
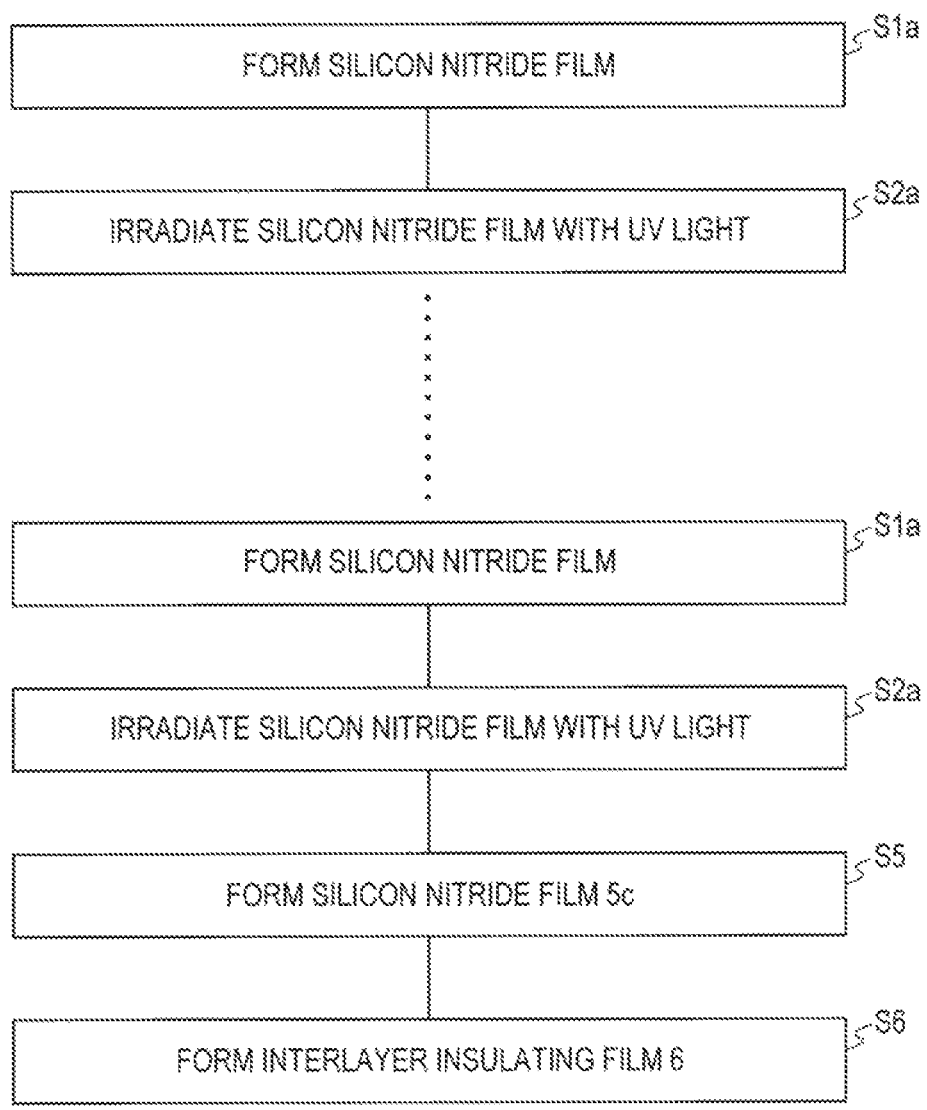
FIG. 28 is a process flow chart showing the detail of the step of forming a silicon nitride film as a tensile stress film in a second variation.

Second Variation. Next, a description will be given to the case where the silicon nitride film for tensile stress which is subjected to the UV irradiation treatment after being deposited is formed in three or more layers (which will be referred to as a second variation). FIG. 28 is a process flow chart showing the detail of the step of forming the silicon nitride film 5 as the tensile stress film in the second variation, which corresponds to FIG. 11 described above.

The silicon nitride film 15, which is the laminate film of the foregoing silicon nitride film 5a and the foregoing silicon nitride film 5b in the case of FIG. 14 described above, is formed as an n-layer (where n is an integer of 3 or more) silicon nitride film in the case of the second variation. In this case, instead of Steps S1, S2, S3, and S4 described above, as shown in FIG. 28, Step S1a which is the step of forming a silicon nitride film as a tensile stress film by a plasma CVD method and Step S2a which is the step of subjecting the silicon nitride film deposited in Step S1a to a UV irradiation treatment (increasing the tensile stress of the silicon nitride film through UV irradiation) are performed in one cycle, and the total of n cycles are repeatedly performed (the flow of FIG. 11 described above corresponds to the case where two cycles are repeatedly performed). The step of depositing the silicon nitride film of Step S1a and the UV irradiation step of Step S2a (i.e., the foregoing one cycle) which are performed in this case are basically the same as Steps S1 and S2 described above so that a description thereof is omitted. Thus, the foregoing silicon nitride film 15 formed of the laminate film of silicon nitride films in n layers is formed. In the case of the second variation also, the film thickness of the silicon nitride film 15 is the foregoing film thickness $T_{ab}$, and the relationship given by the foregoing expression (2) of $L_0/2 > T_{ab}$ is also established in the case of the second variation. The subsequent steps are the same as the steps of FIGS. 15 and 16 described above, and Step S5 (step of forming the silicon nitride film 5c over the silicon nitride film 15) described above and Step S6 (step of forming the interlayer insulating film 6 over the silicon nitride film 5) described above are successively performed, while the silicon nitride film 5c is not subjected to any UV irradiation treatment.

When the silicon nitride film 5c is formed in Step S5, the relationship given by the foregoing expression (5) of $L_0/2 \leq T_{abc}$ (i.e., the relationship given by $L_0/2 \leq T_{abc} = T_{ab} + T_c$) is also established in the case of the second variation, and therefore the relationship given by the foregoing expression (7) of $L_b/2 \leq T_c$ is also established in the case of the second variation. However, in the case of FIGS. 12 to 16 described above, the spacing $L_b$ is the spacing (distance) between the silicon nitride film 5b over the side surface of the sidewall spacer SW1 and the silicon nitride film 5b over the side surface of the sidewall spacer SW2. By contrast, in the case of the second variation, the spacing $L_b$ is the spacing (distance) between the silicon nitride film 15 over the side surface of the sidewall spacer SW1 and the silicon nitride film 15 over the side surface of the sidewall spacer SW2.

Figure 29:
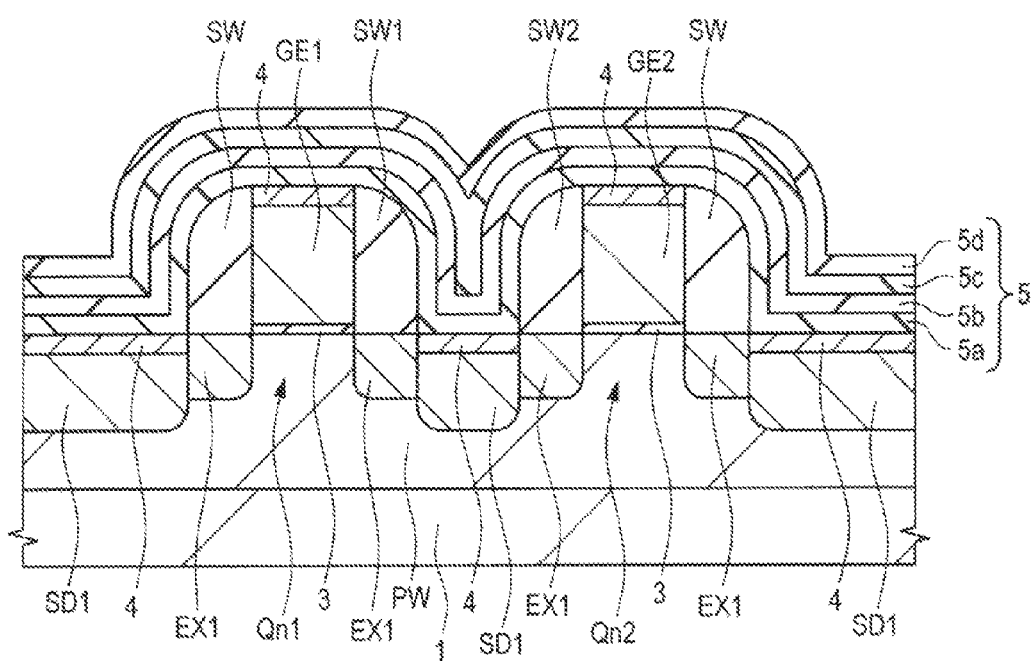
FIG. 29 is a main-portion cross-sectional view of a semiconductor device of a third variation in a manufacturing step thereof.
Figure 30:
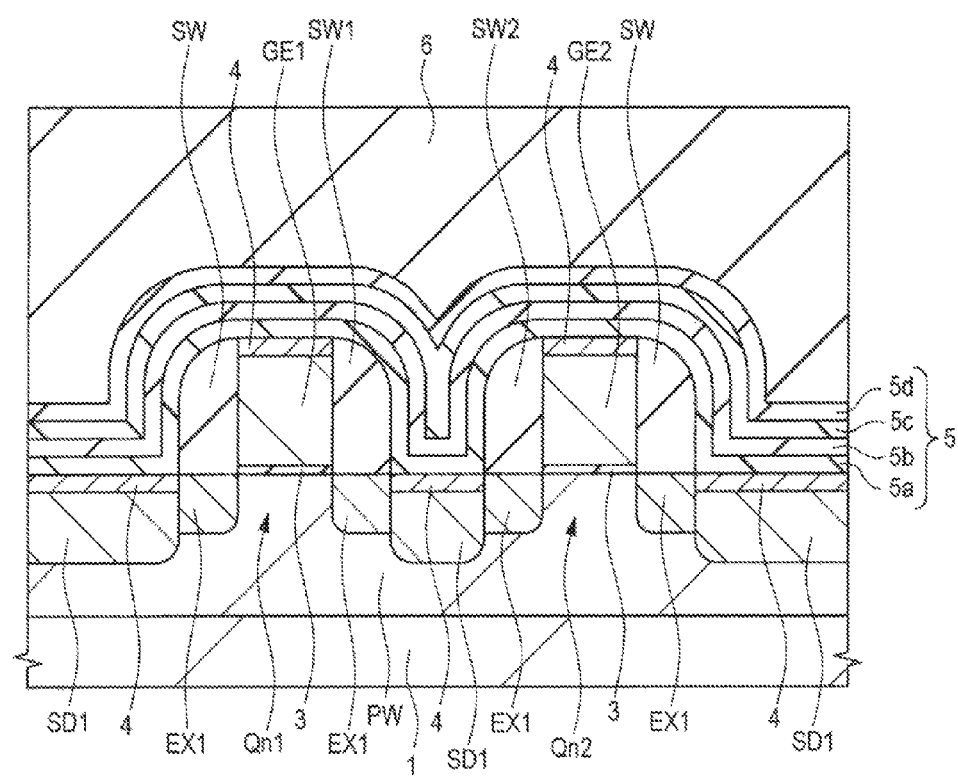
FIG. 30 is a main-portion cross-sectional view of the semiconductor device of the third variation in a manufacturing step thereof, which is subsequent to FIG. 29.

Third Variation. FIGS. 29 and 30 are main-portion cross-sectional views of a semiconductor device of a third variation in the manufacturing steps thereof.

After the silicon nitride film 5c is formed in Step S5 described above to obtain the structure of FIG. 15 described above, in the third embodiment, as shown in FIG. 29, an additional silicon nitride film 5d is further formed over the silicon nitride film 5c. Then, as shown in FIG. 30, in Step S6 described above, the interlayer insulating film 6 is formed over the additional silicon nitride film 5d.

In the case of the third variation, the additional silicon nitride film 5d formed over the silicon nitride film 5c can be formed in the same manner as the silicon nitride film 5c and can function as the tensile stress film, similarly to the silicon nitride film 5c. In the third variation, the silicon nitride film 5 as the tensile stress film is formed as a laminate film of the silicon nitride films 5a, 5b, 5c, and 5d but, while the silicon nitride films 5a and 5b are subjected to UV irradiation treatments after being deposited, the silicon nitride films 5c and 5d are not subjected to any UV irradiation treatment. That is, in the same manner as with the silicon nitride film 5c, the additional silicon nitride film 5d is also kept from being subjected to a UV irradiation treatment and, after the deposition of the additional silicon nitride film 5d, the interlayer insulating film 6 is formed without performing any UV irradiation treatment. When the additional silicon nitride film 5d is formed of a plurality of silicon nitride films, none of the silicon nitride films forming the silicon nitride film 5d is subjected to a UV irradiation treatment. Thus, a hydrogen content of the first insulating film formed by films 5a, 5b will be lower than a hydrogen content of the additional insulating film 5d, while a tensile stress of the first insulating film formed by films 5a, 5b will be greater than a tensile stress of the additional insulating film 5d.

Note that, in the case of the third variation, the silicon nitride film 5d is formed over the silicon nitride film 5c. However, the manufacturing process does not perform a UV irradiation treatment either after the deposition of the silicon nitride film 5c or after the deposition of the silicon nitride film 5d, and moves to the step of forming the interlayer insulating film 6. Therefore, rather than forming the silicon nitride film 5c and then further forming the silicon nitride film 5d over the silicon nitride film 5c as in the third variation, it is more advantageous in terms of reducing the number of steps and a manufacturing time to accordingly increase the thickness of the silicon nitride film 5c (to the same level as that of the total thickness of the silicon nitride films 5c and 5d of FIG. 29) and form the interlayer insulating film 6 without forming another silicon nitride film over the silicon nitride film 5c as in FIG. 16 described above.

Figure 31:
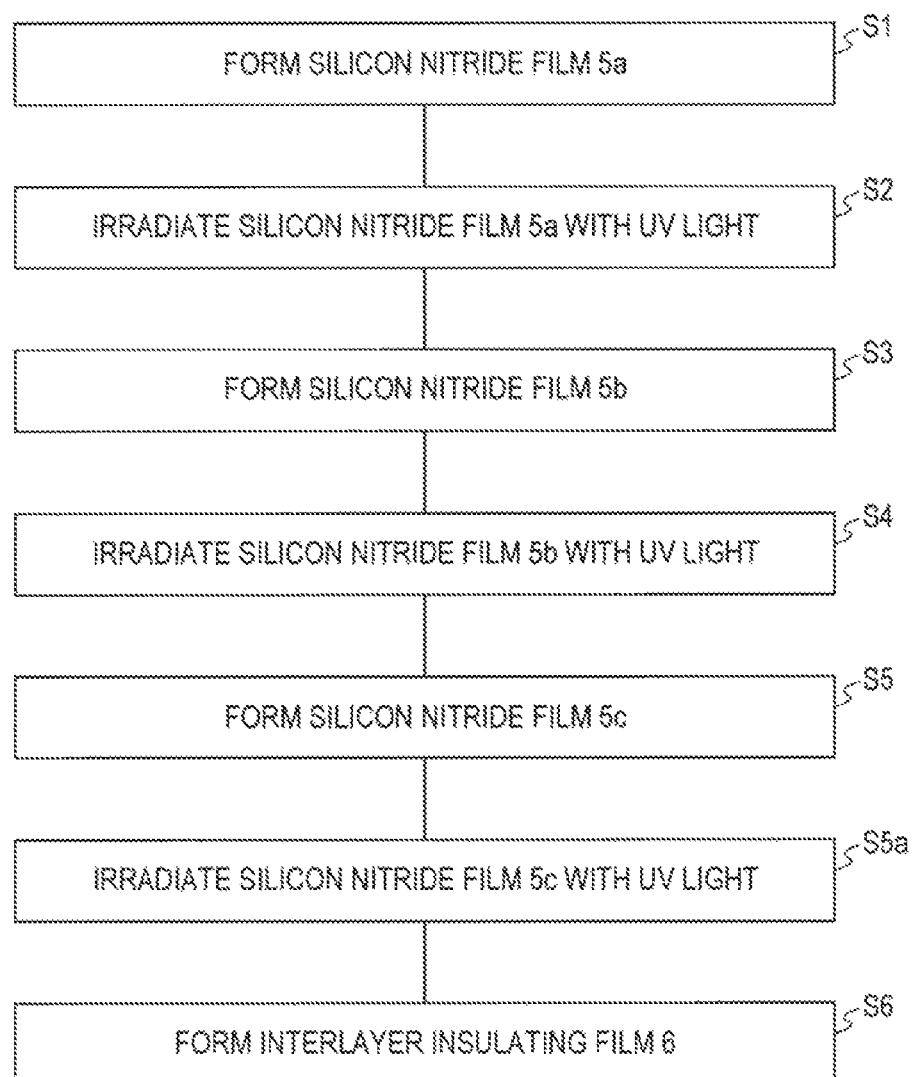
FIG. 31 is a process flow chart showing the detail of the step of forming a silicon nitride film as a tensile stress film in a fourth variation.

Fourth Variation. In the present embodiment, the silicon nitride film 5c is not subjected to any UV irradiation treatment. However, in another form, the silicon nitride film 5c that has been formed in Step S5 can also be subjected to a UV irradiation treatment (which will be referred to as a fourth variation). FIG. 31 is a process flow chart showing the detail of the step of forming the silicon nitride film 5 as the tensile stress film in the fourth variation, which corresponds to FIG. 11 described above.

In the case of the fourth variation, the silicon nitride film 5c is formed by a plasma CVD method in Step S5 and then subjected to ultraviolet irradiation (Step S5a of FIG. 31). Thereafter, in Step S6, the interlayer insulating film 6 is formed over the silicon nitride film 5c. The process flow of FIG. 31 in the fourth variation is the same as the process flow of FIG. 11 described above except that Step S5a has been added. The illuminance of ultraviolet light in a UV irradiation treatment performed on the silicon nitride film 5c (illuminance of the ultraviolet light with which the silicon nitride film 5c is irradiated) in Step S5a is set less (lower) than the illuminance of ultraviolet light in the UV irradiation treatment in each of Steps S2 and S4 (the illuminance of the ultraviolet light with which the silicon nitride film 5a is irradiated in Step S2 and the illuminance of the ultraviolet light with which the silicon nitride film 5b is irradiated in Step S4).

In the fourth variation, the UV irradiation treatment at the illuminance lower than in each of Steps S2 and S4 is performed on the silicon nitride film 5c in Step S5a to allow an increase in the tensile stress of the silicon nitride film 5c, while suppressing the development of the foregoing crack 19 resulting from the foregoing interface 18. In addition, in the fourth variation, the UV irradiation treatment at the illuminance higher than that in the UV irradiation treatment of Step S5a is performed on each of the silicon nitride films 5a and 5b in each of Steps S2 and S4 to allow proper and efficient increases in the tensile stresses of the silicon nitride films 5a and 5b. Therefore, in terms of maximizing the tensile stress of the entire silicon nitride film 5, it is rather advantageous to form the silicon nitride film 5c in Step S5 and then subject the silicon nitride film 5c to the UV irradiation treatment at the illuminance lower than in each of Steps S2 and S4, as in the fourth variation. On the other hand, in terms of maximally suppressing or preventing the development of the foregoing crack 19, it is rather advantageous not to perform any UV irradiation treatment on the silicon nitride film 5c, as in the foregoing embodiment.

Here, a UV irradiation treatment is a treatment for increasing the tensile stress of a target silicon nitride film (corresponding to the silicon nitride film 5a in Step S2 and to the silicon nitride film 5b in Step S4). Therefore, if the fourth variation is viewed from another viewpoint, it can be said that conditions for the treatment for increasing the tensile stress of the silicon nitride film (corresponding to the silicon nitride film 5a in Step S2 and to the silicon nitride film 5b in Step S4) in each of Steps S2 and S4 are different from conditions for the treatment for increasing the tensile stress of the silicon nitride film 5c in Step S5a. More specifically, it can be said that the treatment for increasing the tensile stress of the silicon nitride film 5c in Step S5a has a tensile stress increasing function smaller than that of the treatment for increasing the tensile stress of the silicon nitride film (corresponding to the silicon nitride film 5a in Step S2 and to the silicon nitride film 5b in Step S4) in each of Steps S2 and S4. That is, an amount of the increase in the tensile stress of the target nitride film 5c in Step S5a is smaller than an amount of the increase in the tensile stress of the target nitride film (corresponding to the silicon nitride film 5a in Step S2 and to the silicon nitride film 5b in Step S4) in each of Steps S2 and S4.

It is also possible to combine the individual first to fourth variations.

Substitute for UV Irradiation Treatment

In each of Steps S2, S4, S2a, and S5a, the UV irradiation treatment has been performed, and the UV irradiation treatment is a treatment for increasing the tensile stress of the target silicon nitride film (corresponding to the silicon nitride film 5a in Step S2 and to the silicon nitride film 5b in Step S4) to be subjected to ultraviolet irradiation. As the treatment for increasing the tensile stress, the UV irradiation treatment is most preferred but, besides this, an electron beam irradiation treatment, a microwave irradiation treatment, or a heat treatment may also be performed. Therefore, in another form (variation), instead of the UV irradiation treatment (UV irradiation treatment in each of Steps S2, S4, S2a, and S5a), an electron beam irradiation treatment, a microwave irradiation treatment, or a heat treatment can also be performed to thereby allow an increase in the tensile stress of the target silicon nitride film (corresponding to, e.g., the silicon nitride film 5a in Step S2 and to the silicon nitride film 5b in Step S4).

An electron beam irradiation treatment is a treatment which irradiates the target silicon nitride film (corresponding to the silicon nitride film 5a in Step S2, to the silicon nitride film 5b in Step S4, and to the silicon nitride film 5c in Step S5a) with an electron beam. A microwave irradiation treatment is a treatment which irradiates the target silicon nitride film (corresponding to the silicon nitride film 5a in Step S2, to the silicon nitride film 5b in Step S4, and to the silicon nitride film 5c in Step S5a) with a microwave. A heat treatment is a treatment which heats the target silicon nitride film (corresponding to the silicon nitride film 5a in Step S2, to the silicon nitride film 5b in Step S4, and to the silicon nitride film 5c in Step S5a) (which is actually heated together with the semiconductor substrate 1).

A UV irradiation treatment, an electron beam irradiation treatment, a microwave irradiation treatment, or a heat treatment performed as the treatment for increasing the tensile stress is performed under treatment conditions such that the tensile stress of the target silicon nitride film (corresponding to the silicon nitride film 5a in Step S2 and to the silicon nitride film 5b in Step S4) is larger after the treatment than before the treatment.

Of a UV irradiation treatment, an electron beam irradiation treatment, a microwave irradiation treatment, and a heat treatment, the UV irradiation treatment has the largest tensile stress increasing effect. Therefore, in terms of the tensile stress increasing effect, simplifying the manufacturing process, and the like, the UV irradiation treatment is most preferred as the treatment for increasing the tensile stress (the treatment for increasing the tensile stress performed in each of Steps S2 and S4).

On the other hand, the foregoing silicon nitride film 5c, which is not subjected to any UV irradiation treatment, is not subjected to a treatment for increasing the tensile stress (treatment for increasing the tensile stress of the silicon nitride film 5c by a UV irradiation treatment, an electron beam irradiation treatment, a microwave irradiation treatment, or a heat treatment) after being deposited (though the treatment for increasing the tensile stress is performed in the case of the foregoing fourth variation).

In the fourth variation of FIG. 31 described above, when an electron beam irradiation treatment is performed instead of the UV irradiation treatment in each of Steps S2, S4, and S5a, the illuminance (illuminance of an electron beam) in the electron beam irradiation treatment performed in Step S5a is set less (lower) than the illuminance (illuminance of an electron beam) in the electron beam irradiation treatment performed in each of Steps S2 and S4. Also, in the fourth variation of FIG. 31 described above, when a microwave irradiation treatment is performed instead of the UV irradiation treatment in each of Steps S2, S4, and S5a, the power (power of a microwave) in the microwave irradiation treatment performed in Step S5a is set less (lower) than the power (power of a microwave) in the microwave irradiation treatment performed in each of Steps S2 and S4. Also, in the fourth embodiment of FIG. 31 described above, when a heat treatment is performed instead of the UV irradiation treatment in each of Steps S2, S4, and S5a, the temperature (heat treatment temperature) in the heat treatment performed in Step S5a is set lower than the temperature (heat treatment temperature) in the heat treatment performed in each of Steps S2 and S4.

Manufactured Semiconductor Device

In the present embodiment, the UV irradiation treatment is performed as the treatment for further increasing the tensile stress of the silicon nitride film deposited as the tensile stress film. A conceivable reason for the increased tensile stress of the silicon nitride film resulting from the UV irradiation treatment may be that hydrogen in the silicon nitride film desorbs under UV irradiation to shrink the silicon nitride film and change the bond angle between Si (silicon) and N (nitrogen) in the silicon nitride film, thereby increasing the tensile stress of the silicon nitride film. Therefore, it can be said that a hydrogen content rate (the density of Si—H bonds) in a silicon nitride film deposited as the tensile stress film by a plasma CVD method is lower when the deposited silicon nitride film is subjected to a UV irradiation treatment than when the deposited silicon nitride film is not subjected to any UV irradiation treatment. When a comparison is made between the hydrogen content rates before and after UV irradiation, the hydrogen content rate (hydrogen content) in the silicon nitride film after the UV irradiation is approximately ⅓ or less of the hydrogen content rate (hydrogen content) in the silicon nitride film before the UV irradiation. For example, the hydrogen content which is about $13 \times 10^{21}$ atoms/cm$^3$ before the UV irradiation becomes about $3 \times 10^{21}$ atoms/cm$^3$ after the UV irradiation (in this case, the hydrogen content after the UV irradiation is 3/13 of the hydrogen content before the UV irradiation).

That is, by depositing the silicon nitride film as the tensile stress film by the plasma CVD method and desorbing hydrogen in the silicon nitride film therefrom by the UV irradiation treatment to reduce the hydrogen content rate (hydrogen content) in the silicon nitride film, the tensile stress of the silicon nitride film can be increased. As a result, the manufactured semiconductor device has the silicon nitride film 5 as the tensile stress film but, of the plural silicon nitride films 5a, 5b, and 5c forming the silicon nitride film 5, the hydrogen content rate (hydrogen content) of each of the silicon nitride films 5a and 5b that have been subjected to the UV irradiation treatments is lower than the hydrogen content rate (hydrogen content) of the silicon nitride film 5c that has not been subjected to any UV irradiation treatment. That is, in the semiconductor device having the silicon nitride film 5 formed of the laminate film of the silicon nitride films 5a, 5b, and 5c which satisfy the relationships given by the foregoing expressions (1) to (7), the hydrogen content rate (hydrogen content) of each of the silicon nitride films 5a and 5b is lower than the hydrogen content rate (hydrogen content) of the silicon nitride film 5c. Accordingly, the silicon nitride film 5c having a high hydrogen content rate (hydrogen content) is small in the amount of compression thereof so that the development of the foregoing crack 19 in the silicon nitride film 5c can be prevented. On the other hand, each of the silicon nitride films 5a and 5b having a low hydrogen content rate (hydrogen content) is large in the amount of compression thereof so that the tensile stress of the silicon nitride film 5 can efficiently be increased. Therefore, it is possible to improve the performance of the semiconductor device having the n-channel MISFETs.

As described above, when a comparison is made between the hydrogen content rates before and after the UV irradiation, the hydrogen content rate (hydrogen content) in the silicon nitride film after the UV irradiation is approximately ⅓ or less of the hydrogen content rate (hydrogen content) in the silicon nitride film before the UV irradiation. Accordingly, in the manufactured semiconductor device, the hydrogen content rate (hydrogen content) in each of the silicon nitride films 5a and 5b is approximately ⅓ or less of the hydrogen content rate (hydrogen content) of the silicon nitride film 5c.

Note that, in the case of the foregoing first variation, in the manufactured semiconductor device, the hydrogen content rate (hydrogen content) in the silicon nitride film 15 (having layers 5a and 5b) is lower than (more specifically approximately ⅓ or less of) the hydrogen content rate (hydrogen content) of the silicon nitride film 5c. In the case of the foregoing second variation, in the manufactured semiconductor device, the hydrogen content rate (hydrogen content) in each of the n-layer silicon nitride films forming the silicon nitride film 15 is lower than (more specifically approximately ⅓ or less of) the hydrogen content rate (hydrogen content) of the silicon nitride film 5c. In the case of the foregoing third variation, in the manufactured semiconductor device, the hydrogen content rate (hydrogen content) in each of the silicon nitride films 5a and 5b forming the silicon nitride film 15 is lower than (more specifically approximately ⅓ or less of) the hydrogen content rate (hydrogen content) of each of the silicon nitride films 5c and 5d.

The tensile stress of the silicon nitride film 15 that has been subjected to the UV irradiation treatment as the treatment for increasing the tensile stress is larger than the tensile stress of the silicon nitride film 5c that has not been subjected to the UV irradiation treatment, and the magnitude relationship therebetween is also maintained in the manufactured semiconductor device.

In the case where the silicon nitride film 15 is formed of a single-layer silicon nitride film as shown in FIGS. 26 and 27 described above, in the manufactured semiconductor device, the hydrogen content rate (hydrogen content) of the silicon nitride film 15 is lower than the hydrogen content rate (hydrogen content) of the silicon nitride film 5c. Also, in the case where the silicon nitride film 15 is formed of a plurality of silicon nitride films (which are the silicon nitride films 5a and 5b herein) as shown in FIGS. 12 to 16 described above, in the manufactured semiconductor device, the hydrogen content rate (hydrogen content) of each of the silicon nitride films (which are the silicon nitride films 5a and 5b herein) forming the silicon nitride film 15 is lower than the hydrogen content rate (hydrogen content) of the silicon nitride film 5c.

Second Embodiment

In the second embodiment, a description will be given to the case where the technique described above is applied to a CMISFET (Complementary Metal Insulator Semiconductor Field Effect Transistor).

FIGS. 32 to 39 are main-portion cross-sectional views of a semiconductor device of the second embodiment, which is a semiconductor device having a CMISFET here, in the manufacturing steps thereof.

Figure 32:
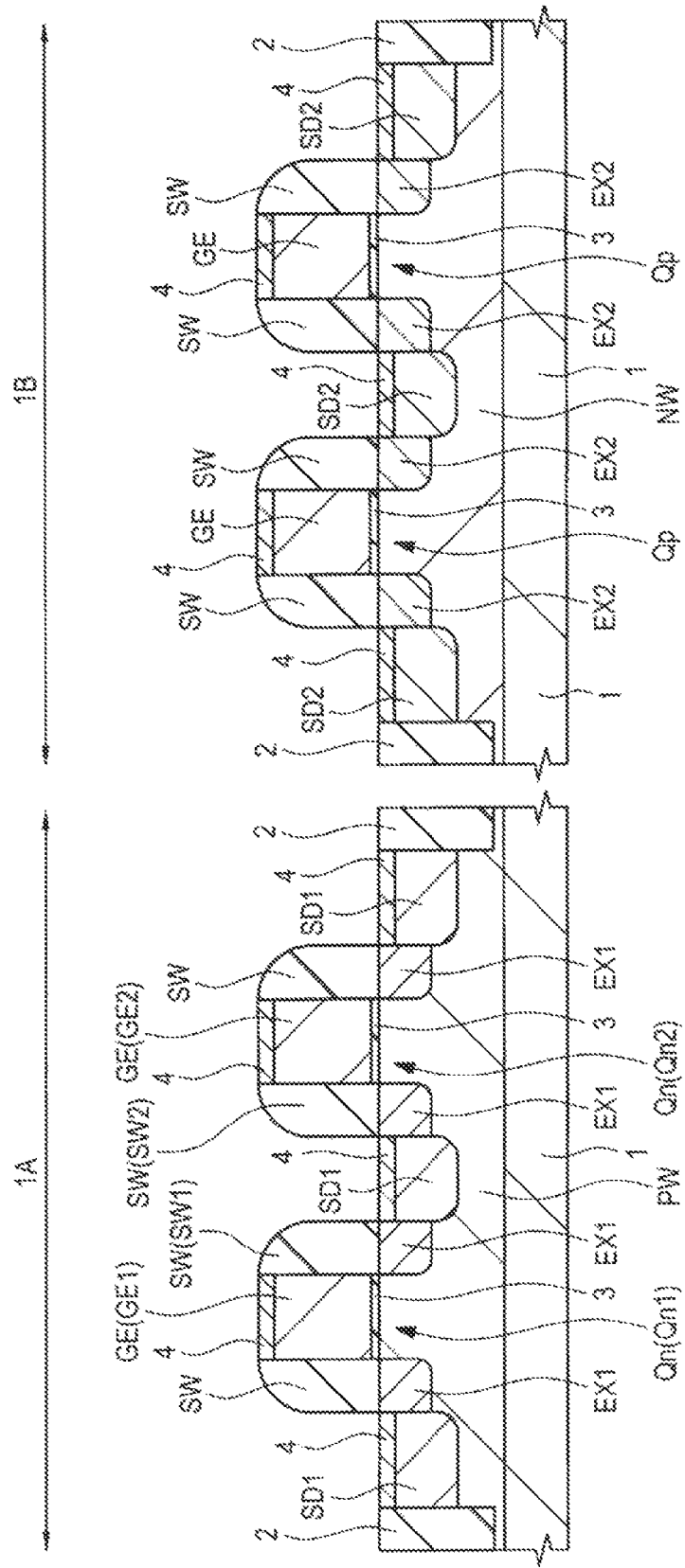
FIG. 32 is a main-portion cross-sectional view of a semiconductor device as another embodiment of the present invention in a manufacturing step thereof.

As shown in FIG. 32, the semiconductor substrate 1 in which the semiconductor device of the present embodiment is formed has an nMIS formation region 1A which is a region where n-channel MISFETs are formed and a pMIS formation region 1B which is a region where p-channel MISFETs are formed. Thus, the nMIS formation region 1A and the pMIS formation region 1B in FIG. 32 are different planar regions of the same semiconductor substrate 1. In the nMIS formation region 1A, a structure corresponding to FIG. 6 described above is formed by performing the same steps as in FIGS. 1 to 6 described above. The steps of forming the re-channel MISFETs Qn are basically the same as already described above in the first embodiment. On the other hand, in the pMIS formation region 1B, p-channel MISFETs Qp are formed by performing steps (steps in which the conductivity types of ion-implanted impurities are inverted) similar to those of FIGS. 1 to 6 described above.

The following is a brief description of the manufacturing steps. After isolation regions 2 are formed in the semiconductor substrate 1, a p-type impurity is ion-implanted into the nMIS formation region 1A to form a p-type well PW, while an n-type impurity ion is ion-implanted into the pMIS formation region 1B to form an n-type well NW. Then, a gate insulating film 3 and gate electrodes GE are formed in each of the nMIS formation region 1A and the pMIS formation region 1B. Then, an n-type impurity is ion-implanted into each of the regions of the p-type well PW located on both sides of the gate electrodes GE to form n$^-$-type semiconductor regions (extension regions) EX1 in the nMIS formation region 1A, while a p-type impurity is ion-implanted into each of the regions of the n-type well NW located on both sides of the gate electrodes GE to form p$^-$-type semiconductor regions (extension regions) EX2 in the pMIS formation region 1B. Then, sidewall spacers SW are formed over the side walls of the gate electrodes GE of the nMIS formation region 1A and over the side walls of the gate electrodes GE of the pMIS formation region 1B. Then, an n-type impurity is ion-implanted into each of the regions of the p-type well PW located on both sides of the gate electrodes GE and the sidewall spacers SW to form n$^+$-type semiconductor regions SD1 (source/drain regions) in the nMIS formation region 1A, while a p-type impurity is ion-implanted into the regions of the n-type well NW located on both sides of the gate electrodes GE of the n-type well NW and the sidewall spacers SW to form p$^+$-type semiconductor regions SD2 (source/drain regions) in the pMIS formation region 1B. Thereafter, using a salicide technique, metal silicide layers 4 are formed over (in the upper-layer portions of) the gate electrodes GE and the source/drain regions (n$^+$-type semiconductor regions SD1) of the n-channel MISFETs Qn in the nMIS formation region 1A and over (in the upper-layer portions of) the gate electrodes GE and the source/drain regions (p$^+$-type semiconductor regions SD2) of the p-channel MISFETs Qp in the pMIS formation region 1B.

Figure 33:
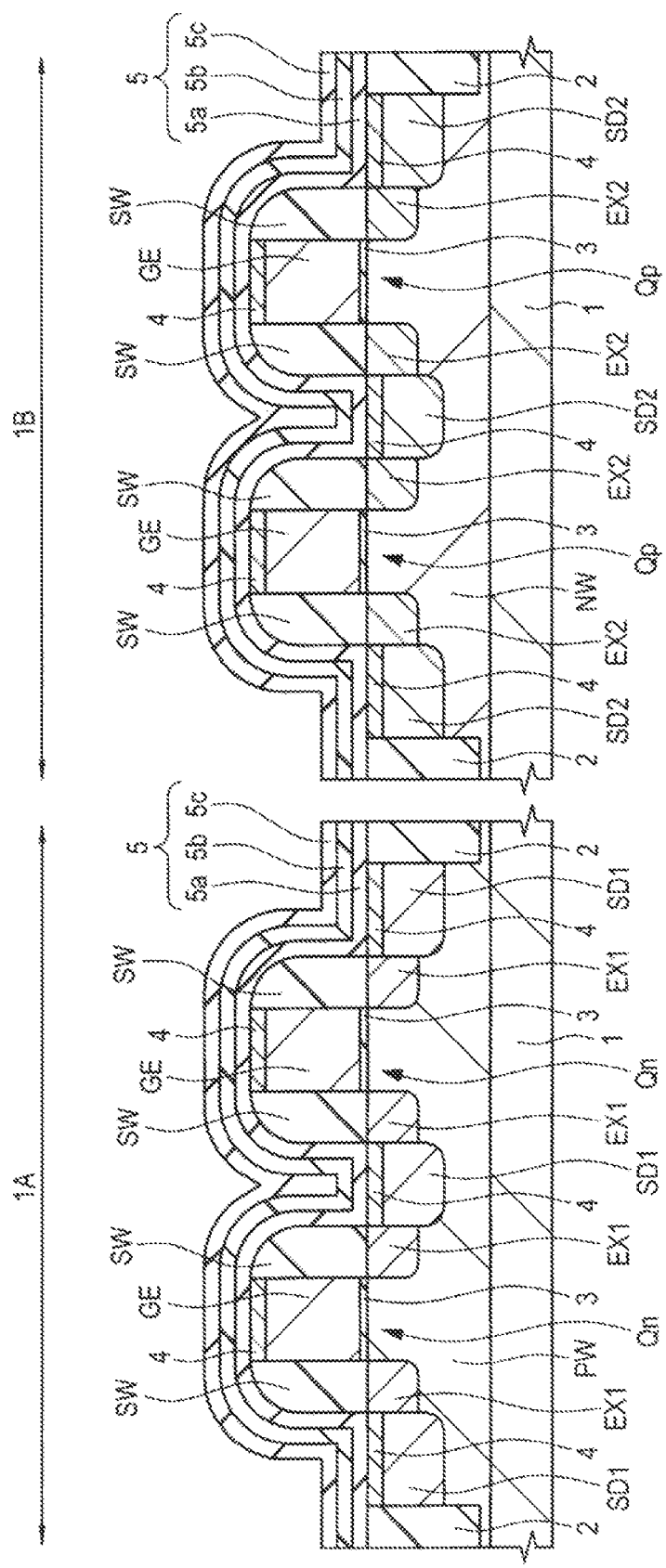
FIG. 33 is a main-portion cross-sectional view of the semiconductor device in a manufacturing step thereof, which is subsequent to FIG. 32.

Next, as shown in FIG. 33, Steps S1, S2, S3, S4, and S5 of the foregoing first embodiment are performed to form a silicon nitride film 5 formed of a laminate film of silicon nitride films 5a, 5b, and 5c. Since Steps S1, S2, S3, S4, and S5 have been described above, a description thereof is omitted here. In the present embodiment also, by forming the silicon nitride film 5 formed of the laminate film of the silicon nitride films 5a, 5b, and 5c by Steps S1, S2, S3, S4, and S5 of the foregoing first embodiment, an effect as described in the foregoing first embodiment can be obtained.

The silicon nitride film 5 is formed over the entire main surface of the semiconductor substrate 1. Therefore, in the present embodiment, the silicon nitride film 5 is formed in each of the nMIS formation region 1A and the pMIS formation region 1B so as to cover the gate electrodes GE and the sidewall spacers SW in the nMIS formation 1A and the gate electrodes GE and the sidewall spacers SW in the pMIS formation 1B. As described in the foregoing first embodiment, the silicon nitride film 5 is a tensile stress film.

Figure 34:
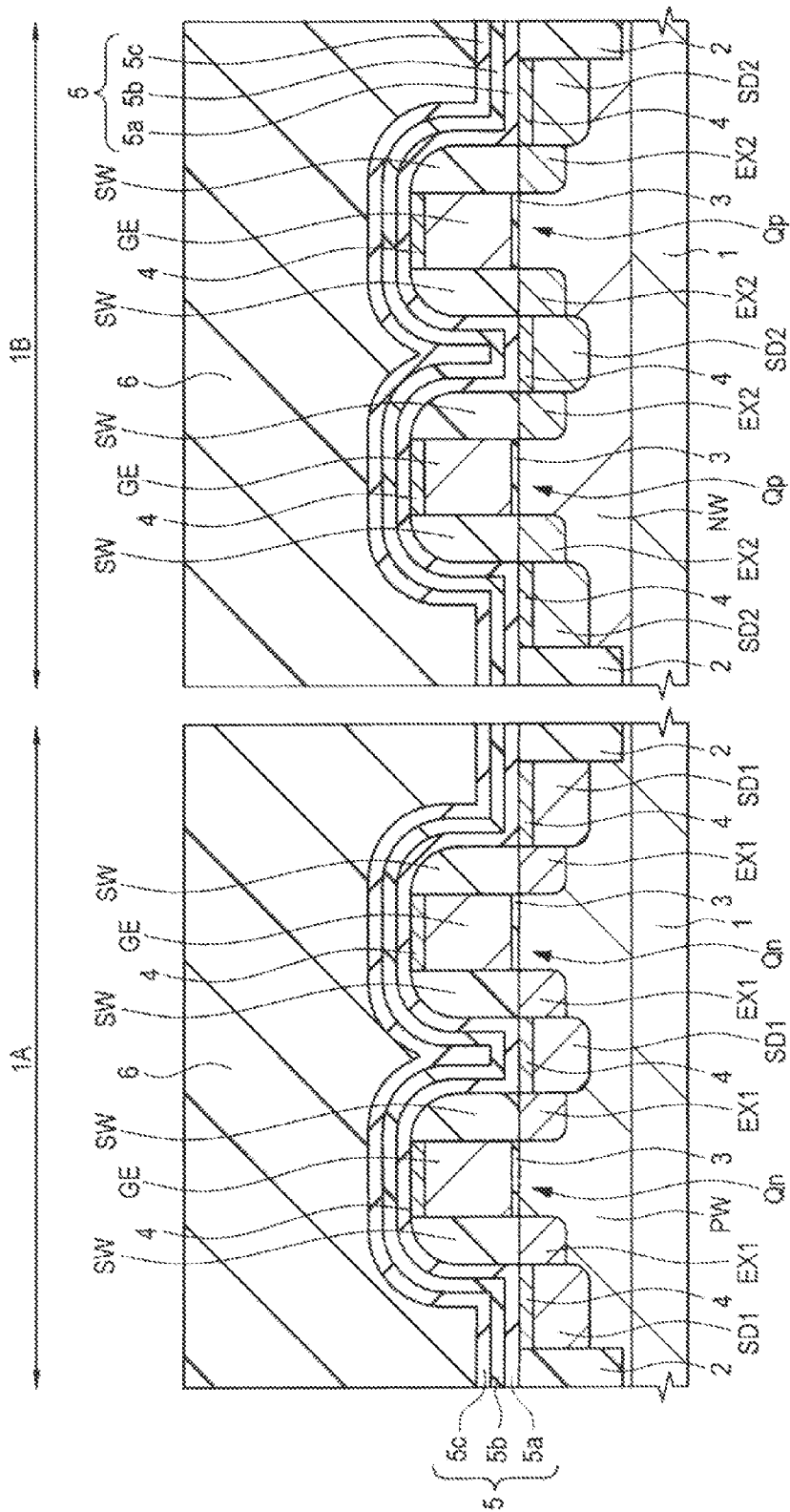
FIG. 34 is a main-portion cross-sectional view of the semiconductor device in a manufacturing step thereof, which is subsequent to FIG. 33.

Next, as shown in FIG. 34, Step S6 of the foregoing first embodiment is performed to form an interlayer insulating film 6. The interlayer insulating film 6, which is formed over the entire main surface of the semiconductor substrate 1, is formed in each of the nMIS formation region 1A and the pMIS formation region 1B. The interlayer insulating film 6 is formed over the silicon nitride film 5 in the nMIS formation region 1A and over the silicon nitride film 5 in the pMIS formation region 1B.

Figure 35:
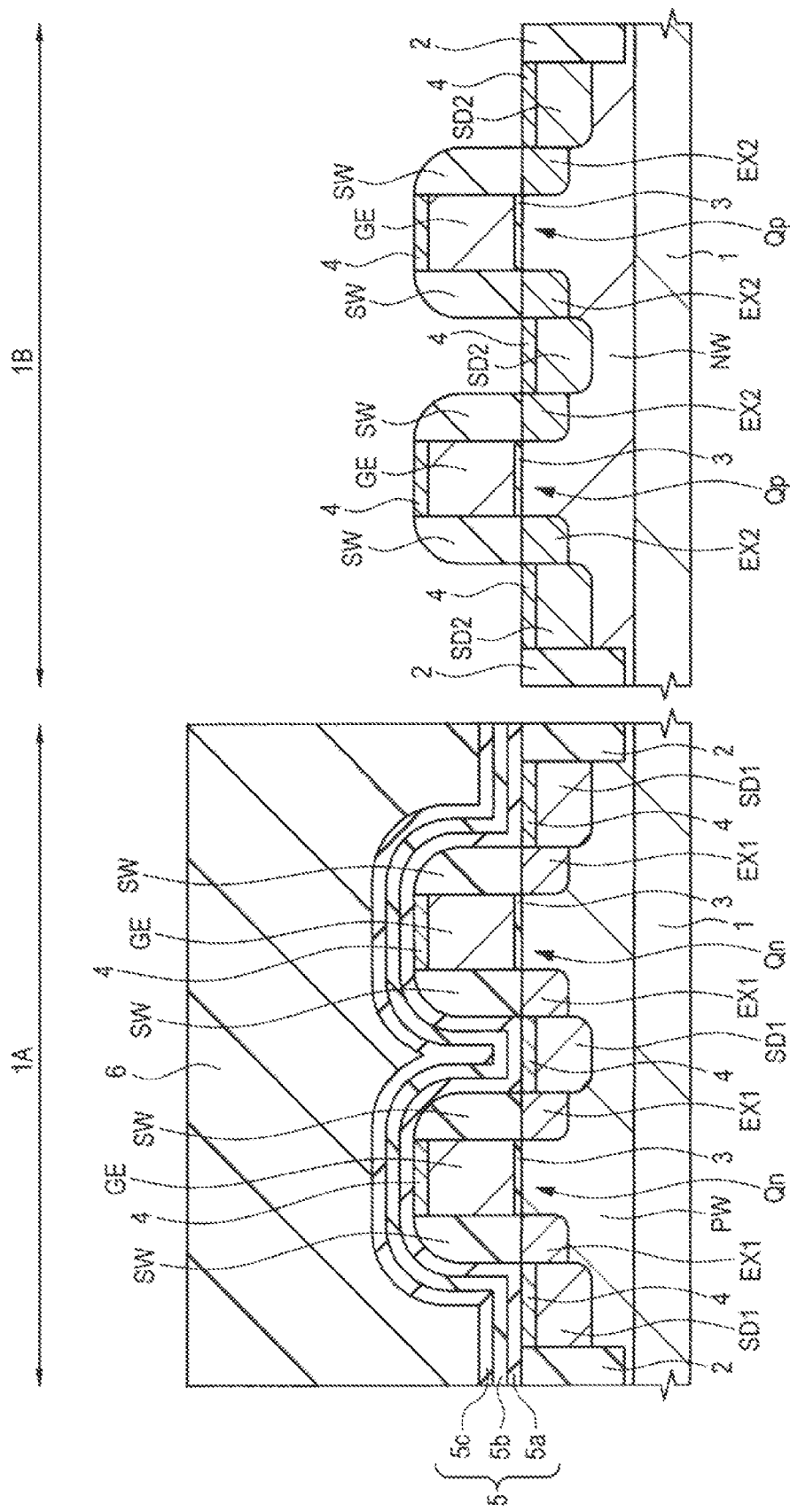
FIG. 35 is a main-portion cross-sectional view of the semiconductor device in a manufacturing step thereof, which is subsequent to FIG. 34.

Next, as shown in FIG. 35, the interlayer insulating film 6 and the silicon nitride film 5 in the pMIS formation region 1B is removed. At this time, the interlayer insulating film 6 and the silicon nitride film 5 in the nMIS formation region 1A are left without being removed. This can be achieved by, e.g., forming a photoresist pattern (not shown) over the interlayer insulating film 6 in the nMIS formation region 1A using a photolithographic method and dry-etching the interlayer insulating film 6 and the silicon nitride film 5 in the pMIS formation region 1B using the photoresist pattern as an etching mask.

Figure 36:
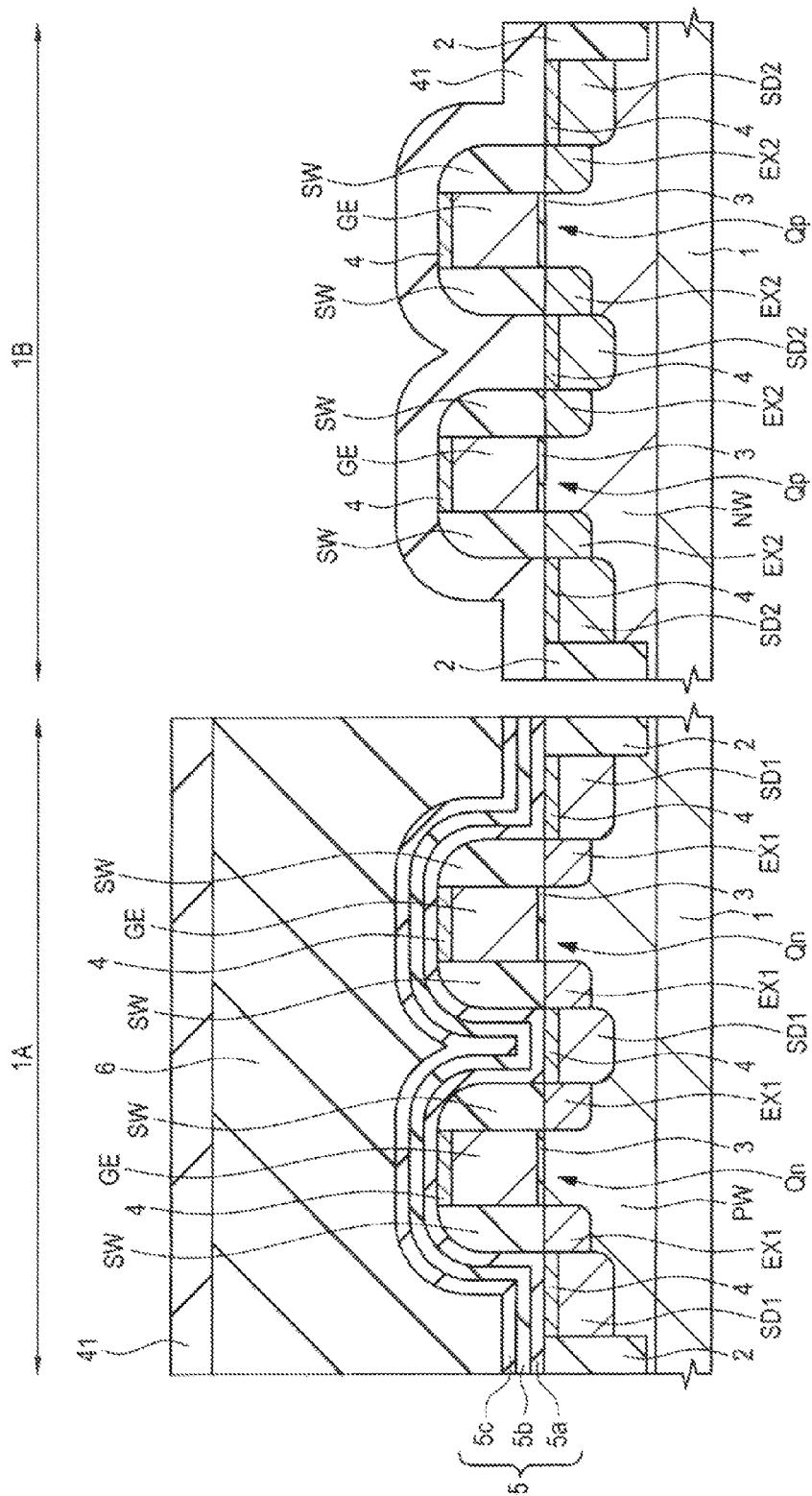
FIG. 36 is a main-portion cross-sectional view of the semiconductor device in a manufacturing step thereof, which is subsequent to FIG. 35.

Next, as shown in FIG. 36, over the entire main surface of the semiconductor substrate 1, an insulating film 41 (more specifically a silicon nitride film 41) is formed as an insulating film for compression stress. In the pMIS formation region 1B, the insulating film 41 is formed over the main surface of the semiconductor substrate 1 including the upper surfaces of the metal silicide layers 4 so as to cover the gate electrodes GE, the sidewall spacers SW, and the p$^+$-type semiconductor region SD2. On the other hand, in the nMIS formation region 1A, the insulating film 41 is formed over the interlayer insulating film 6. The insulating film 41 is the compression stress film and preferably formed of silicon nitride.

The insulating film 41 can be formed by a plasma CVD method to be allowed to serve as the compression stress film by controlling conditions for film deposition (such as film deposition temperature, the type of a film deposition gas, the pressure of the gas, and an RF power) during the formation thereof.

Figure 37:
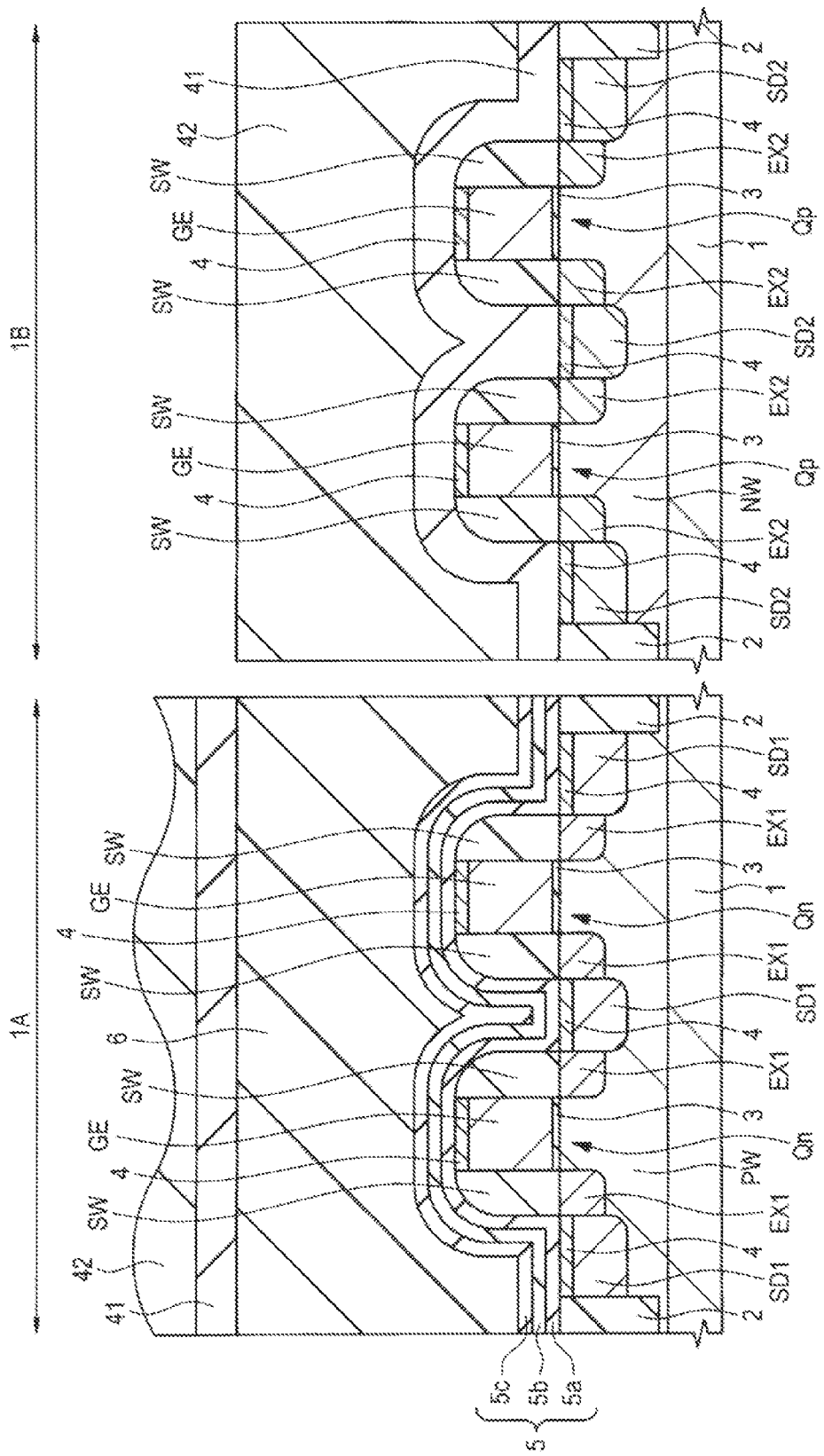
FIG. 37 is a main-portion cross-sectional view of the semiconductor device in a manufacturing step thereof, which is subsequent to FIG. 36.

Next, as shown in FIG. 37, over the entire main surface of the semiconductor substrate 1, i.e., over the insulating film 41, an interlayer insulating film 42 is formed. In each of the nMIS formation region 1A and the pMIS formation region 1B, the interlayer insulating film 42 is formed over the insulating film 41. For the interlayer insulating film 42, a silicon-oxide-type insulating film (i.e., oxide-type insulating film) is preferably used in the same manner as for the interlayer insulating film 6.

Figure 38:
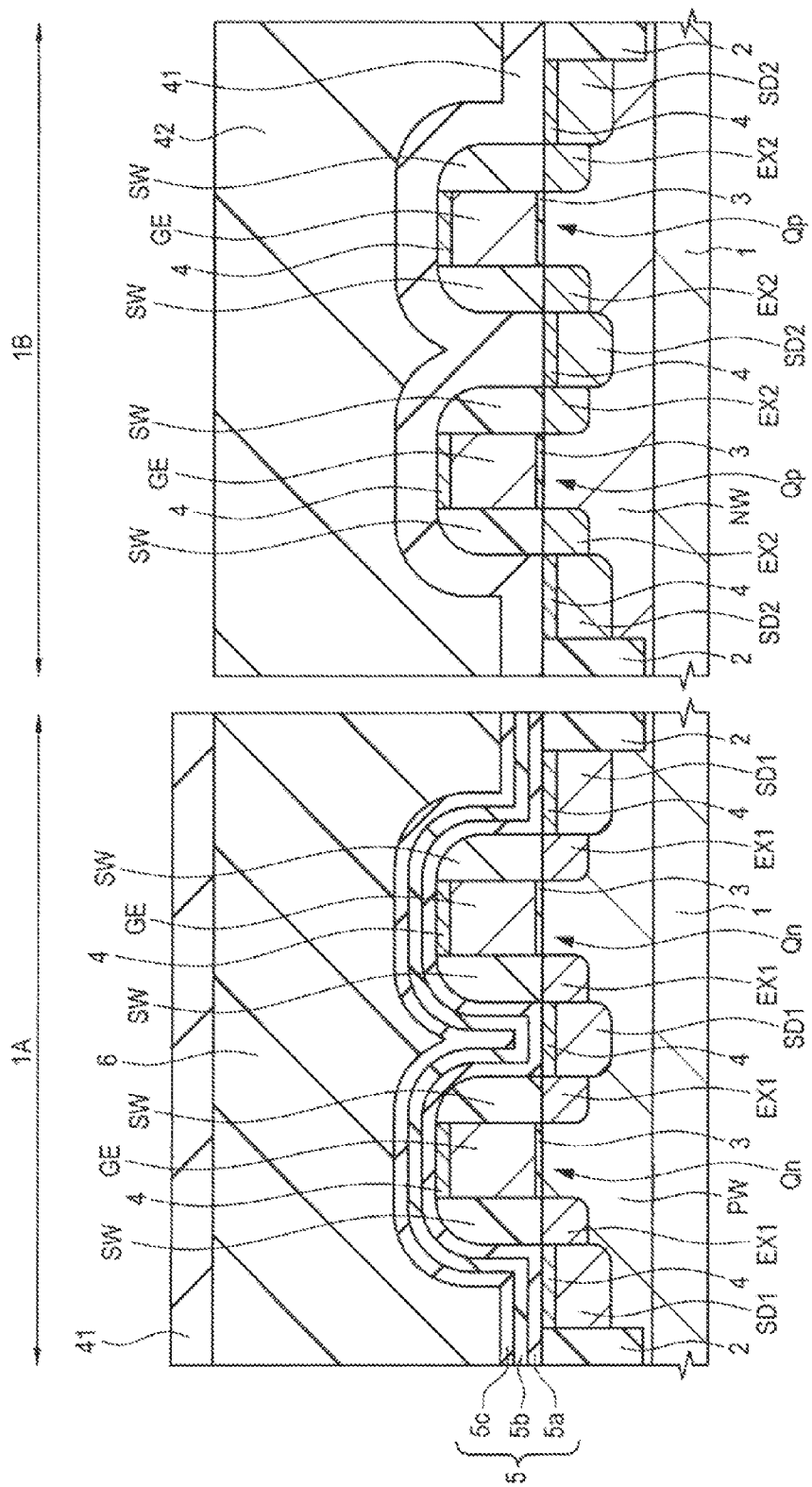
FIG. 38 is a main-portion cross-sectional view of the semiconductor device in a manufacturing step thereof, which is subsequent to FIG. 37.

Next, as shown in FIG. 38, the interlayer insulating film 42 in the nMIS formation region 1A is removed. At this time, the interlayer insulating film 42 and the insulating film 41 in the pMIS formation region 1B are left without being removed. This can be achieved by, e.g., forming a photoresist pattern (not shown) over the interlayer insulating film 42 in the pMIS formation region 1B using a photolithographic method and dry-etching the interlayer insulating film 42 in the nMIS formation region 1A using the photoresist pattern as an etching mask.

Figure 39:
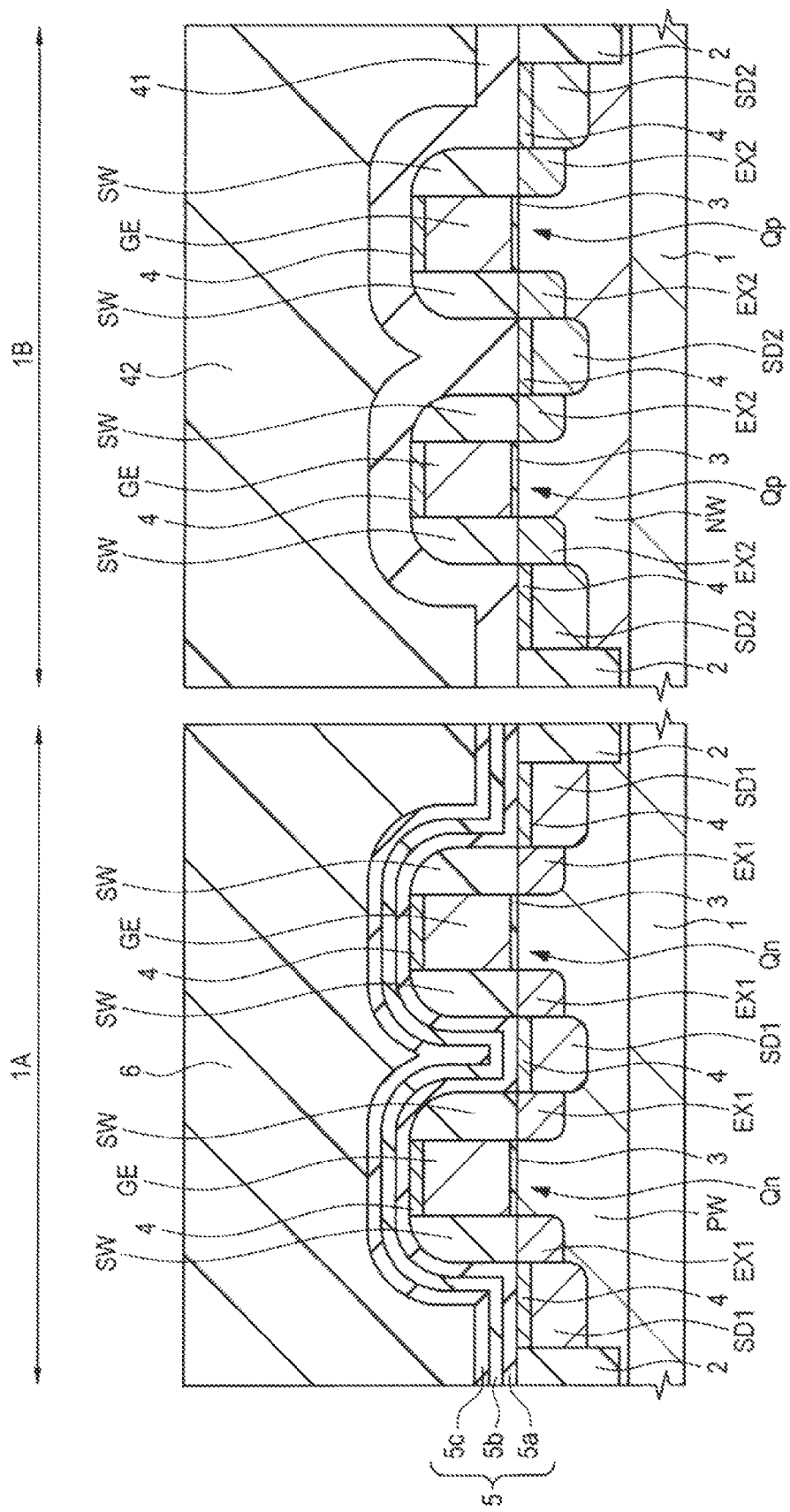
FIG. 39 is a main-portion cross-sectional view of the semiconductor device in a manufacturing step thereof, which is subsequent to FIG. 38.

Next, as shown in FIG. 39, the insulating film 41 in the nMIS formation region 1A is removed. At this time, the interlayer insulating film 42 and the insulating film 41 in the pMIS formation region 1B are left without being removed. This can be achieved by, e.g., dry-etching the insulating film 41 in the nMIS formation region 1A using the photoresist pattern (not shown) over the interlayer insulating film 42 in the pMIS formation region 1B as an etching mask.

As a result, as shown in FIG. 39, a structure is obtained in which, in the nMIS formation region 1A, a laminate film of the silicon nitride film 5 (which includes first insulating film comprising 5as and 5b, and second insulating film 5c) and the interlayer insulating film 6 third insulating film) thereover is formed over the semiconductor substrate 1 so as to cover the gate electrodes GE and the sidewall spacers SW while, in the pMIS formation region 1B, a laminate film of the insulating film 41 (fourth insulating film) and the interlayer insulating film 42 (fifth insulating film thereover is formed over the semiconductor substrate 1 so as to cover the gate electrodes GE and the sidewall spacers SW. Thereafter, a CMP treatment may also be performed for equalizing the height of the upper surface of the interlayer insulating film 6 in the nMIS formation region 1A and the height of the upper surface of the interlayer insulating film 42 in the pMIS formation region 1B.

Thereafter, as described above using FIGS. 9 and 10, the foregoing contact holes CNT are formed, the foregoing plugs PG are formed in the contact holes CNT, and the foregoing insulating film 7 and the wiring lines M1 are further formed, though the depiction thereof is omitted. Note that, in the nMIS formation region 1A, the foregoing contact holes CNT are formed so as to extend through the laminate film (laminate insulating film) including the interlayer insulating film 6 and the silicon nitride film 5 while, in the pMIS formation region 1B, the foregoing contact holes CNT are formed so as to extend through the laminate film (laminate insulating film) including the interlayer insulating film 42 and the insulating film 41.

In the present embodiment, in the nMIS formation region 1A, the silicon nitride film 5 as the tensile stress film is formed so as to cover the n-channel MISFETs Qn. As a result, there occurs an increase in the mobility of electrons in the channel region of each of the n-channel MISFETs Qn or the like to allow an increase in an ON current flowing in the channel of the re-channel MISFET Qn. On the other hand, in the pMIS formation region 1B, the insulating film 41 as the compression stress film is formed so as to cover the p-channel MISFETs Qp. As a result, there occurs an increase in the mobility of holes in the channel region of each of the p-channel MISFETs Qp or the like to allow an increase in an ON current flowing in the channel of the p-channel MISFET Qp. Therefore, it is possible to improve the performance of the semiconductor device including the CMISFET.

It is also possible to apply the foregoing first embodiment to a semiconductor device having a CMISFET without any modification. In this case, after the structure of FIG. 34 described above is obtained, the foregoing contact holes CNT and the foregoing plugs PG are formed without performing the steps of FIGS. 35 to 39 described above. Then, over the interlayer insulating film 6 having the plugs PG buried therein, the foregoing insulating film 7 and the wiring lines M1 are formed. Since the foregoing contact holes CNT and the plugs PG are formed in a state where the silicon nitride film 5 and the interlayer insulating film 6 are formed in each of the nMIS formation region 1A and the pMIS formation region 1B, in each of the nMIS formation region 1A and the pMIS formation region 1B of FIG. 34, the foregoing contact holes CNT are formed so as to extend through the multilayer film of the silicon nitride film 5 and the interlayer insulating film 6 and the plugs PG are buried therein, as shown in FIG. 9 described above. In this case, in the nMIS formation region 1A, the silicon nitride film 5 as the tensile stress film is formed so as to cover the n-channel MISFETs Qn. As a result, there occurs an increase in the mobility of electrons in the channel region of each of the n-channel MISFETs Qn or the like to allow an increase in an ON current flowing in the channel of the n-channel MISFET Qn. However, in the pMIS formation region 1B, the compression stress film is not formed so that it is impossible to increase the mobility of holes in the channel region of each of the p-channel MISFETs Qp in the pMIS formation region 1B. Therefore, it is preferable to apply the foregoing first embodiment to a semiconductor device having such a CMISFET in which the mobility of carriers (which are electrons herein) in the channel region of each of the re-channel MISFETs is desired to be preferentially improved. Moreover, in this case, the number of manufacturing steps can be suppressed (reduced), which is also advantageous in terms of reducing cost.

Also, in the foregoing second embodiment, the nMIS formation region 1A has the tensile stress film (which is the silicon nitride film 5 herein) and the pMIS formation region 1B has the compression stress film (which is the insulating film 41 herein). This allows an improvement in the mobility of carriers in the channel region of each of the n-channel MISFETs Qn of the nMIS formation region 1A and the p-channel MISFETs Qp of the pMIS formation region 1B. Therefore, a large effect is achieved by applying the foregoing first embodiment to a semiconductor device having such a CMISFET in which the mobility of carriers in the channel region of each of the n-channel MISFETs and the p-channel MISFETs is desired to be improved.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

The present invention is useful when applied to a semiconductor device and a manufacturing technique therefor.

What is claimed is:

1. A semiconductor device, comprising:
   a semiconductor substrate;
   a first gate electrode and a second gate electrode each formed over a main surface of the semiconductor substrate and adjacent to each other;
   a first sidewall spacer formed over a first side wall of the first gate electrode opposing the second gate electrode;
   a second sidewall spacer formed over a second side wall of the second gate electrode opposing the first gate electrode;
   a first insulating film comprising silicon and nitrogen formed over the main surface of the semiconductor substrate so as to cover the first and second gate electrodes and the first and second sidewall spacers;
   a second insulating film comprising silicon and nitrogen formed over the first insulating film so as to cover the first and second gate electrodes and the first and second sidewall spacers; and a silicon-oxide-based third insulating film formed over the second insulating film so as to cover the first and second gate electrodes and the first and second sidewall spacers, wherein, when a spacing between the first sidewall spacer and the second sidewall spacer is $L_0$, a film thickness of the first insulating film is $T_1$, a spacing between the first insulating film over a side surface of the first sidewall spacer and the first insulating film over a side surface of the second sidewall spacer is $L_1$, and a film thickness of the second insulating film is $T_2$, $L_0/2 > T_1$ and $L_1/2 \leq T_2$ are satisfied, and wherein a hydrogen content of the first insulating film is lower than a hydrogen content of the second insulating film.

2. A semiconductor device according to claim 1,
wherein the hydrogen content of the first insulating film is not more than ⅓ of the hydrogen content of the second insulating film.

3. A semiconductor device according to claim 2,
wherein a tensile stress of the first insulating film is larger than a tensile stress of the second insulating film.

4. A semiconductor device according to claim 3,
wherein the first insulating film is formed of a laminate film of a plurality of silicon nitride films, and
wherein a hydrogen content of each of the silicon nitride films forming the first insulating film is lower than the hydrogen content of the second insulating film.

5. A semiconductor device according to claim 4,
wherein each of the first gate electrode and the second gate electrode is a gate electrode of an n-channel MISFET.

6. A semiconductor device according to claim 5, further comprising:
a contact hole formed in the third, second, and first insulating films; and
a conductive plug formed in the contact hole.

7. A semiconductor device according to claim 3,
wherein the first insulating film comprises a one-layer silicon nitride film.

8. A semiconductor device according to claim 3, further comprising:
an additional insulating film between the second insulating film and the third insulating film, wherein:
a hydrogen content of the first insulating film is lower than a hydrogen content of the additional insulating film; and
a tensile stress of the first insulating film is greater than a tensile stress of the additional insulating film.

9. A method of manufacturing a semiconductor device, comprising the steps of:
(a) forming a first gate electrode and a second gate electrode adjacent to each other over a main surface of a semiconductor substrate;
(b) forming a first sidewall spacer over a first side wall of the first gate electrode opposing the second gate electrode and forming a second sidewall spacer over a second side wall of the second gate electrode opposing the first gate electrode;
(c) forming a first insulating film comprising silicon and nitrogen over the main surface of the semiconductor substrate so as to cover the first and second gate electrodes and the first and second sidewall spacers;
(d) forming a second insulating film comprising silicon and nitrogen over the first insulating film so as to cover the first and second gate electrodes and the first and second sidewall spacers; and (e) forming a silicon-oxide-based third insulating film over the second insulating film so as to cover the first and second gate electrodes and the first and second sidewall spacers, wherein, when a spacing between the first sidewall spacer and the second sidewall spacer each formed in the step (b) is $L_0$, a deposited film thickness of the first insulating film in the step (c) is $T_1$, a spacing between the first insulating film over a side surface of the first sidewall spacer and the first insulating film over a side surface of the second sidewall spacer at a stage prior to the formation of the second insulating film in the step (d) is $L_1$, and a deposited film thickness of the second insulating film in the step (d) is $T_2$, $L_0/2 > T_1$ and $L_1/2 \leq T_2$ are satisfied, wherein the first insulating film formed in the step (c) is subjected to a treatment for increasing a tensile stress of the first insulating film, prior to forming the second insulating film in step (d), and wherein the second insulating film formed in the step (d) is not subjected to a treatment for increasing a tensile stress of the second insulating film, prior to forming the third insulating film in step (e).

10. A method of manufacturing a semiconductor device according to claim 9,
wherein the treatment for increasing the tensile stress of the first insulating film is one from the group consisting of: an ultraviolet irradiation treatment, an electron beam irradiation treatment, a microwave irradiation treatment, and a heat treatment.

11. A method of manufacturing a semiconductor device according to claim 10,
wherein the treatment for increasing the tensile stress is the ultraviolet irradiation treatment, and
wherein, after formation of the first insulating film in step (c) and prior to formation of the second insulating film in step (d), the first insulating film is subjected to the ultraviolet irradiation treatment; and
wherein, after formation of the second insulating film in step (d) and prior to formation of the third insulating film in step (e), the second insulating film is not subjected to the ultraviolet irradiation treatment.

12. A method of manufacturing a semiconductor device according to claim 11,
wherein each of the first gate electrode and the second gate electrode is a gate electrode of an n-channel MISFET.

13. A method of manufacturing a semiconductor device according to claim 12,
wherein, after the ultraviolet irradiation treatment, the tensile stress of the first insulating film formed in the step (c) is larger than the tensile stress of the second insulating film formed in the step (d).

14. A method of manufacturing a semiconductor device according to claim 13,
wherein, in the step (c), after the first insulating film is deposited by a plasma CVD method, the first insulating film is subjected to the ultraviolet irradiation treatment without being exposed to atmospheric air, and
wherein, in the step (d), after the ultraviolet irradiation treatment of the first insulating film, the second insulating film is deposited by a plasma CVD method without being exposed to the atmospheric air.

15. A method of manufacturing a semiconductor device according to claim 9, comprising, in step (c), forming the first insulating film by:
(c1) forming a silicon nitride film;
(c2) subjecting the silicon nitride film to a treatment for increasing a tensile stress of the silicon nitride film; and (c3) repeating steps (c1) and (c2) a plurality of times to thereby form the first insulating film as a laminate film comprising a plurality of silicon nitride films, each of which has been subject to a treatment for increasing a tensile stress thereof.

16. A method of manufacturing a semiconductor device according to claim 9,
wherein, in the step (c), the first insulating film is formed by a plasma CVD method, and
wherein, in the step (d), the second insulating film is formed by a plasma CVD method.

17. A method of manufacturing a semiconductor device according to claim 16,
wherein, in the step (c), a temperature at which the first insulating film is deposited by the plasma CVD method is not less than 400° C., and
wherein, in the step (d), a temperature at which the second insulating film is deposited by the plasma CVD method is not less than 400° C.

18. A method of manufacturing a semiconductor device according to claim 9, further comprising the steps of:
(f) after the step (e), forming a contact hole in the third, second, and first insulating films; and
(g) forming a conductive plug in the contact hole.

19. A method of manufacturing a semiconductor device according to claim 9, wherein:
the first insulating film is formed as a one-layer silicon nitride film,
a hydrogen content of the first insulating film is lower than a hydrogen content of the second insulating film, and
a tensile stress of the first insulating film is greater than a tensile stress of the second insulating film.

20. A method of manufacturing a semiconductor device according to claim 9, further comprising the steps of:
prior to forming the third insulation film, forming an additional insulating film over the second insulating film, such that:
a hydrogen content of the first insulating film is lower than a hydrogen content of the additional insulating film; and
a tensile stress of the first insulating film is greater than a tensile stress of the additional insulating film.

21. A method of manufacturing a semiconductor device, comprising the steps of:
(a) forming a first gate electrode and a second gate electrode adjacent to each other over a main surface of a semiconductor substrate;
(b) forming a first sidewall spacer over a first side wall of the first gate electrode opposing the second gate electrode and forming a second sidewall spacer over a second side wall of the second gate electrode opposing the first gate electrode;
(c) forming a first insulating film comprising silicon and nitrogen over the main surface of the semiconductor substrate so as to cover the first and second gate electrodes and the first and second sidewall spacers;
(d) forming a second insulating film comprising silicon and nitrogen over the first insulating film so as to cover the first and second gate electrodes and the first and second sidewall spacers; and
(e) forming a silicon-oxide-based third insulating film over the second insulating film so as to cover the first and second gate electrodes and the first and second sidewall spacers,
wherein, when a spacing between the first sidewall spacer and the second sidewall spacer each formed in the step (b) is $L_0$, a deposited film thickness of the first insulating film in the step (c) is $T_1$, a spacing between the first insulating film over a side surface of the first sidewall spacer and the first insulating film over a side surface of the second sidewall spacer at a stage previous to the formation of the second insulating film in the step (d) is $L_1$, and a deposited film thickness of the second insulating film in the step (d) is $T_2$, $L_0/2 > T_1$ and $L_1/2 \leq T_2$ are satisfied,
wherein the first insulating film formed in the step (c) is subjected to a first treatment for increasing a tensile stress of the first insulating film after deposition of the first insulating film,
wherein the second insulating film formed in the step (d) is subjected to a second treatment for increasing a tensile stress of the second insulating film after deposition of the second insulating film, and
wherein conditions for the first treatment and conditions for the second treatment are different from each other.

22. A method of manufacturing a semiconductor device according to claim 21,
wherein the first treatment increases the tensile stress of the first insulating film more than the second treatment increases the tensile stress of the second insulating film.

23. A method of manufacturing a semiconductor device according to claim 22,
wherein each of the first treatment and the second treatment is an ultraviolet irradiation treatment, and
wherein an illuminance of ultraviolet light in the second treatment is lower than an illuminance of ultraviolet light in the first treatment.

24. A method of manufacturing a semiconductor device according to claim 21, comprising, in step (c), forming the first insulating film by:
(c1) forming a silicon nitride film;
(c2) subjecting the silicon nitride film to a treatment for increasing a tensile stress of the silicon nitride film; and
(c3) repeating steps (c1) and (c2) a plurality of times to thereby form the first insulating film as a laminate film comprising a plurality of silicon nitride films, each of which has been subject to a treatment for increasing a tensile stress thereof, and each of which has a tensile stress greater than the tensile stress of the second insulating film.

25. A method of manufacturing a semiconductor device, comprising the steps of:
(a) forming a first gate electrode and a second gate electrode adjacent to each other over a main surface of a semiconductor substrate;
(b) forming a first sidewall spacer over a first side wall of the first gate electrode opposing the second gate electrode and forming a second sidewall spacer over a second side wall of the second gate electrode opposing the first gate electrode;
(c) forming a first insulating film comprising silicon and nitrogen over the main surface of the semiconductor substrate so as to cover the first and second gate electrodes and the first and second sidewall spacers, and then subjecting the first insulating film to a treatment for increasing a tensile stress thereof,
(d) forming a second insulating film comprising silicon and nitrogen over the first insulating film so as to cover the first and second gate electrodes and the first and second sidewall spacers; and
(e) forming a silicon-oxide-based third insulating film over the second insulating film so as to cover the first and second gate electrodes and the first and second sidewall spacers, without first subjecting the second insulating film to a treatment for increasing a tensile stress of the second insulating film, whereby:

a hydrogen content of the first insulating film is lower than a hydrogen content of the second insulating film; and a tensile stress of the first insulating film is greater than a tensile stress of the second insulating film.

26. A complementary metal insulator semiconductor field effect transistor (CMISFET) comprising:

an n-channel MISFET comprising:

a first gate electrode and a second gate electrode formed adjacent to each other;

a first sidewall spacer formed over a first side wall of the first gate electrode opposing the second gate electrode;

a second sidewall spacer formed over a second side wall of the second gate electrode opposing the first gate electrode;

a first insulating film comprising silicon and nitrogen formed over the main surface of the semiconductor substrate so as to cover the first and second gate electrodes and the first and second sidewall spacers;

a second insulating film comprising silicon and nitrogen formed over the first insulating film so as to cover the first and second gate electrodes and the first and second sidewall spacers; and a silicon-oxide-based third insulating film formed over the second insulating film so as to cover the first and second gate electrodes and the first and second sidewall spacers, wherein a hydrogen content of the first insulating film is lower than a hydrogen content of the second insulating film; and a tensile stress of the first insulating film is greater than a tensile stress of the second insulating film; and a p-channel MISFET comprising:

a third gate electrode and a fourth gate electrode formed adjacent to each other;

a third sidewall spacer formed over a first side wall of the third gate electrode opposing the fourth gate electrode;

a fourth sidewall spacer formed over a second side wall of the fourth gate electrode opposing the third gate electrode;

a fourth insulating film comprising silicon and nitrogen formed over the main surface of the semiconductor substrate so as to cover the third and fourth gate electrodes and the third and fourth sidewall spacers; and a silicon-oxide-based fifth insulating film formed over the fourth insulating film so as to cover the third and fourth gate electrodes and the third and fourth sidewall spacers;

wherein:

the fourth insulating film is formed so as to provide compression stress.

* * * * *